(12) United States Patent
Inaba

(10) Patent No.: US 7,359,234 B2
(45) Date of Patent: Apr. 15, 2008

(54) SEMICONDUCTOR MEMORY DEVICE

(75) Inventor: Tsuneo Inaba, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 196 days.

(21) Appl. No.: 11/384,501

(22) Filed: Mar. 21, 2006

(65) Prior Publication Data

US 2006/0158919 A1    Jul. 20, 2006

Related U.S. Application Data

(63) Continuation-in-part of application No. 11/065,143, filed on Feb. 24, 2005, now abandoned.

(30) Foreign Application Priority Data

Nov. 30, 2004  (JP)  .................... 2004-346464
Nov. 30, 2005  (JP)  .................... 2005-346720

(51) Int. Cl.
    *G11C 7/00*  (2006.01)
(52) U.S. Cl. ................. 365/158; 365/173
(58) Field of Classification Search ......... 365/158, 365/173, 171, 51, 63
    See application file for complete search history.

(56) References Cited

U.S. PATENT DOCUMENTS

| | | | | |
|---|---|---|---|---|
| 5,953,248 | A | * | 9/1999 | Chen et al. ............. 365/158 |
| 6,363,007 | B1 | * | 3/2002 | Lu et al. ................. 365/158 |
| 6,545,906 | B1 | | 4/2003 | Savtchenko, et al. |
| 6,914,808 | B2 | | 7/2005 | Inaba |

| | | | |
|---|---|---|---|
| 2002/0097597 | A1 | 7/2002 | Viehmann |
| 2003/0117869 | A1 | 6/2003 | Hidaka |
| 2003/0174536 | A1 | 9/2003 | Hidaka |
| 2004/0090856 | A1 | 5/2004 | Hidaka |

FOREIGN PATENT DOCUMENTS

| | | |
|---|---|---|
| JP | 2001-236781 | 8/2001 |
| JP | 2002-170376 | 6/2002 |
| JP | 2002-260377 | 9/2002 |
| JP | 2002-535798 | 10/2002 |
| JP | 2004-220759 | 8/2004 |
| WO | 00/42614 | 7/2000 |

OTHER PUBLICATIONS

A. Bette, et al., "A High-Speed 128Kbit MRAM Core for Future Universal Memory Applications", 2003 Symposium on VLSI Circuits Digest of Technical Papers, Jun. 2003, pp. 217-220.

Mark Durlam, et al., "A 1-Mbit MRAM Based on 1T1MTJ Bit Cell Integrated With Copper Interconnects", IEEE Journal of Solid-State Circuits, vol. 38, No. 5, May 2003, 769-773.

T. Inaba, et al., "Resistance Ratio Read ($R^3$) Architechture for a Burst Operated 1.5V MRAM Macro", IEEE 2003 Custom Integrated Circuits Conference Digest of Technical Papers, pp. 399-402, Sep. 2003.

* cited by examiner

*Primary Examiner*—Vu A. Le
(74) *Attorney, Agent, or Firm*—Oblon, Spivak, McClelland, Maier & Neustadt, P.C.

(57) ABSTRACT

A semiconductor memory device includes a plurality of memory cells using a current flowing through a wiring. A plurality of first write lines are electrically or magnetically or electrically and magnetically connected to the memory cells and provided along a first direction. A first connection line electrically connects at least two of the first write lines each other.

40 Claims, 69 Drawing Sheets

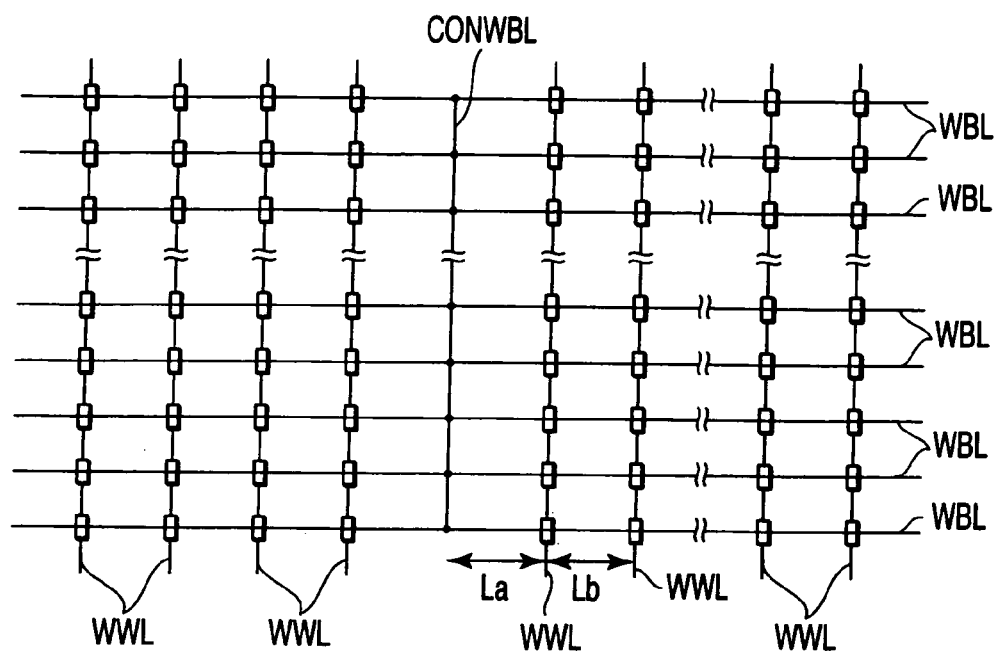
F I G. 3
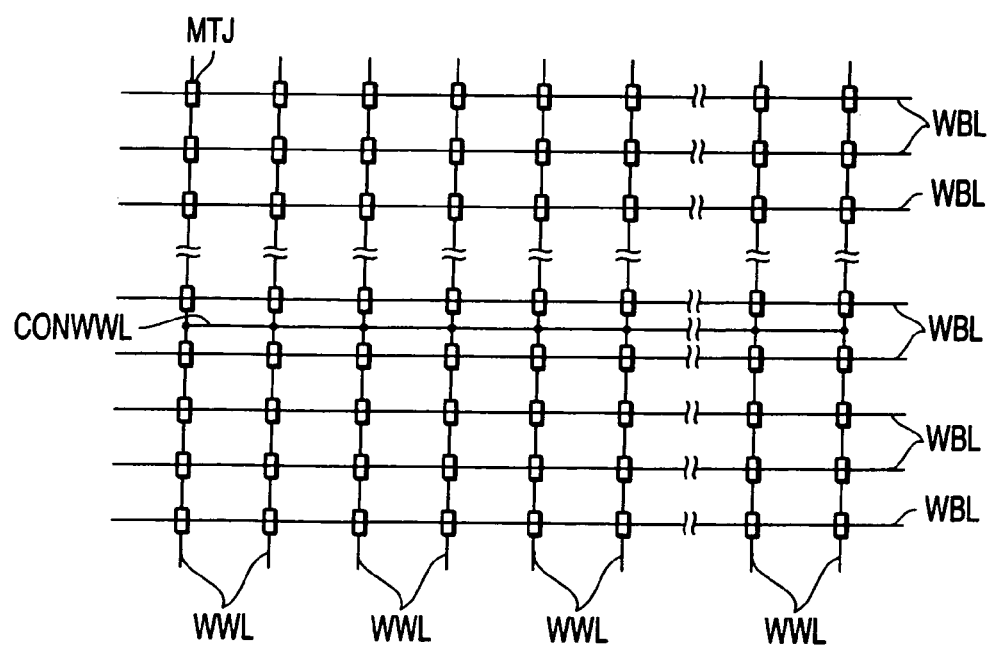
F I G. 4

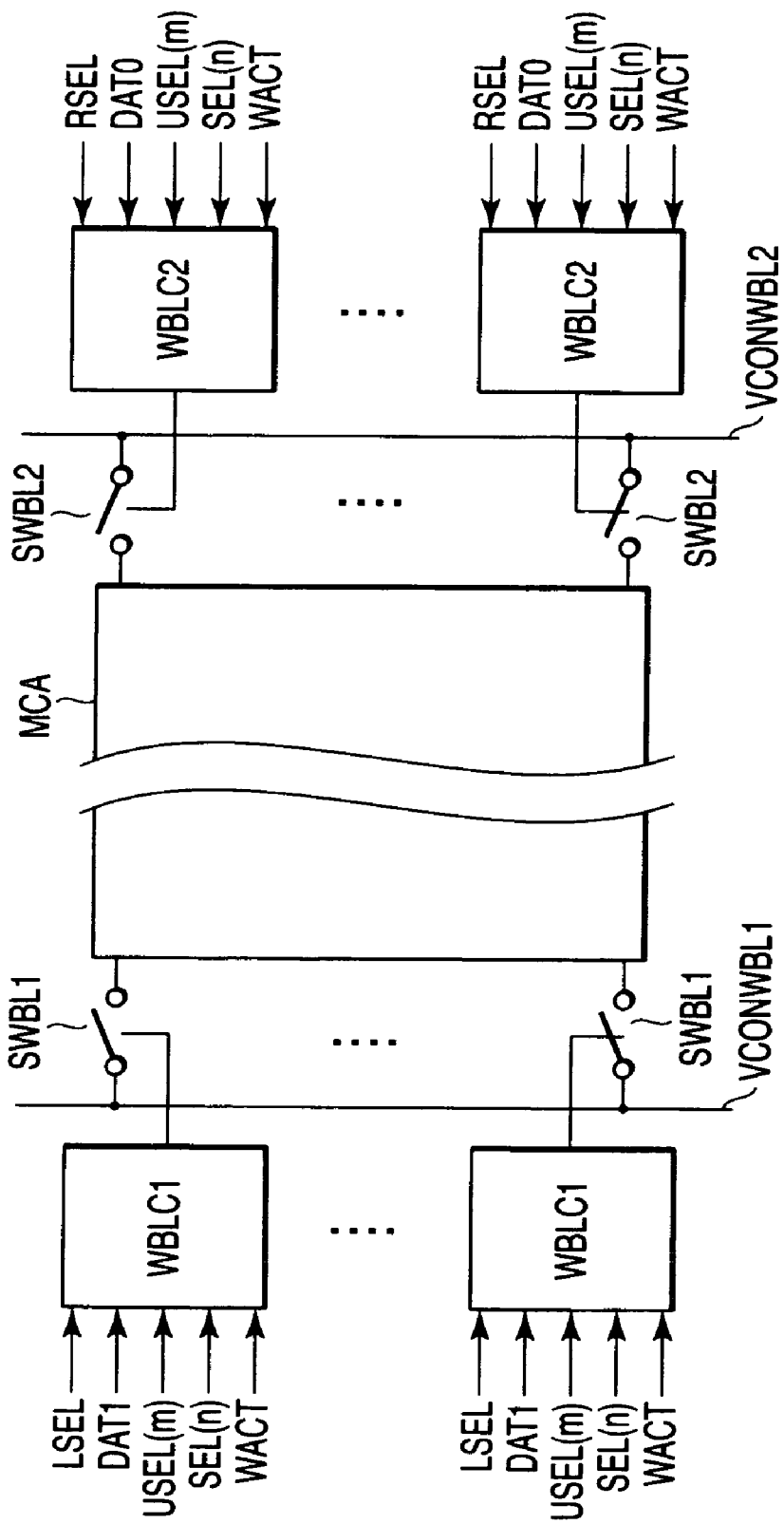
F I G. 46

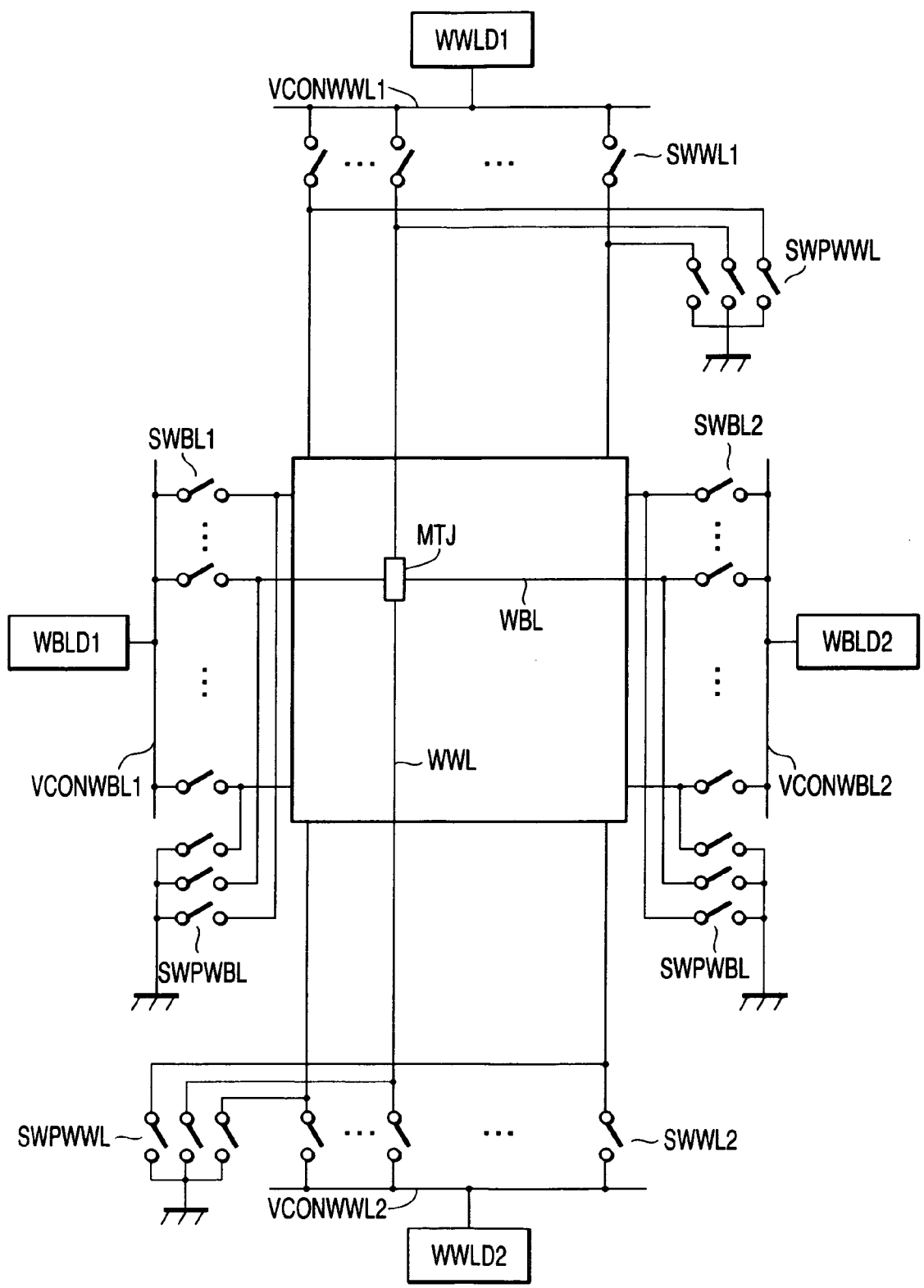
F I G. 5 7

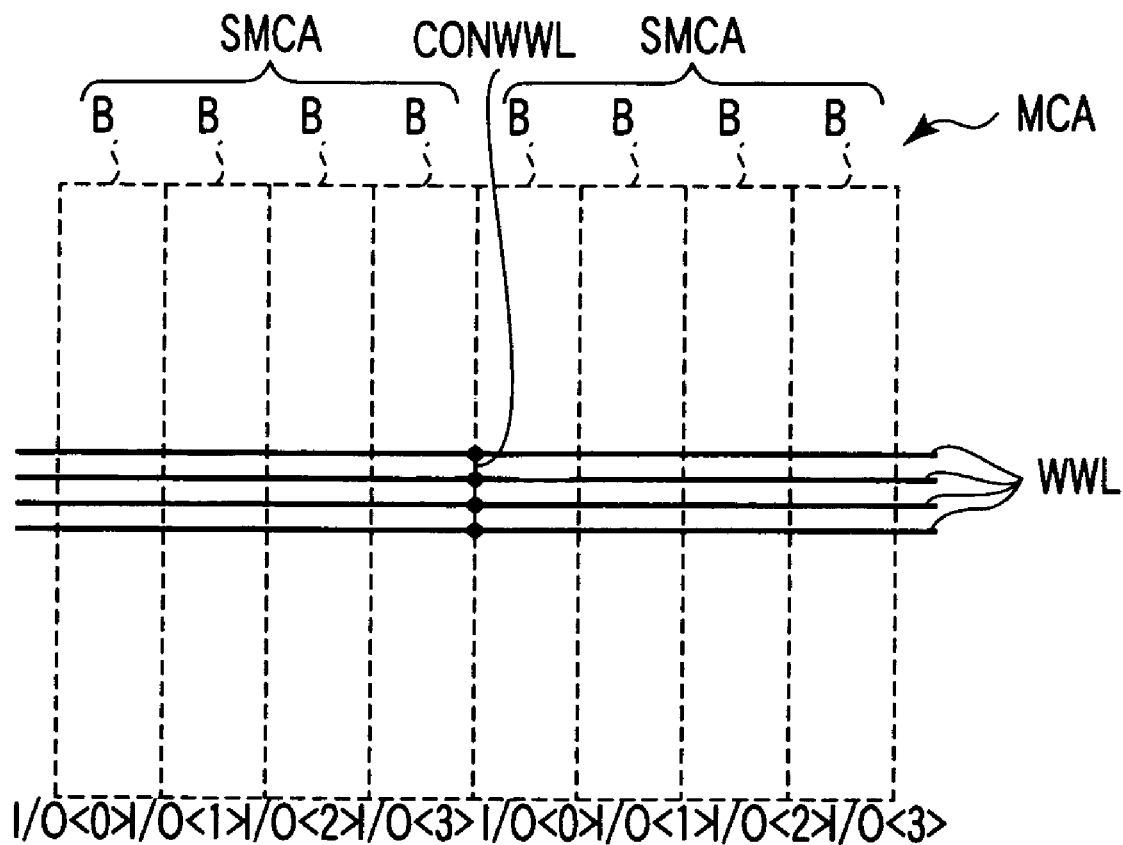
F I G. 64

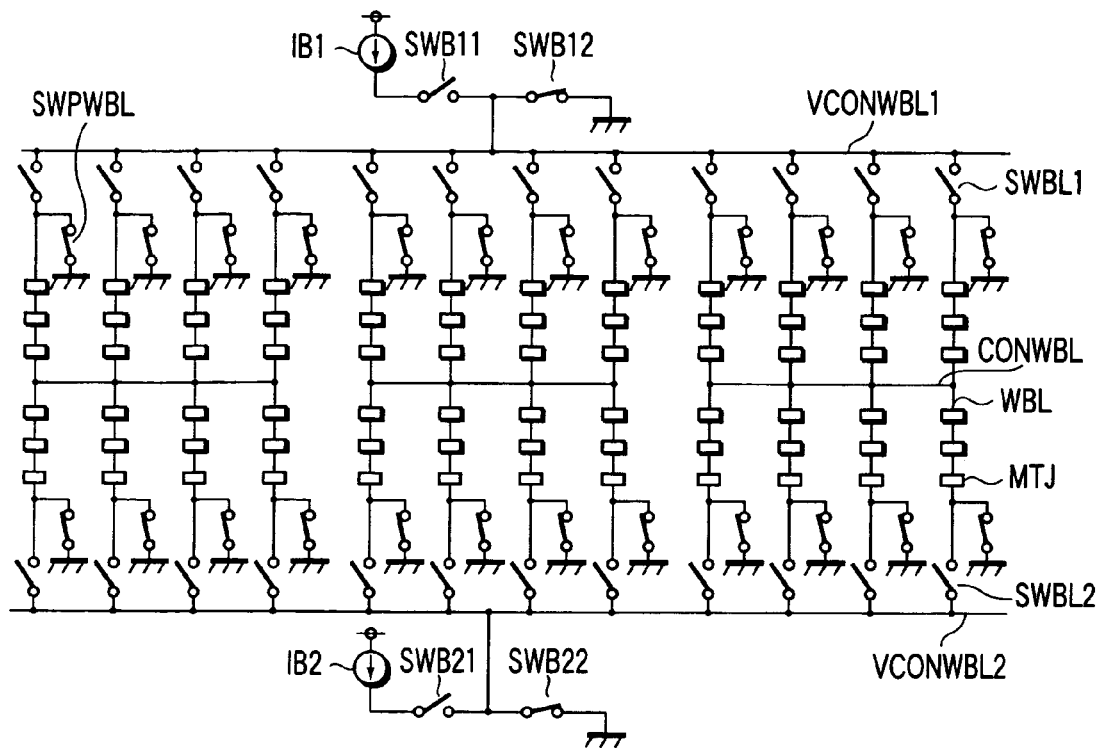
F I G. 80
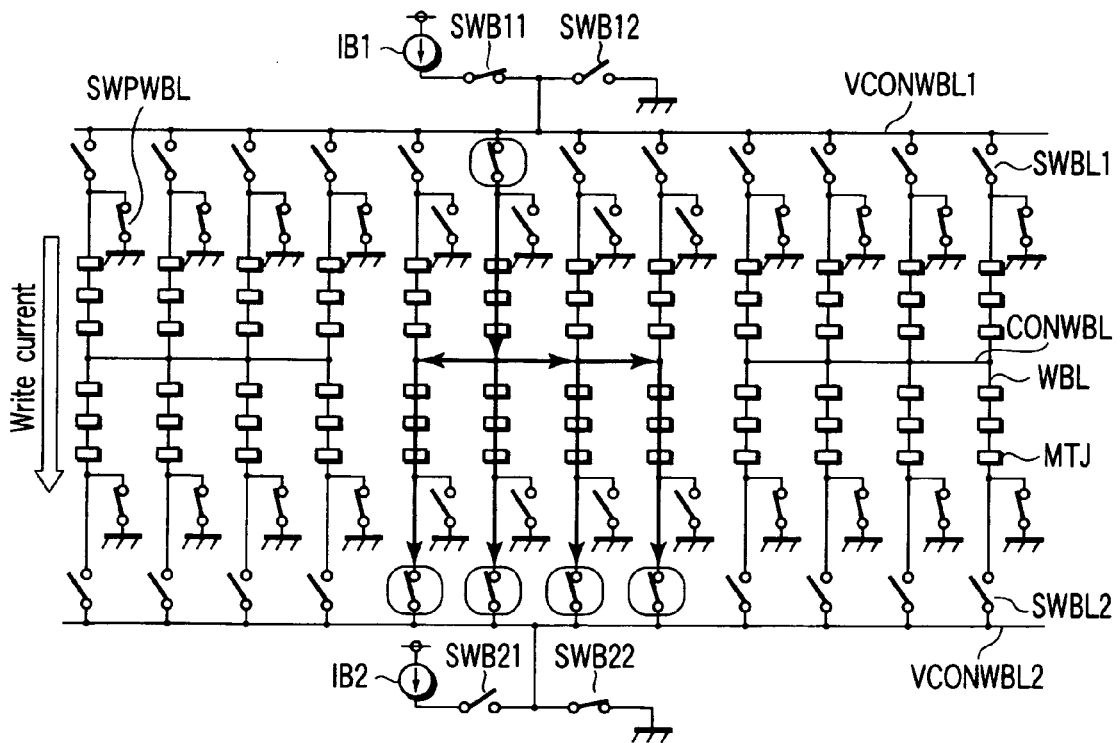
F I G. 81

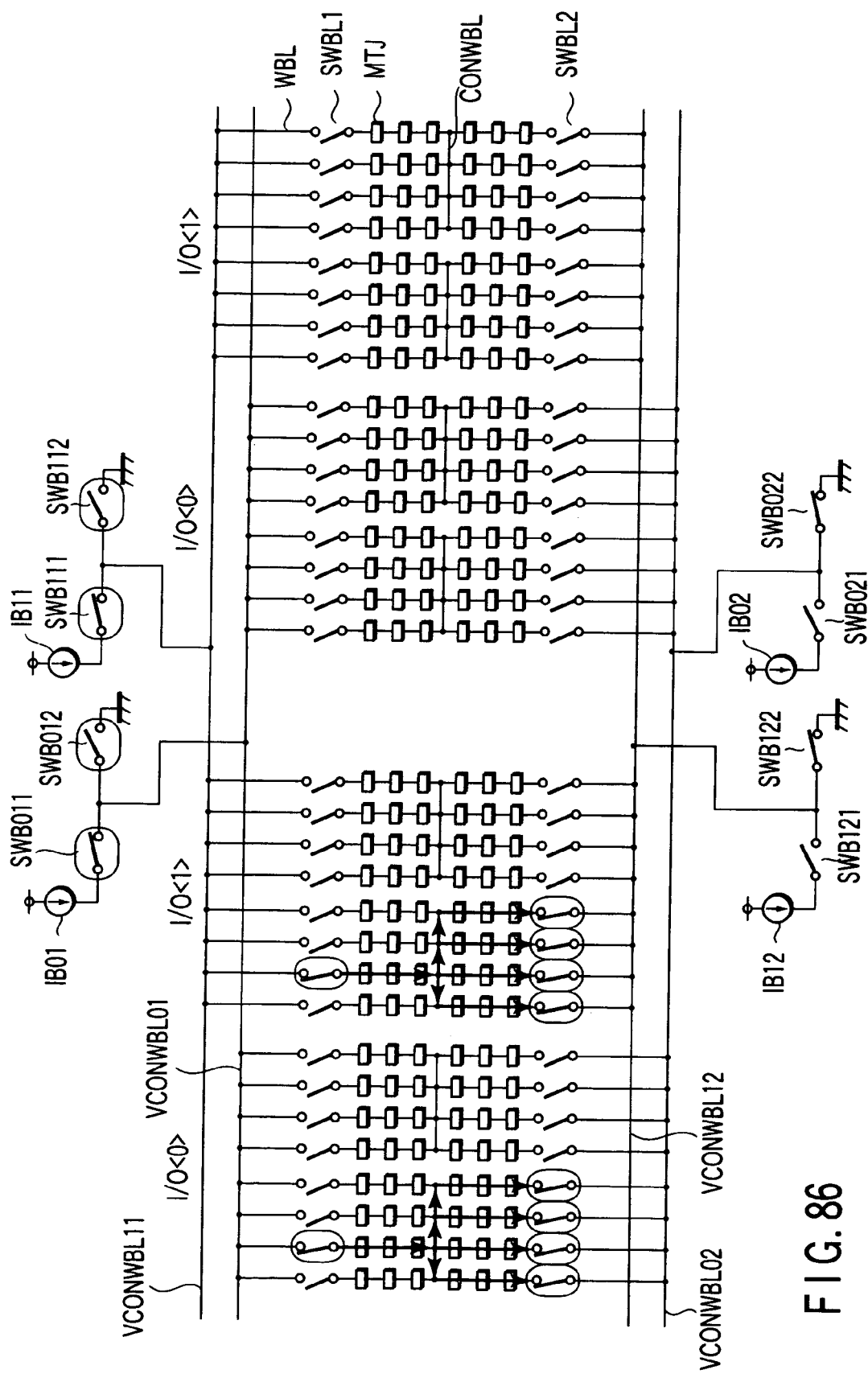
F I G. 86

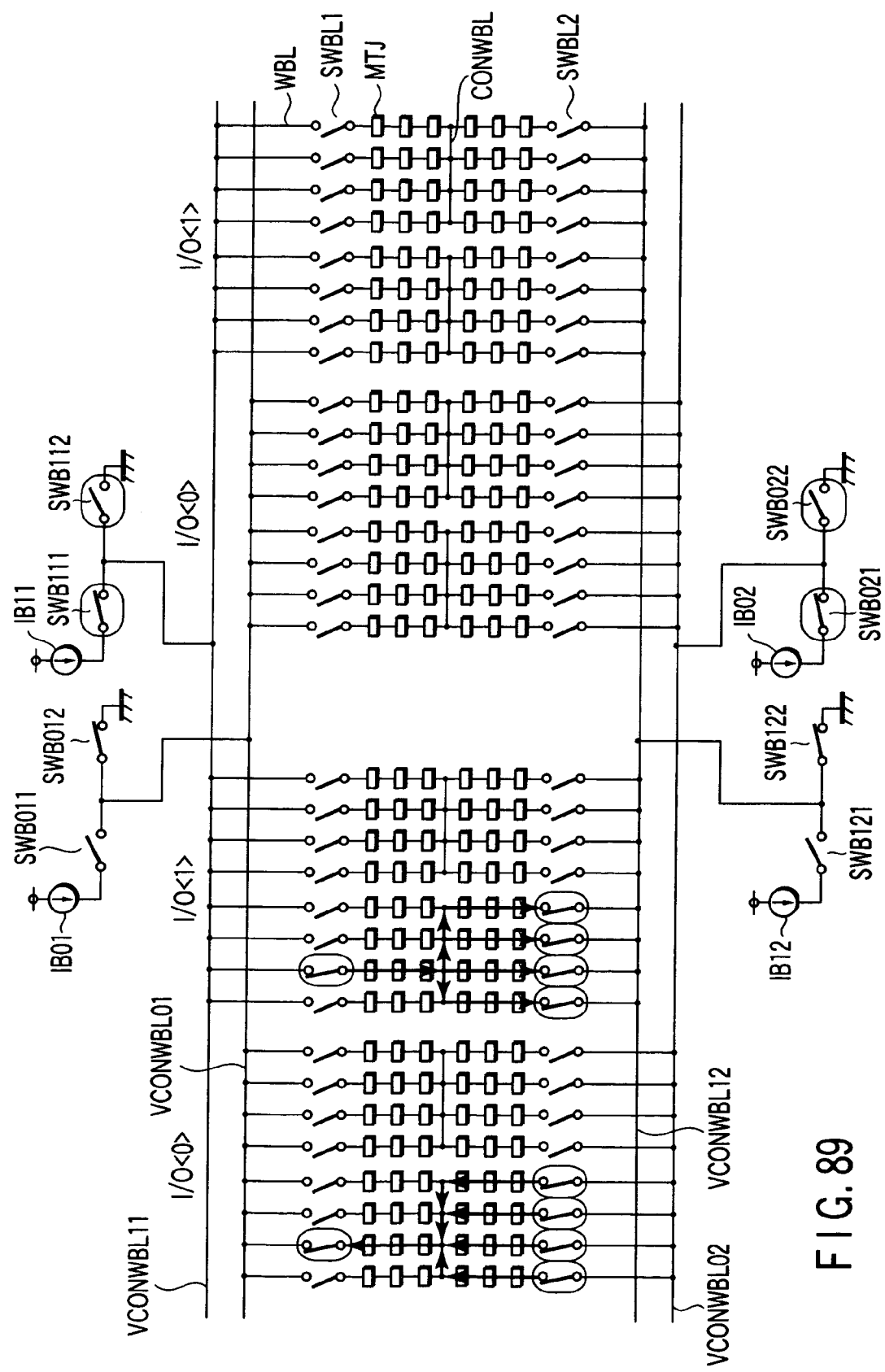
F I G. 89

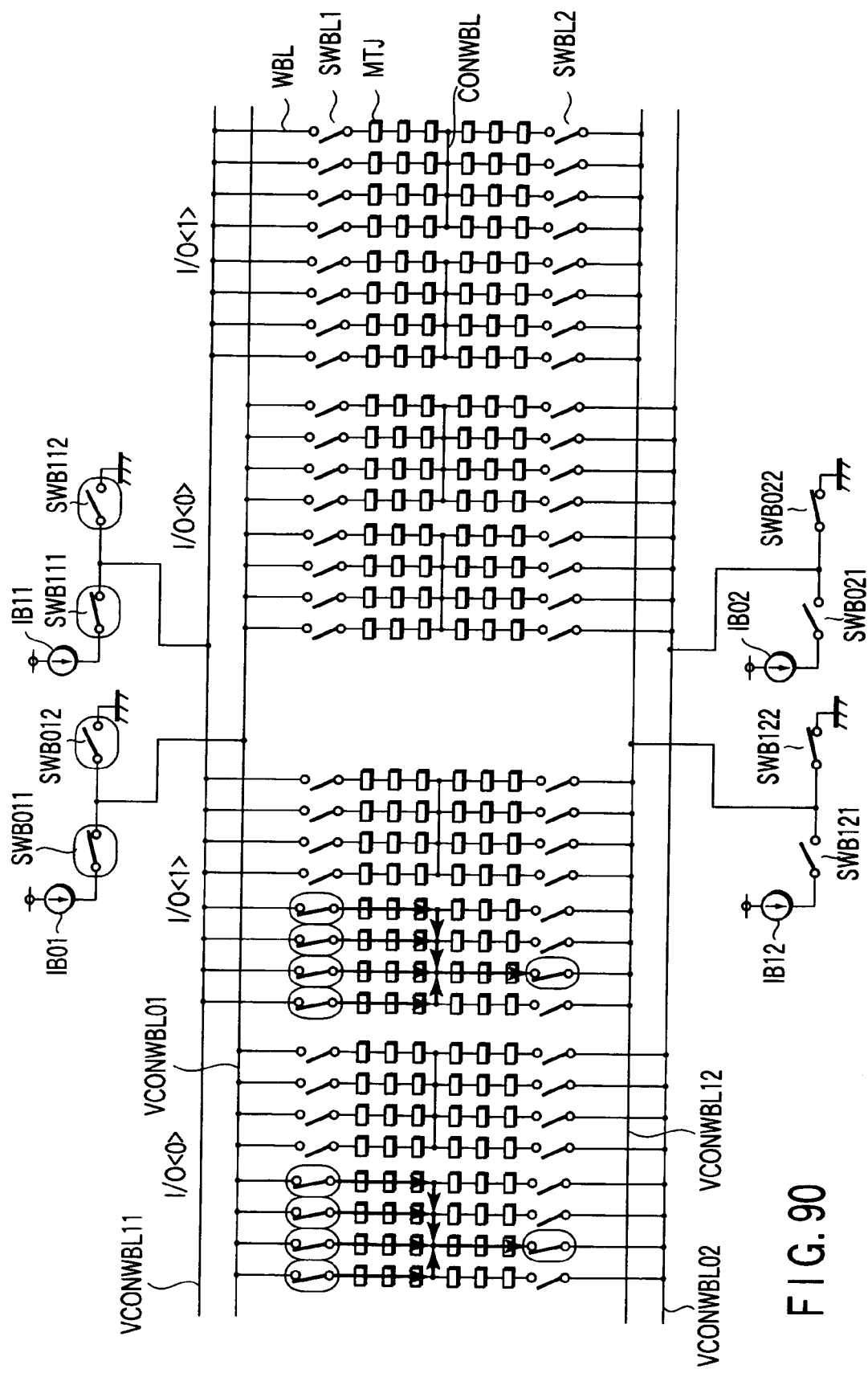
F I G. 90

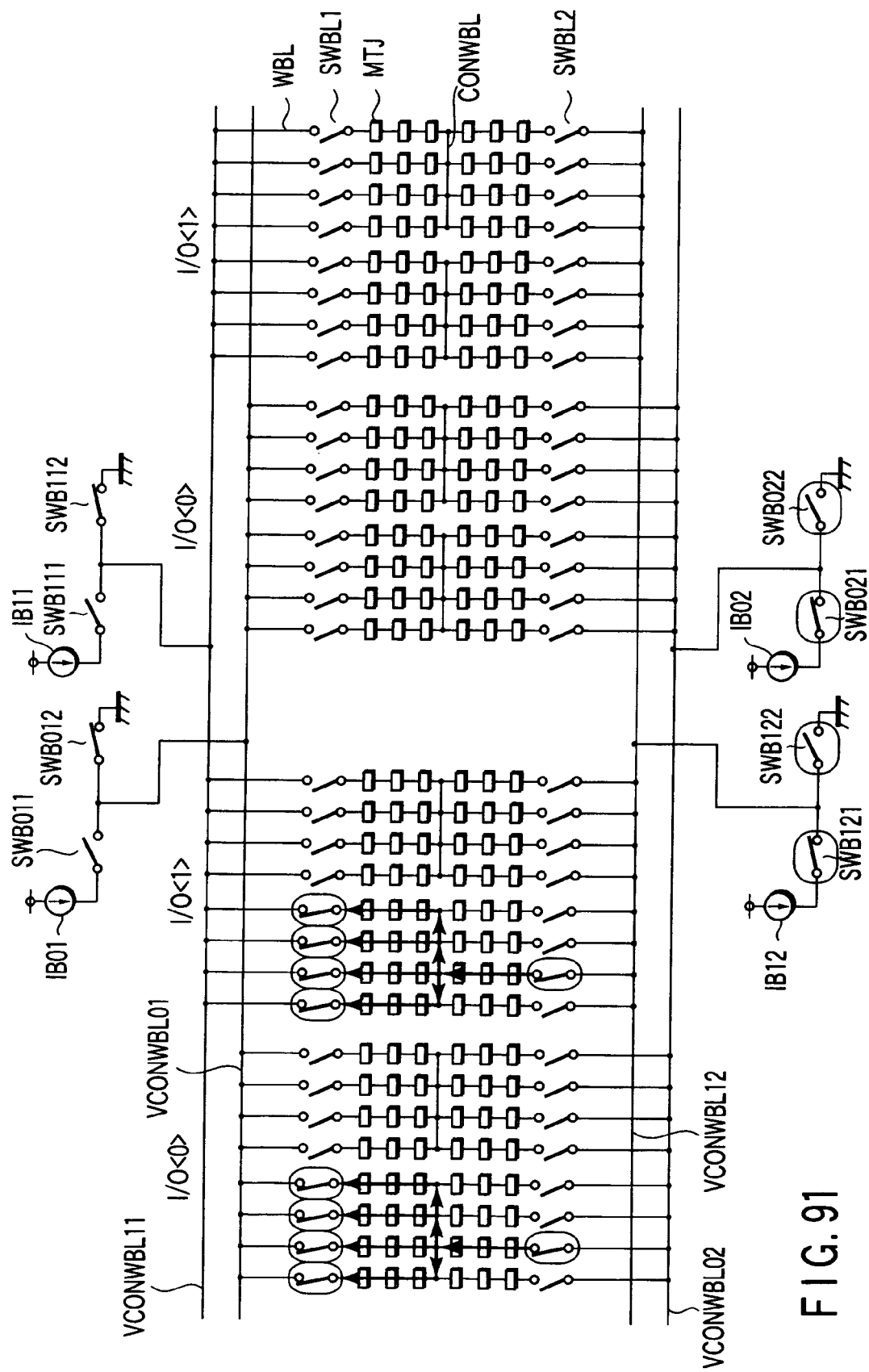
F I G. 91

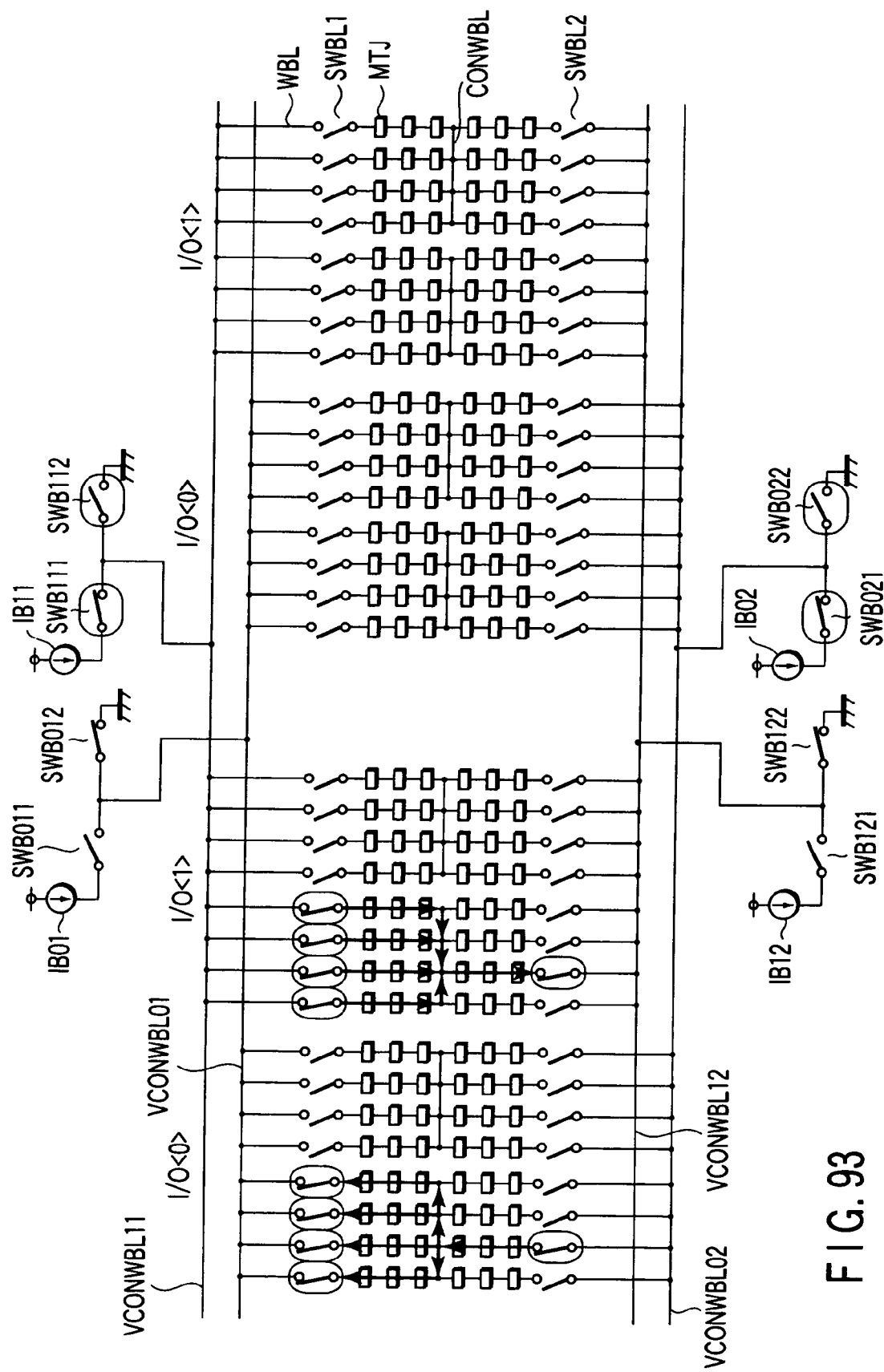
F I G. 93

SEMICONDUCTOR MEMORY DEVICE

CROSS-REFERENCE TO RELATED APPLICATIONS

This is a Continuation-in-Part application of U.S. patent application Ser. No. 11/065,143, filed Feb. 24, 2005, now abandoned, the entire contents of which are incorporated herein reference, This application is based upon and claims the benefit of priority from prior Japanese Patent Applications No. 2004-346464, filed Nov. 30, 2004; and No. 2005-346720, filed Nov. 30, 2005, the entire contents of both of which are incorporated herein by reference.

BACKGROUND OF THE INVENTION

1. Field of the Invention

The present invention relates to a semiconductor memory device that performs a write operation using a current, and for example, to the arrangement and wiring configuration of write lines in a magnetic random access memory (MRAM).

2. Description of the Related Art

An MRAM (see for example, "IEEE Journal of Solid-State Circuits", May 2003, Vol. 38, No. 5, pp. 769-773) is a memory that stores data by using the magnetoresistance effect. A voltage is used to write data in conventional flash memory and the like. On the other hand, a current is used to write data in MRAM.

Magnetic tunnel junction (MTJ) elements used in an MRAM utilize the tunneling magnetoresistance effect. An MTJ element generally has an insulating layer and two ferromagnetic layers which sandwich the insulating layer. One of the ferromagnetic layers is called a reference layer and has a direction of magnetization fixed. The other ferromagnetic layer is called a recording layer and does not have a direction of magnetization fixed.

The tunneling magnetoresistance effect is a phenomenon in which a tunneling current varies depending on whether or not the relative relations of the magnetization direction of the two ferromagnetic films are parallel or antiparallel. If the magnetization directions are parallel, the tunneling current is large, so that the MTJ elements have a small resistance. In this case, the resultant data is "0". On the other hand, if the magnetization directions are antiparallel, the tunnel current is small, so that the MTJ elements have a large resistance. In this case, the resultant data is "1". A write operation is performed by using a magnetic field induced by a current to set the direction of magnetization of the reference layer to be the same as or opposite to that of the reference layer.

U.S. Pat. No. 6,545,906B1 describes a magnetic memory device employing what is called a toggle write scheme. The magnetic memory device based on this scheme differs from conventional magnetic memory devices in the easy axis of magnetization of the MTJ element, the structure of the MTJ element, and the timing for conducting a write current.

The Jpn. Pat. Appln. KOKAI Publication 2004-220759 and U.S. Pat. No. 6,914,808 describes a magnetic memory device employing what is called a resistance-divided memory cell. In this system, one memory cell has two MTJ elements holding complementary data. A value for a read signal is determined by the ratio of the resistance of one MTJ element to the resistance of the other MTJ element.

BRIEF SUMMARY OF THE INVENTION

According to a first aspect of the present invention, there is provided a semiconductor memory device comprising: a plurality of memory cells using a current flowing through a wiring; a plurality of first write lines electrically or magnetically or electrically and magnetically connected to the memory cells and provided along a first direction; and a first connection line which electrically connects at least two of the first write lines each other.

BRIEF DESCRIPTION OF THE SEVERAL VIEWS OF THE DRAWING

FIGS. 3, 4, and 5 are diagrams each showing essential parts of a semiconductor memory device according to another example of the first embodiment;

FIG. 46 is a diagram showing a switch circuit and control signals for the switch circuit;

FIG. 57 is a diagram showing another example of essential parts of the semiconductor memory device according to the eighth embodiment;

FIG. 64 is a diagram showing essential parts of a semiconductor memory device according to another example of the tenth embodiment;

FIGS. 80, 81, 82, 83 and 84 are diagrams each showing a state of a semiconductor memory device according to a third example of the thirteenth embodiment;

FIGS. 85, 86, 87, 88, 89, 90, 91, 92, 93 and 94 are diagrams each showing a portion of a semiconductor memory device according to a fourth example of the thirteenth embodiment;

DETAILED DESCRIPTION OF THE INVENTION

Figure 1:
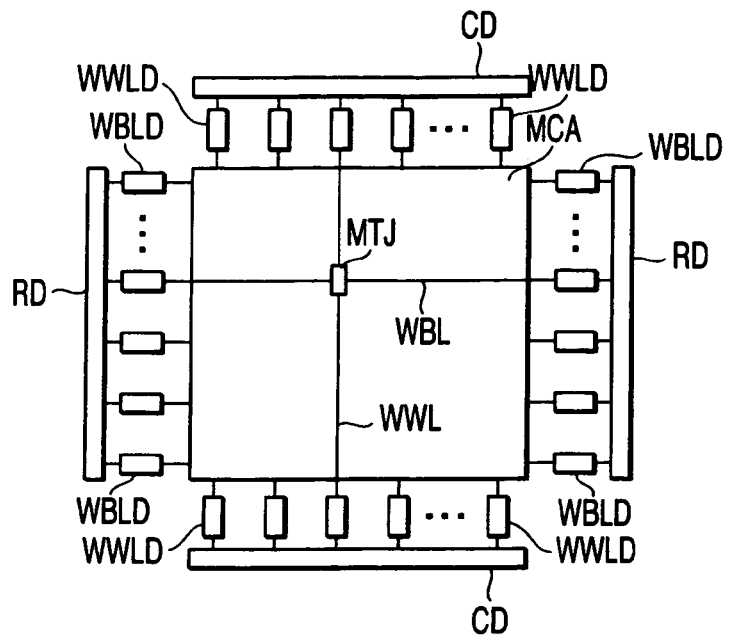
FIG. 1 is a diagram showing a semiconductor memory device according to each embodiment of the present invention.

While developing the present invention, the inventors studied methods for realizing a magnetic memory device that can reduce the manufacturing cost. As a result, the inventors have obtained the knowledge described below.

In a general MRAM, a current is conducted through a write line to induce a magnetic field to write data to an MTJ element. The write operation indirectly uses a current in contrast to other types of semiconductor memory. Accordingly, a relatively large current is required to write data. Specifically, at present, a write current of one to several tens of mA is required.

Here, the voltage applied to a write line is assumed fixed. Then, the resistance required to obtain a sufficient write current is determined on the basis of Ohm's law (V=RI). The length of the write line is then determined on the basis of the determined wiring resistance. The maximum number of memory cells provided for the write line is then determined in accordance with the determined length. That is, with an MRAM, the current required for a write determines the scale of a memory cell array.

For a memory device, the scale of a memory array is maximized in order to lower the manufacturing cost by reducing the chip size. In other words, it is necessary to increase the number of memory cells provided for one write line. Increasing the length of a write line allows the number of memory cells to be increased. However, increasing in the length of the write line increases the wiring resistance.

It is possible to increase the write current by increasing the difference between potentials applied to the opposite ends of the write line. However, the power supply voltage is fixed for each generation. Further, a high-voltage-resistance transistor must be provided in order to allow the use of a potential equal to or higher than the power supply voltage. This undesirably increases the manufacturing cost.

Thus, the length of a write line has hitherto been limited to the one determined by the voltage applied to the write line and the length determined by the write current. In other words, the scale of the memory cell array is uniquely determined by the magnitude of the write current. Consequently, a reduction in write current has been the only method for increasing the scale of the memory cell array to reduce the chip size and thus the manufacturing cost.

With reference to the drawings, description will be given of embodiments of the present invention constructed on the basis of the above knowledge. In the description below, the same reference numerals are used to denote components having substantially the same functions and configurations. Duplicate descriptions will be given only when required.

First Embodiment

FIG. 1 schematically shows the configuration of a semiconductor memory device common to the embodiments of the present invention. FIG. 1 shows a memory cell array and a circuit relating to writes which are extracted from the semiconductor memory device. As shown in FIG. 1, the semiconductor memory device has a memory cell array MCA. As described later in detail, the memory cell array MCA has a plurality of MTJ elements MTJ, a plurality of write bit lines WBL extending in an x direction (the horizontal direction of the drawing), and a plurality of write word lines WWL extending in a y direction (the vertical direction of the drawing). The figure shows only one MTJ element MTJ, one write bit line, and one write word line.

Figure 58:
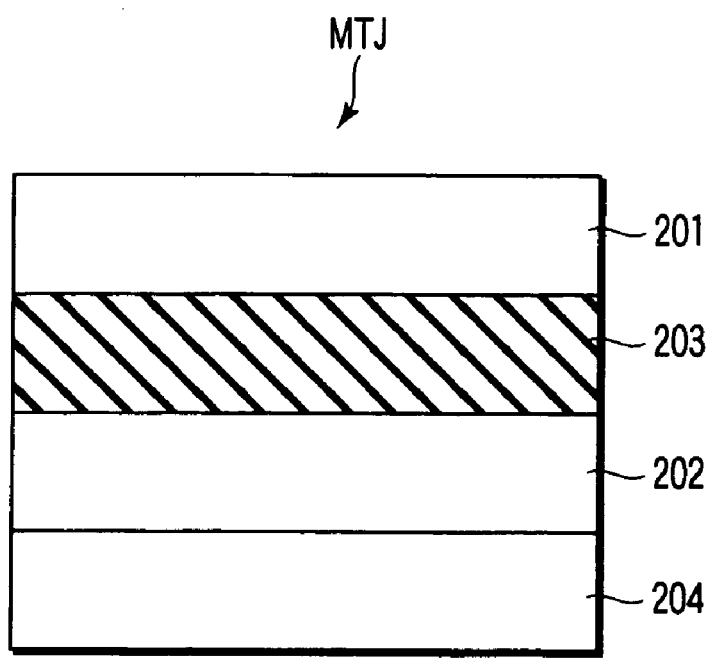
FIG. 58 is a diagram illustrating the sectional structure of MTJ element.

The MTJ element MTJ may have any configuration so long as it can store at least binary data in accordance with a magnetic field applied to the MTJ element MTJ. As shown in FIG. 58, a structure is typically used in which one insulating film 203 is sandwiched between two ferromagnetic films 201, 202. One of the ferromagnetic films has a direction of magnetization (direction of spin) fixed by an antiferromagnetic film 204 called a pin layer. The fixed ferromagnetic film 202 is called a pinned layer, a fixed layer, a reference layer, or the like. The direction of magnetization of the other ferromagnetic film 201 can be reversed along the easy axis of magnetization. This ferromagnetic film is called a free layer, a memory layer, or the like. Binary data is stored depending on whether the directions of spins of the free layer and pin layer are antiparallel or parallel.

Data is typically written to the MTJ element MTJ by conducting a current through two write lines (write word line WWL and write bit line WBL) crossing each other at the MTJ element MTJ. This current causes synthesized magnetic fields generated around the two write lines to be applied to the MTJ element. The synthetic magnetic field reverses the directions of the spin of the free layer. Data is thus written. The direction of a current flowing through one or both of the two write lines is determined depending on the data being written.

Figure 59:
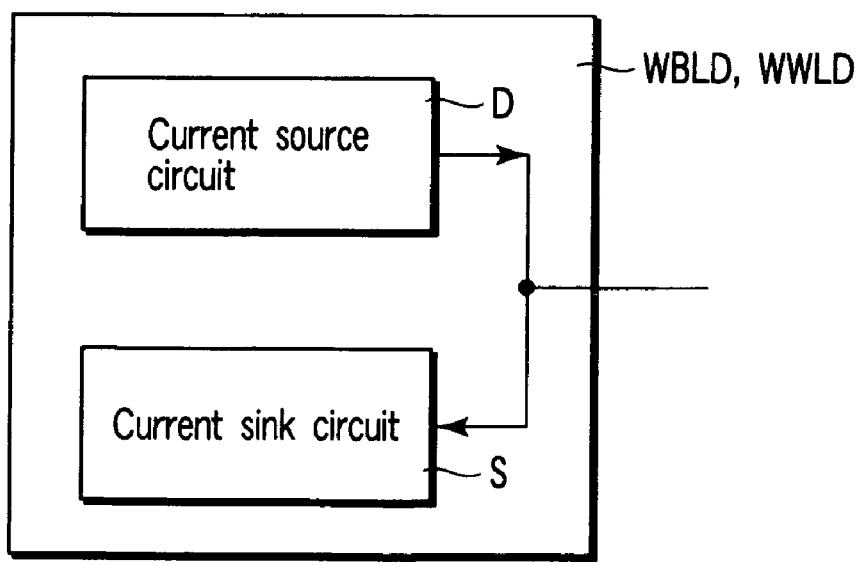
FIG. 59 is a diagram illustrating a write bit line current circuit and a write word line current circuit.

Write bit line current circuits (driver/sink) WBLD are connected to the opposite ends of each write bit line WBL. As shown in FIG. 59, each write bit line current circuit WBLD has a driver (current source circuit) D that drives the current into the write bit line and a sink (current sink circuit) S that draws the current out of the write bit line. The write bit line current circuit WBLD is supplied with a control signal from a row decoder RD. Either the driver D or the sink S is activated (operates) in accordance with the control signal. Whether the driver D or the sink S is activated (operates) is determined so that a current flows in a direction corresponding to the data to write.

Likewise, write word line current circuits WWLD are connected to the opposite ends of each write word line WWL. Each write word line current circuit WWLD has a driver D and a sink S, like the write bit line current circuit WBLD. The write word line current circuit WWLD is supplied with a control signal from a column decoder CD. During a write, either the driver D or the sink S operates in accordance with the control signal. Whether the driver D or the sink S operates is determined so that a current flows in a direction corresponding to the data to write.

The row decoder RD and the column decoder CD (control section) control the write line current circuits (write bit line current circuit WBLD and write word line current circuit WWLD) so that data is written to the MTJ element MTJ at an address in accordance with an address signal.

If the write current has only to flow in one direction, each of the write bit line current circuit WBLD and the write word line current circuit WWLD has only to have the functions of either the driver or sink depending on the direction in which the current flows.

For simplification of description, only the parts required for writes are shown and will be described. For example, those skilled in the art can use the prior art to realize parts such as read word lines and selection transistors which are required for reads.

Figure 2:
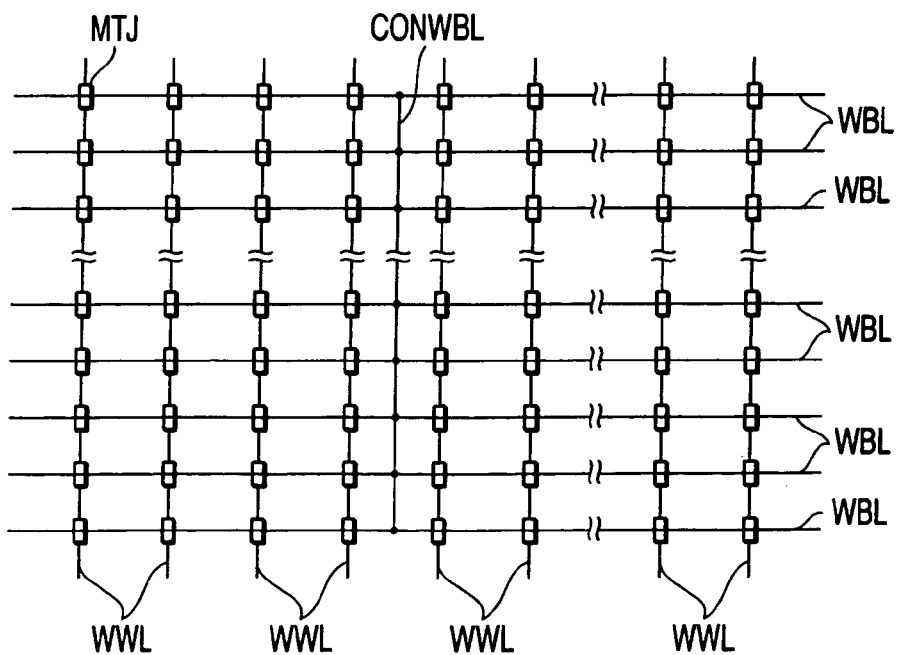
FIG. 2 is a diagram showing essential parts of a semiconductor memory device according to a first embodiment.

Now, with reference to FIG. 2, description will be given of a semiconductor memory device according to a first embodiment of the present invention. FIG. 2 is a diagram schematically showing essential parts of a semiconductor memory device according to a first embodiment of the present invention. FIG. 2 shows only the part of the memory cell array MCA in FIG. 1. As shown in FIG. 2, the memory cell array MCA is constructed by arranging a plurality of MTJ elements MTJ in a matrix, the MTJ elements serving as memory cells. For example, x (natural number greater than 1) MTJ elements MTJ are arranged along the vertical direction of the drawing, while y (natural number greater than 1) MTJ elements MTJ are arranged along the horizontal direction of the drawing.

As shown in FIG. 2, x write bit lines WBL extend in the horizontal direction of the drawing so as to pass through the MTJ elements arranged in the horizontal direction of the drawing. Similarly, y write word lines WWL extend in the vertical direction of the drawing so as to pass through the MTJ elements arranged in the vertical direction of the drawing. The write bit line WBL and the write word line WWL are electrically or magnetically or electrically and magnetically connected to the MTJ element located at the intersection between the write bit line WBL and the write word line WWL.

Figure 52:
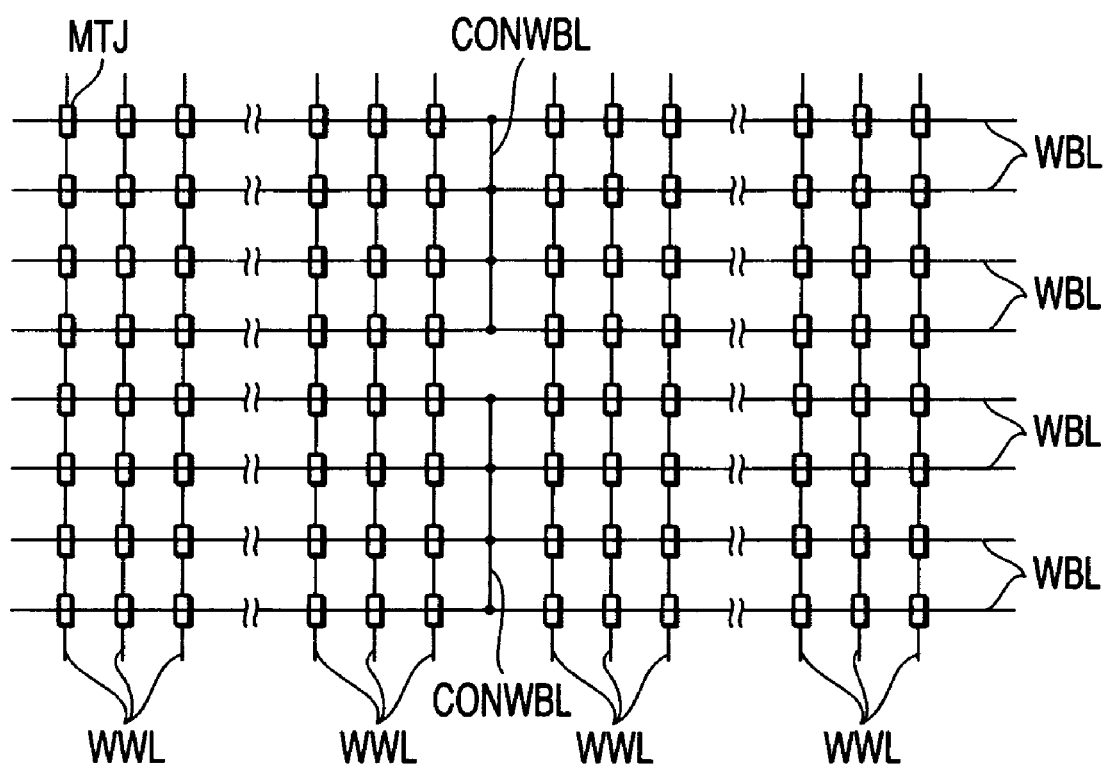
FIGS. 52, 53, 54, and 55 are diagrams each showing another example of essential parts of the semiconductor memory device according to the first embodiment.

The write bit lines WBL are electrically connected together by a connection line (first connection line). The connection line CONWBL extends along the write word lines WWL. The connection line CONWBL may connect all the write lines WBL or, for example, the n-th (n is a natural number) power of 2 as shown in FIG. 52 (four write bit lines are illustrated in FIG. 52).

Figure 36:
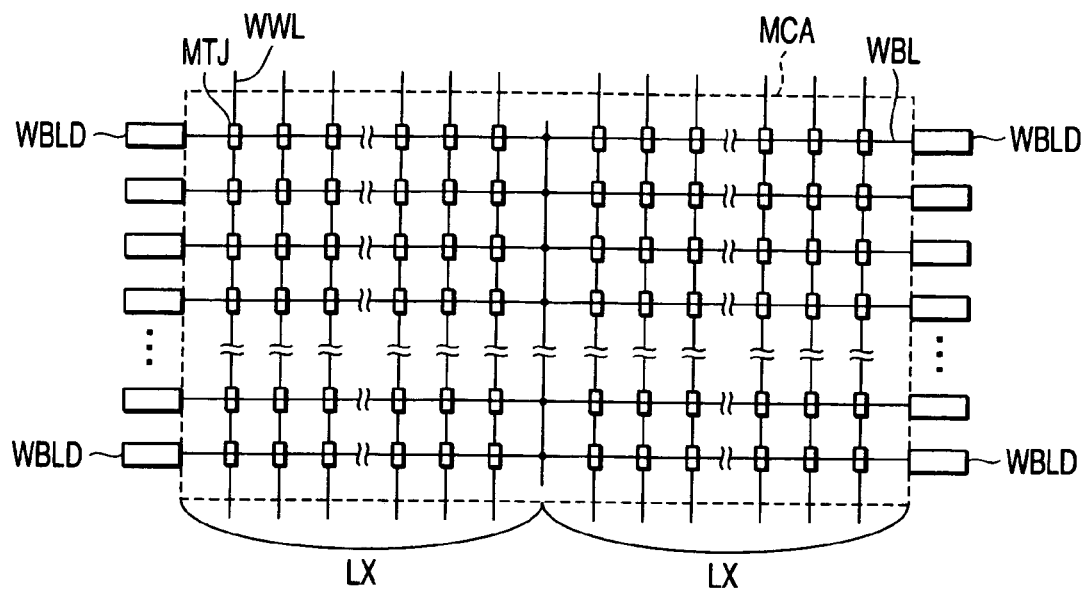
FIGS. 36 and 37 are diagrams showing the position of the connection line in the semiconductor memory device according to the first embodiment.

The connection line CONWBL can be placed at an arbitrary position of the memory cell array MCA such as its center or the vicinity of its end. However, typically, the connection line CONWBL is located in the center of the memory cell array MCA as shown in FIG. 36. In other words, the connection line CONWBL is located in the center of the write bit lines WBL. The term center as used herein means the center and its vicinity. More specifically, the center refers to a position such that the ratio of the length of the right part of the connection line CONWBL to its left part is at most 10%.

Figure 37:
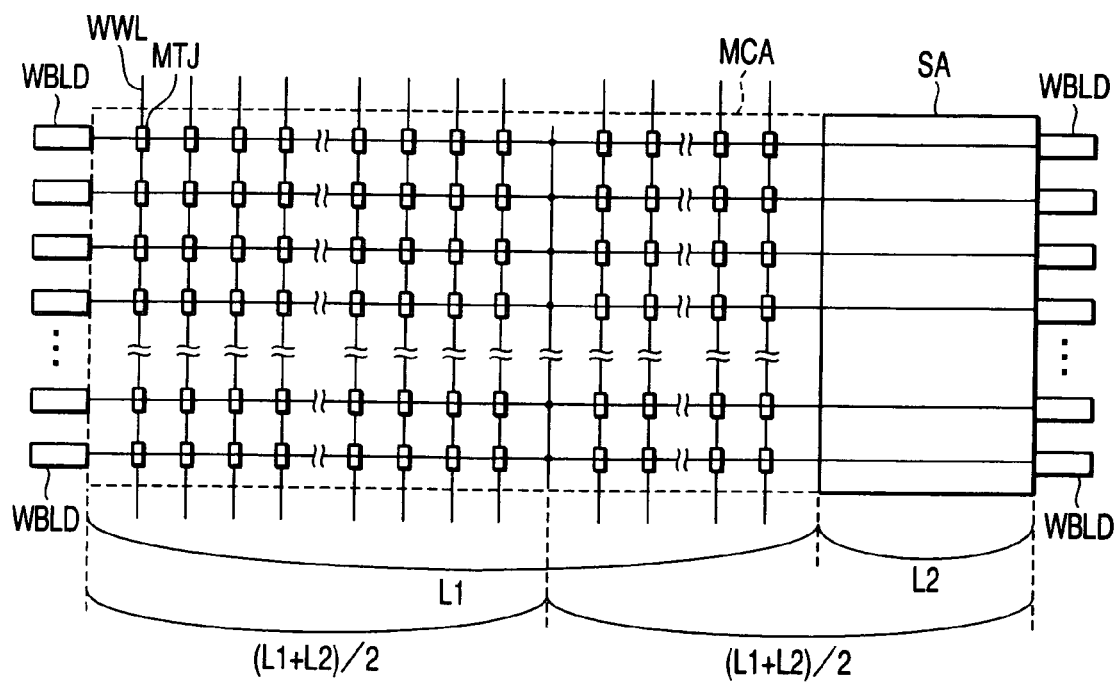

Even if a sense amplifier SA is provided between the memory cell array MCA and the write bit line driver WBLD as shown in FIG. 37, the connection line CONWBL can be placed at a similar position. Specifically, if the length of the write bit line WBL within the memory cell array MCA is defined as L1 and the length of the write bit line WBL within the sense amplifier SA is defined as L2, the connection line CONWBL is provided at a distance equal to (L1/L2)/2 from an end of the write bit line WBL. Also in this case, the lengths of the opposite parts of the write bit line WBL across the connection line CONWBL have only to be almost the same (for example, a difference of about 10% is permitted) and need not be perfectly the same. The connection line CONWBL is thus placed in the center of the write bit lines in order to balance the resistance values of the two parts of the write bit line WBL.

Further, as shown in FIG. 3, for the spacing between two columns with MTJ elements and write word line, only the spacing between two columns sandwiching the connection line CONWBL between them may be larger than that between the other pairs of columns. In this case, for example, the distance La between the connection line CONWBL and the adjacent MTJ element MTJ is set larger than the distance Lb between the MTJ element MTJ and the adjacent write word line. This makes it possible to reduce the possibility that a current flowing through the connection line CONWBL causes a miswrite to the MTJ element MTJ adjacent to the connection line CONWBL. The magnitude of a magnetic field induced by a current is in inverse proportion to the square of the distance. Accordingly, if the distance between a write line and an MTJ element is increased by a factor of 1.5, the magnetic field applied to the MTJ element decreases to about 44%.

Further, as shown in FIG. 4, the write word lines WWL may be electrically connected together by a connection line (second connection line) CONWWL. The connection line CONWWL extends along the write bit lines WBL. Typically, the connection line CONWWL is located in the center of the memory cell.

Figure 5:
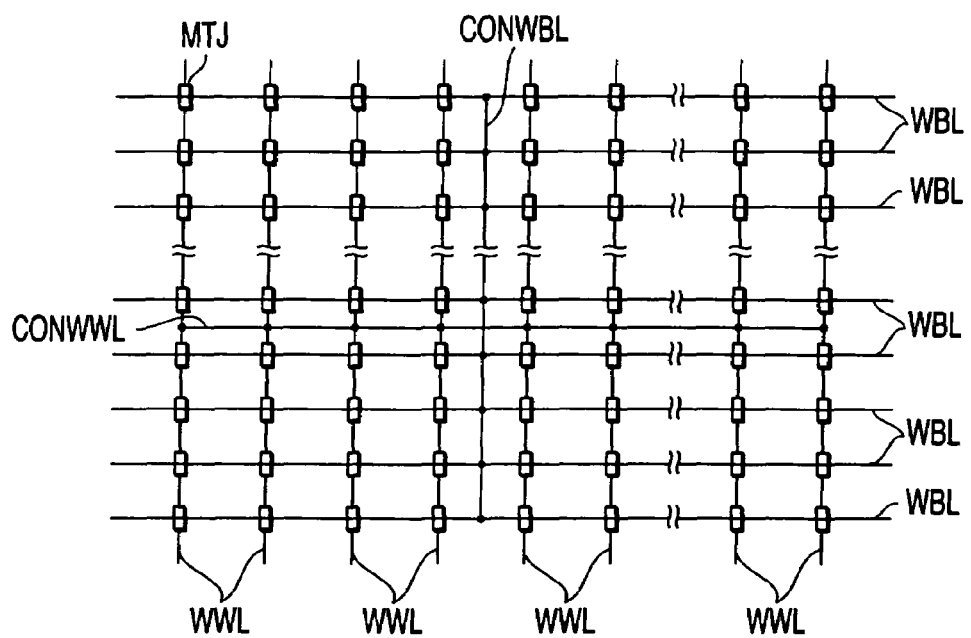
Figure 53:
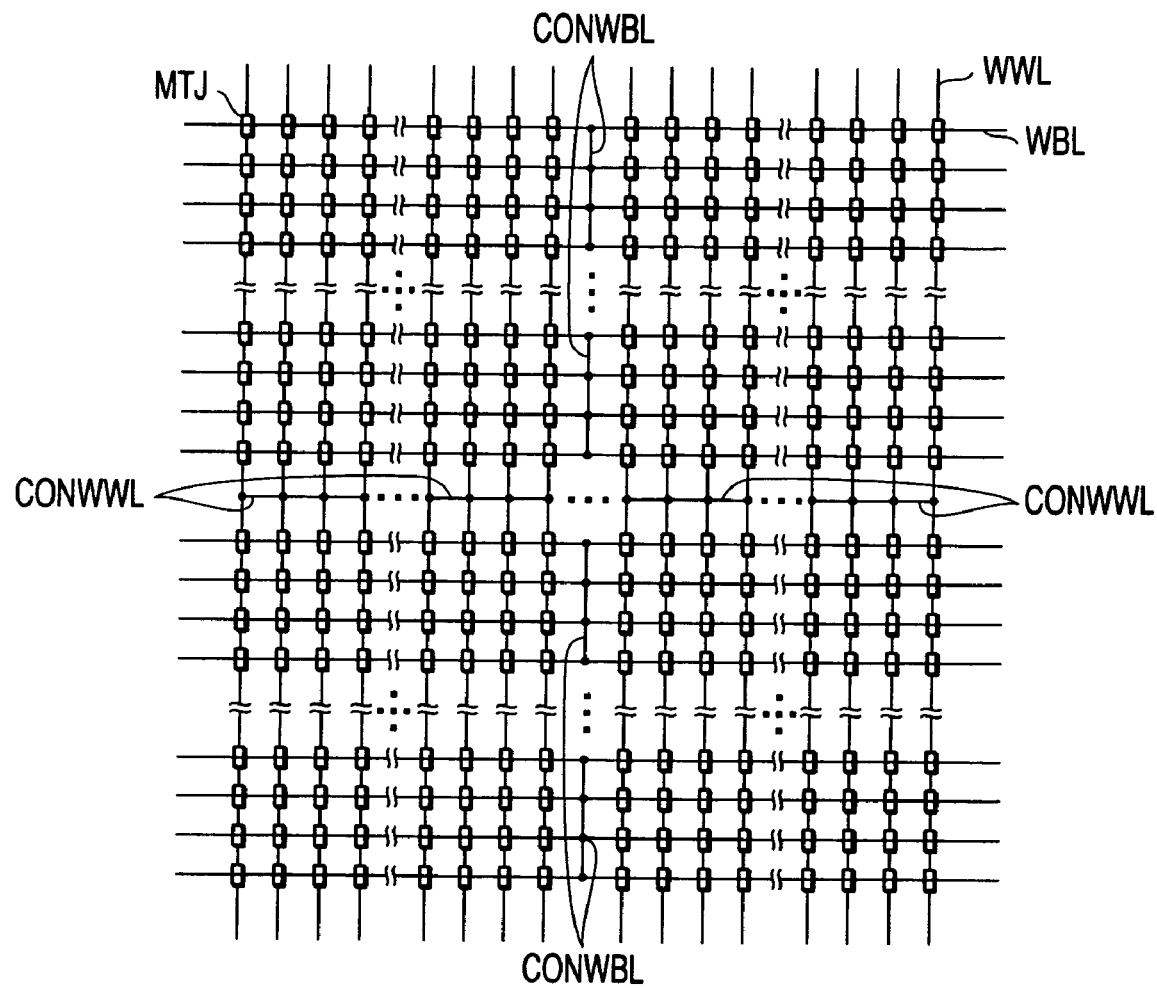
Figure 54:
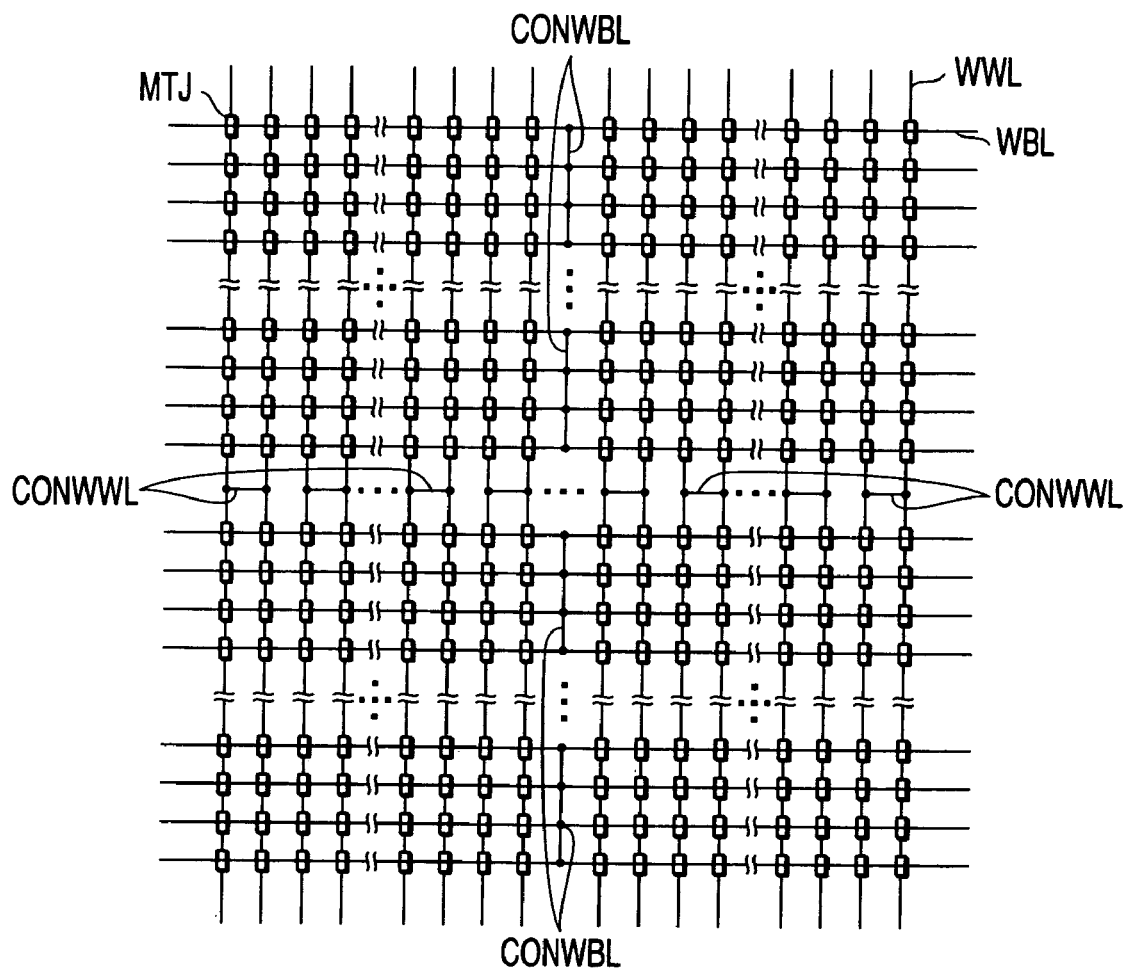
Figure 55:
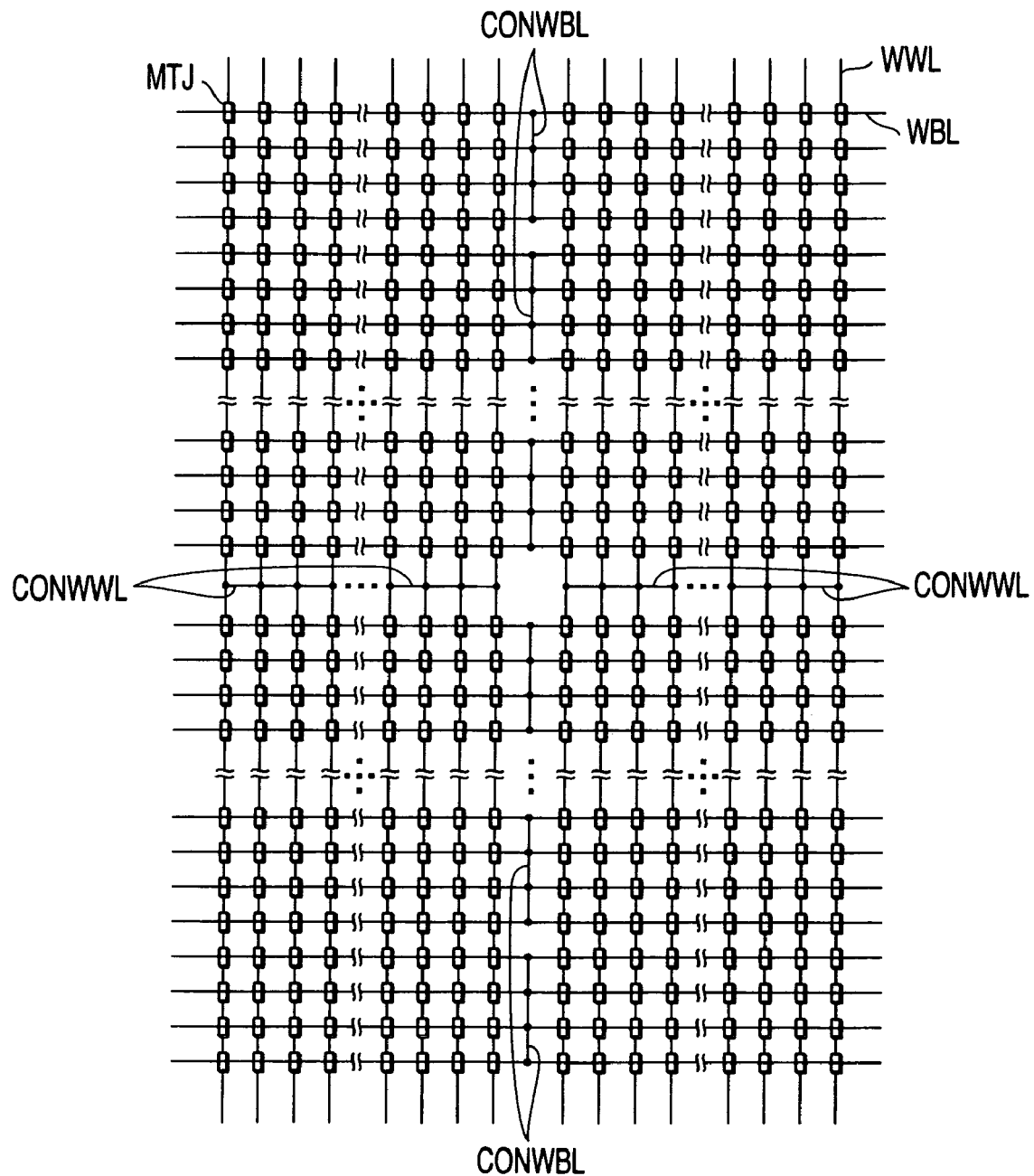

Moreover, as shown in FIG. 5, both connection line CONWWL and CONNBL may be provided. In this case, the number of write bit lines WBL connected together by the connection line CONWBL may be the same as (FIG. 53) or different from (FIG. 54) that of write word lines WWL connected together by the connection line CONWWL. FIG. 53 illustrates the case in which four write bit lines are connected together, while four write word lines are connected together. FIG. 54 illustrates the case in which four write bit lines WBL are connected together, while two write word lines WWL are connected together. Further, as shown in FIG. 55, the length of the write word line WWL (the number of MTJ elements MTJ along the direction of the write word lines WWL) may be larger than that of the write bit line WBL (the number of MTJ elements MTJ along the direction of the write bit lines WBL).

The connection line CONWBL may be provided in the same wiring layer as that of the write bit lines WBL or in a different layer. Likewise, the connection line CONWWL may be provided in the same wiring layer as that of the write word lines WWL or in a different layer.

Figure 6:
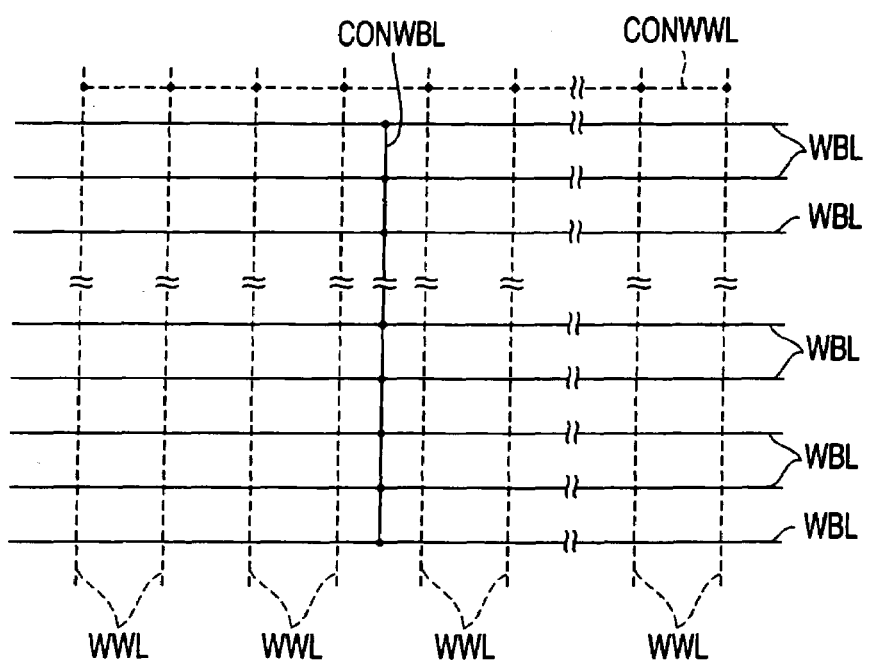
FIG. 6 is a diagram showing the vertical relationship between write lines and a connection line.

When both connection lines CONWBL and CONWWL are provided, it is possible to provide the write bit lines WBL and the connection line CONWBL in the same wiring layer, while providing the write word lines WWL and the connection line CONWWL in the same wiring layer, for example, as shown in FIG. 6. In FIG. 6, for example, a solid line indicates a wiring layer above the MTJ elements MTJ. A broken line indicates a wiring layer below the MTJ elements MTJ.

Figure 7:
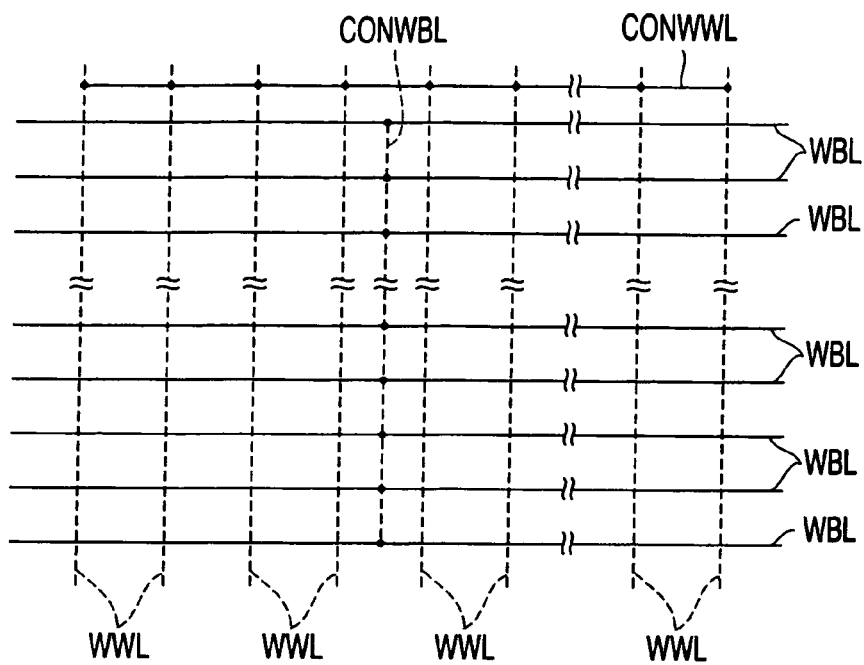
FIG. 7 is a diagram showing another example of the vertical relationship between the write lines and the connection line.

Alternatively, it is possible to provide the write bit lines WBL and the connection line CONWWL in the same wiring layer, while providing the write word lines WWL and the connection line CONWBL in the same wiring layer, as shown in FIG. 7. In this case, a contact is formed at the position of each black point to electrically connect two wiring layers together.

In the semiconductor memory device according to the first embodiment of the present invention, the connection line CONWBL electrically connects the write bit lines WBL. This reduces the effective wiring resistance of the write bit line WBL offered when the write current is conducted through the write bit line WBL. Accordingly, the write bit line WBL can be lengthened while maintaining the voltage applied across the write bit line and the write current. This enables an increase in the number of MTJ elements provided for one write bit line WBL and thus in the scale of the memory cell array MCA. The increase in the scale of the memory cell array MCA enables a reduction in chip size. As a result, the number of chips that can be manufactured from one wafer increases. Therefore, the manufacturing cost can be reduced.

Further, if the write word lines WWL are electrically connected together by the connection line CONWWL, similar advantages are also obtained by reducing the effective wiring resistance of the write word line WWL. Moreover, the provision of both connection lines CONWBL and CONWWL can increase the lengths of the write bit line WBL and write word line WWL. This further serves to reduce the manufacturing costs by increasing the scale of the memory cell array MCA.

Second Embodiment

A second embodiment relates to a method of conducting a current through the write lines in the semiconductor memory device according to the first embodiment.

Figure 8:
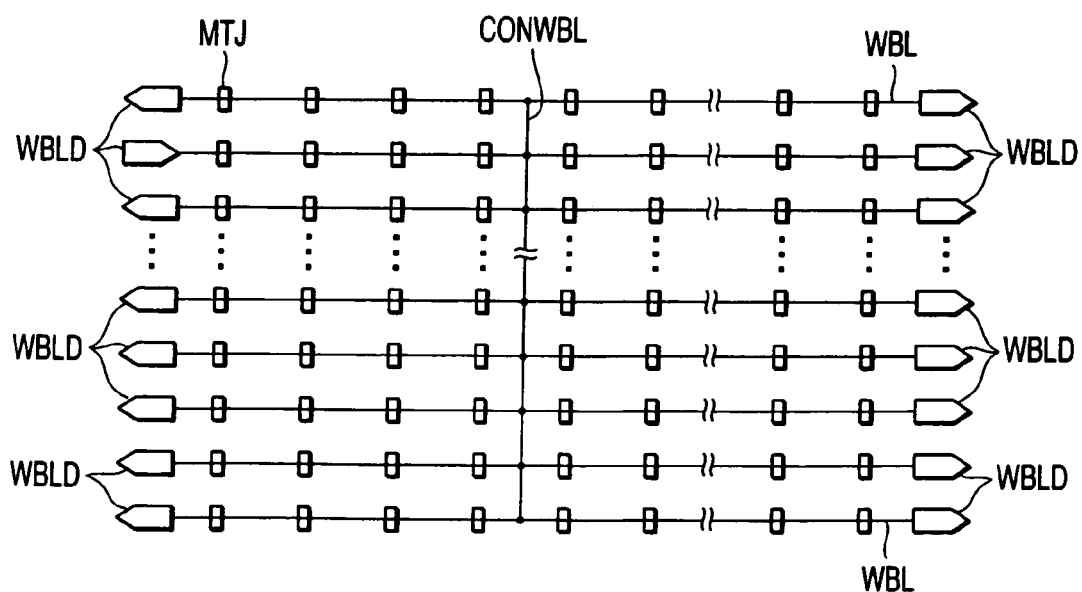
FIGS. 8, 9, 10, and 11 are diagrams each showing a state of a semiconductor memory device according to a second embodiment during a write.
Figure 9:
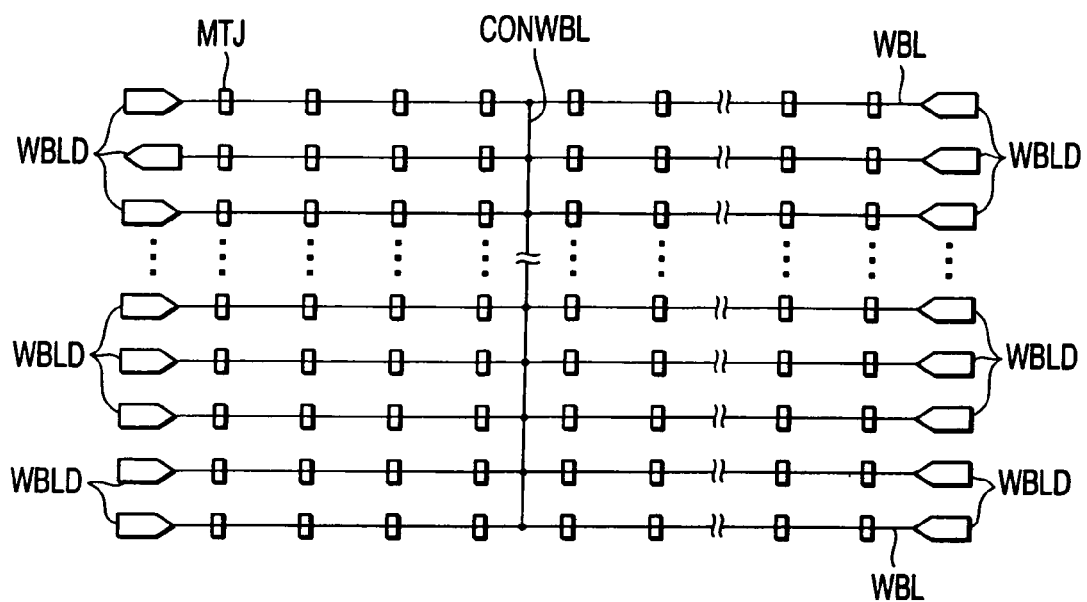

With reference to FIGS. 8 and 9, description will be given of the second embodiment. The following explanation corresponds to the case in which data is written to the MTJ elements MTJ located to the left of the connection line CONWBL in the configuration of the first embodiment shown in FIG. 2 as an example. More specifically, as an example of this case, a write is executed on the MTJ element (selected MTJ elements) through which the second write bit line WBL from the top of the drawing passes.

FIGS. 8 and 9 are diagrams schematically showing the state of essential parts of the second embodiment of the present invention during a write. In particular, in FIG. 8, the write current flows rightward in the drawing through the write bit line (selected write bit line) WBL passing through the selected MTJ element. In FIG. 9, the write current flows leftward in the drawing through the write bit line WBL. For those of the write bit line current circuits WBLD in FIGS. 8 and 9 in which the tip portion of their acute angle faces opposite the write bit line WBL, the sink is operating. In FIGS. 8 and 9, the write word lines WWL are omitted. At standby, all the write bit lines WBL are precharged to a predetermined potential (for example, a common potential (ground potential)).

As shown in FIG. 8, if the write current flows through the selected write bit line WBL rightward in the drawing, then for the pair of write bit line current circuits (selected write bit line current circuits) WBLD connected to the selected write bit line, the driver operates in the left write bit line current circuit, whereas the sink operates in the right write bit line current circuit.

The write current flowing from the selected left write bit line current circuit WBLD is dispersed to other write bit lines WBL via the connection line CONWBL. The sinks draw (drain) the dispersed currents, so that the current flows rightward in the right part of the write bit line WBL with respect to the connection line CONWBL. The current flows leftward in the left part of the write bit line WBL with respect to the connection line CONWBL. Since the write current is thus dispersed to all the write bit lines WBL, the current flowing through each write bit line WBL decreases. For example, if the wiring resistance between the driver or sink of each write bit line WBL and the connection line CONWBL is defined as R, the resistance value of a write current path decreases to R+R/(2n−1) (n is the number of write bit lines WBL connected together). If the write bit lines WBL are not connected together as in the prior art, the resistance value of the write current path is 2R. Accordingly, in qualitative terms, the resistance value can be reduced by about 33 to 50% depending on the value of n. It is thus possible to increase the wiring resistance of the write bit line WBL, that is, the length of the write bit line WBL.

If as shown in FIG. 9, the write current is conducted through the selected write bit line WBL leftward in the drawing, then for the pair of selected write bit line current circuits WBLD, the driver operates in the right write bit line current circuit WBLD, whereas the sink operates in the left write bit line current circuit WBLD. The driver operates in the write bit line current circuits WBLD other than the selected ones WBLD.

The write current flowing out of the write bit line current circuit WBLD other than the right selected ones WBLD flows, via the connection line CONWBL, into the left part of the selected write bit line WBL with respect to the connection line CONWBL. In other words, the current flowing through the left part of the selected write bit line WBL is the sum of currents that all the drivers passes into the write bit lines. Thus, a sufficiently large current can be conducted through the part of the selected write bit line WBL which passes through the selected MTJ elements MTJ even if the wiring resistance of the write bit line WBL is increased, that is, the length of the write bit line WBL is increased. In other words, a sufficient write current can be conducted, while the length of the write bit line WBL can be increased.

In FIG. 8, not all the sinks in the bit line current circuits WBLD other than the selected write bit line current circuits WBLD have to operate. At least one sink has only to operate. Further, in FIG. 9, in the bit line current circuits WBLD other than the selected write bit line current circuits WBLD, at least one driver has only to operate. This also applies to the embodiments described below.

Description has been given in conjunction with the case in which the selected MTJ elements MTJ are located to the left of the connection line CONWBL. The above description also applies to the case in which the selected MTJ elements are located to the right of the connection line CONWBL. That is, if the current flows rightward through the selected write bit line WBL, the driver operates in the selected left write bit line current circuit WBLD, whereas the sink operates in the selected right write bit line current circuit WBLD. If the current flows leftward through the selected write bit line WBL, the driver operates in the selected right write bit line current circuit WBLD, whereas the sink operates in the selected left write bit line current circuit WBLD. The sink operates in the other write bit line current circuits WBLD.

The description has been given of the write bit line WBL, that is, of the example of the first embodiment shown in FIG. 2. However, in the example shown in FIG. 4, whether the driver or the sink is activated in each write word line current circuit WWLD is similarly determined.

Figure 10:
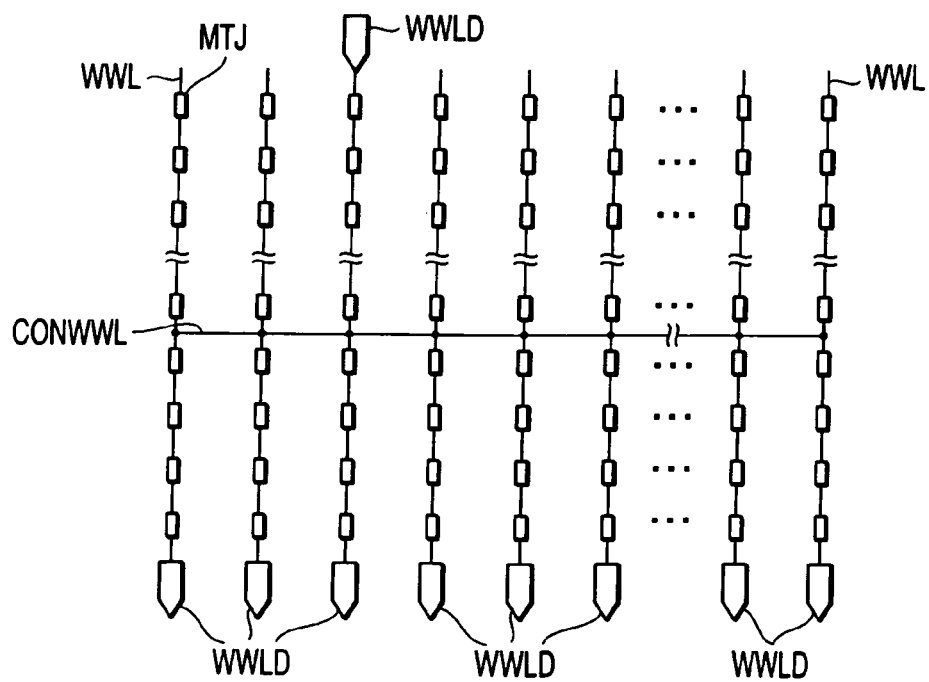
Figure 11:
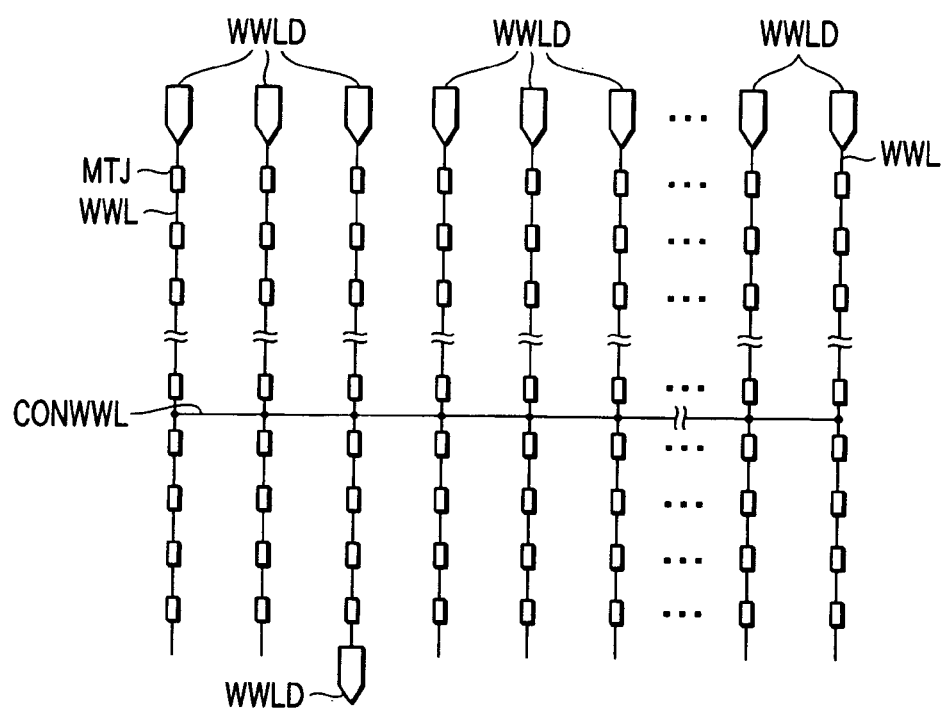

A current flowing through a write line in only one direction also may realize a write. Now, this will be described in conjunction with the case shown in FIG. 4. FIGS. 10 and 11 each schematically show a state of the second embodiment during a write. In these figures, a current flows through the write bit line WBL in only one direction, for example, from the top to bottom of the drawings.

If the selected MTJ elements are located above the connection line CONWWL, then as shown in FIG. 10, only the driver connected to the selected write word line WWL operates. The other drivers does not operate. On the other hand, all the sinks operate.

If the selected MTJ elements are located below the connection line CONWWL, then as shown in FIG. 11, only the sink connected to the selected write word line WWL operates. The other sinks do not operate. On the other hand, all the drivers operate. This control allows a sufficient write current to be conducted through the part of the write line which passes through the selected MTJ elements, while allowing the length of the write line to be increased, even if the write current circuit has only one of the driver and sink. In FIGS. 10 and 11, the write bit lines WBL are also omitted.

Moreover, in the example shown in FIG. 5, by combining the several types of control shown in the present embodiment together, it is possible to provide a sufficient write current for both write bit line WBL and write word line WWL, while increasing the lengths of the lines.

Figure 56:
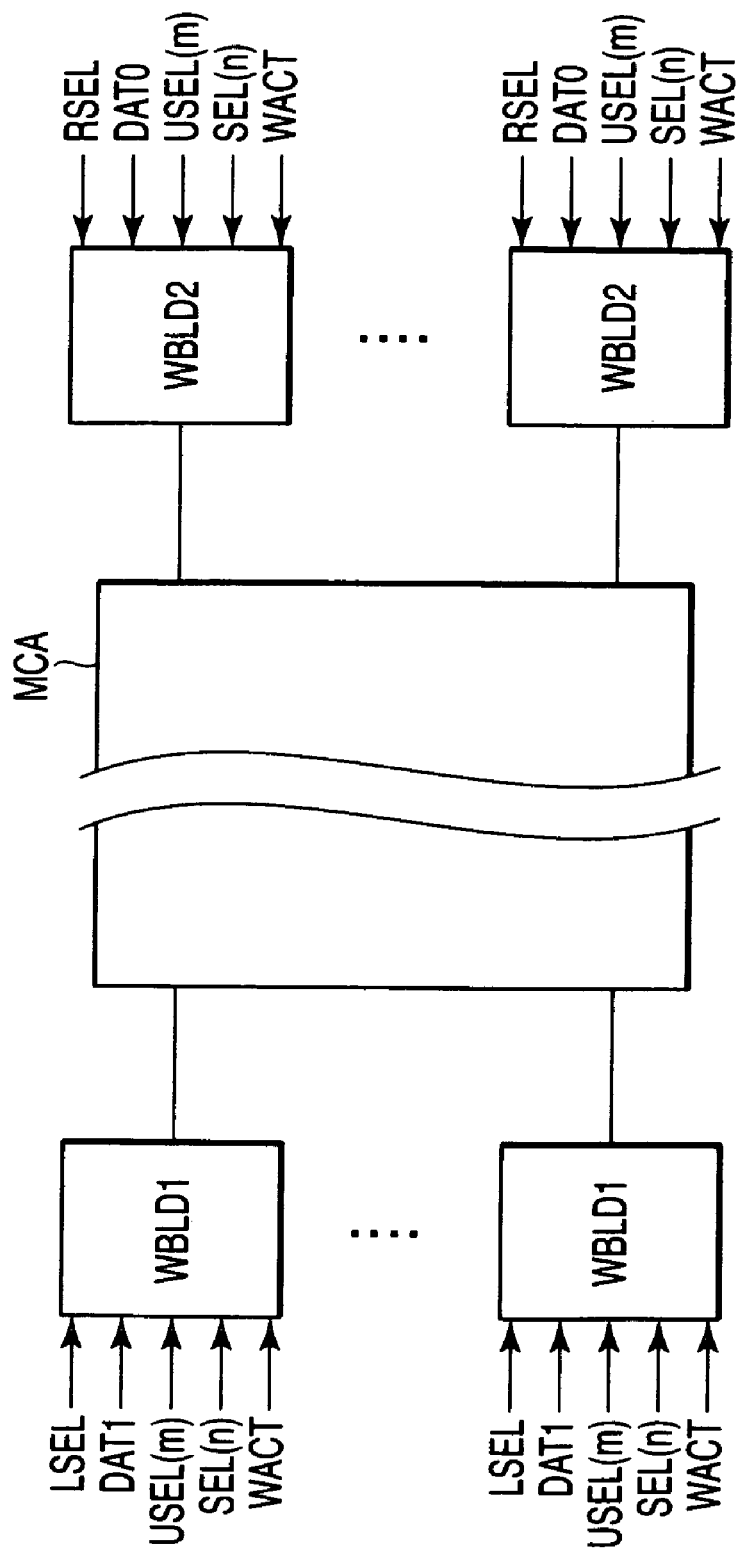
FIG. 56 is a diagram showing a write bit line current circuit and control signals for the write bit line current circuit.

Now, description will be given of the control of the write bit line current circuit WBLD and the write word line current circuit WWLD. FIG. 56 is a diagram showing a write bit line current circuit and control signals for it. As shown in FIG. 56, each write bit line current circuit WBLD1 in the left part of the drawing is supplied with control signals LSEL, DAT1, and WACT and address signals USEL(m) and SEL(n). Each write bit line current circuit WBLD2 in the right part of the drawing is supplied with control signals RSEL, DAT0, and WACT and address signals USEL(m) and SEL(n). Note that m is the number of write bit line groups which is constituted with one connection line CONWBL, and n is the number of write bit lines WBL constituting one bit line group.

In the description below, the write bit lines WBL connected together by one connection line CONWBL and the MTJ elements MTJ through which the write bit line WBL pass are called an interconnected unit. The description below will be given only of the write bit line WBL and the write bit line current circuit WBLD. However, exactly the same description applies to the write word line WWL and write word line current circuit WWLD.

The write bit line current circuit WBLD is controlled in accordance with a combination of the control signals LSEL, RSEL, DAT0, DAT1, USEL(m), SEL(n), and WACT. As a result, in accordance with the positions of the selected MTJ elements, the positions of the selected MTJ elements with respect to the connection line CONWBL, and write data, a state similar to the one shown in FIG. 8 or 9 or other figures is formed, with a magnetic field applied to the selected MTJ elements.

Figure 47:
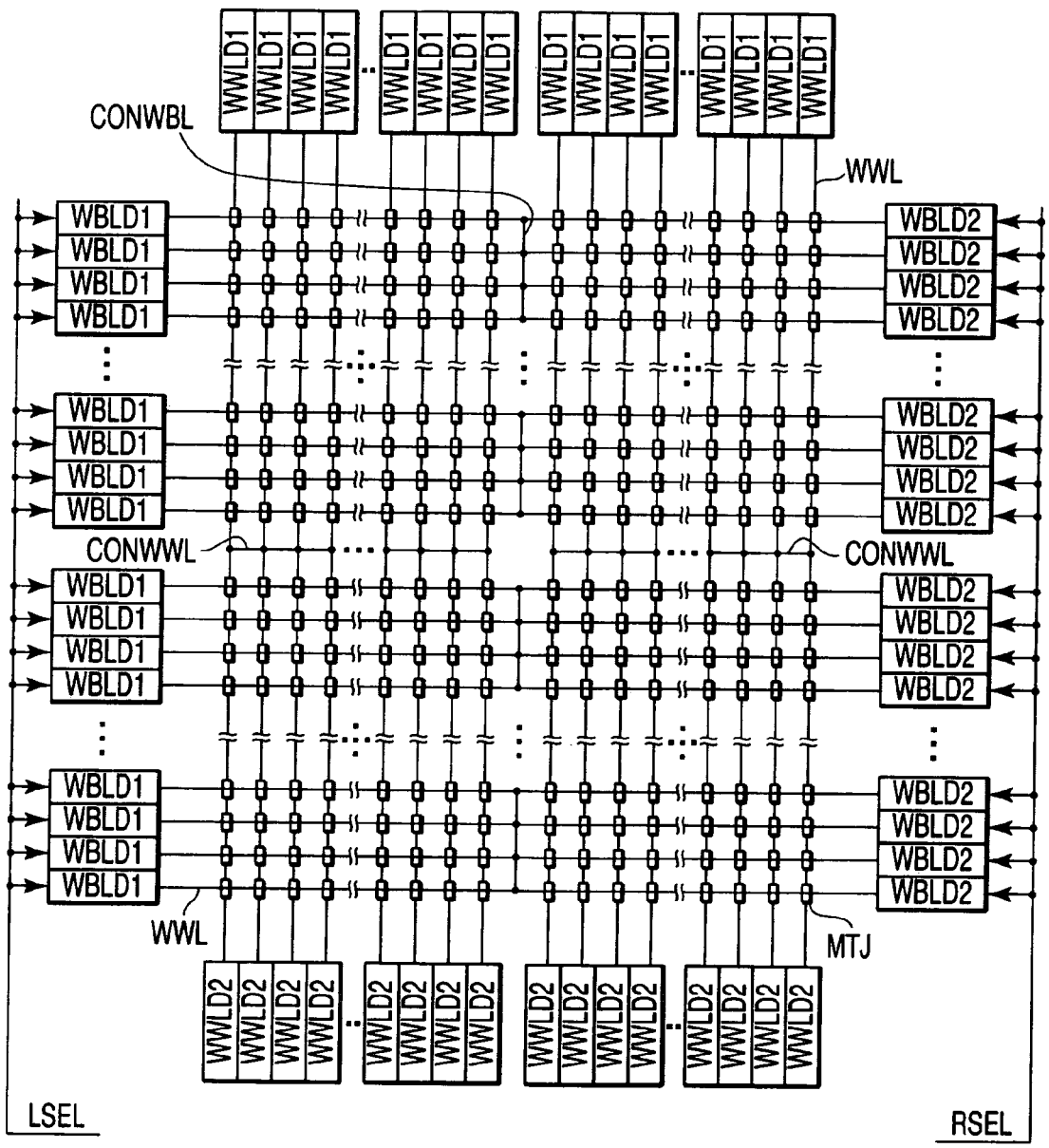
FIGS. 47, 48, 49, 50, and 51 are diagrams each illustrating signals for a write bit line current circuit.

FIG. 47 is a diagram showing the control signals LSEL and RSEL. The control signal LSEL is supplied to all the write bit line current circuits WBLD1. The control signal LSEL indicates that the selected MTJ elements are located to the left of the connection line CONWBL. In this case, the control signal LSEL is, for example, at a high level. The control signal RSEL is supplied to all the write bit line current circuits WBLD2. The control signal RSEL indicates that the selected MTJ elements are located to the right of the connection line CONWBL. The control signal RSEL is, for example, at the high level to indicate this case. Further, the control signals LSEL and RSEL are supplied to the write word line current circuit WWLD1 and WWLD2 as row addresses.

Similarly, the write word line current circuit WWLD1 is supplied with a signal indicating that the selected MTJ elements are located above the connection line CONWBL. The write word line current circuit WWLD2 is supplied with a signal indicating that the selected MTJ elements are located below the connection line CONWBL.

Figure 48:
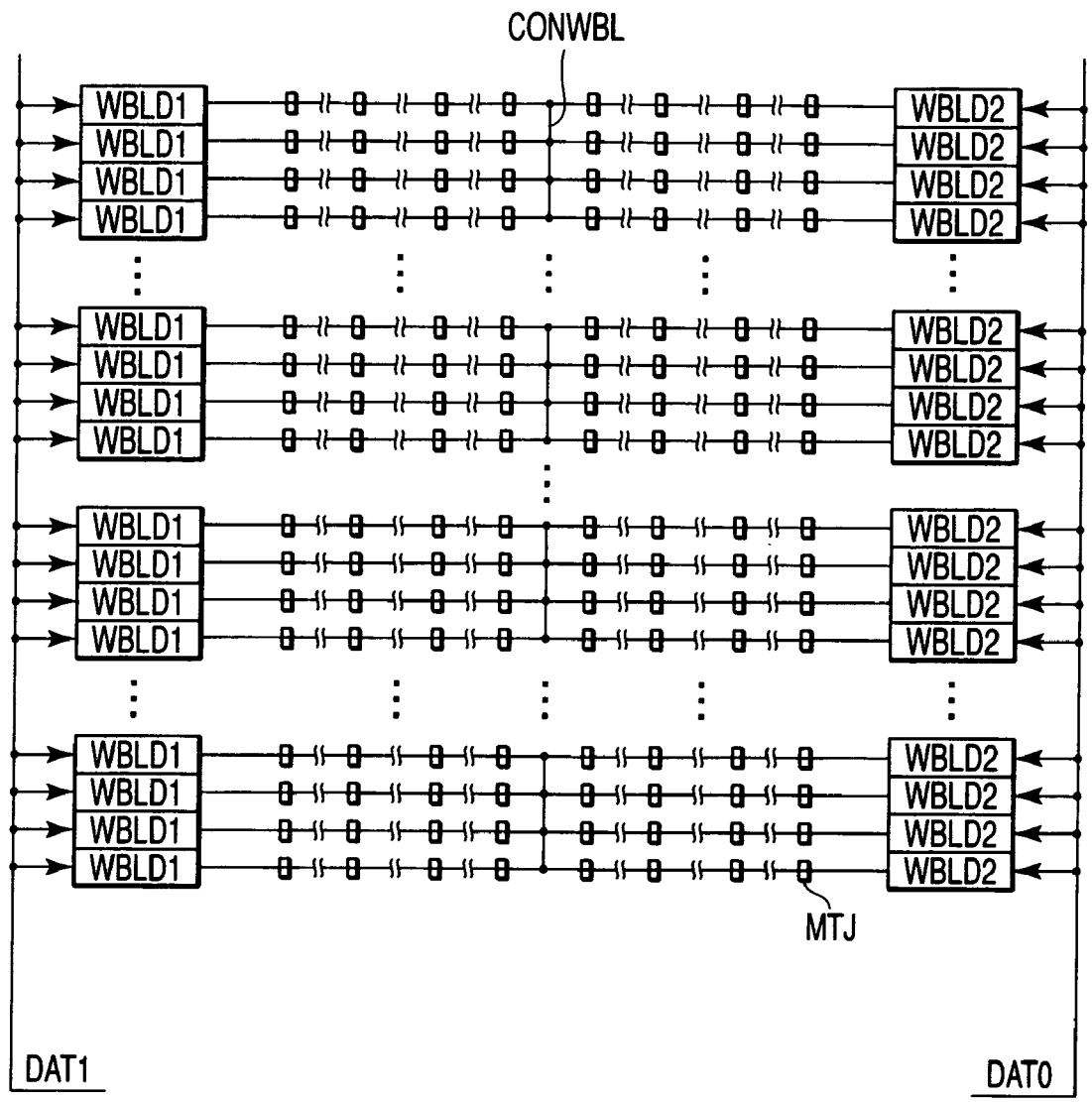

FIG. 48 is a diagram illustrating the control signals DAT0 and DAT1. The control signal DAT0 is supplied to all the write bit line current circuits WBLD2. The control signal DAT0 indicates that the write data is "0" and in this case, is, for example, at the high level. The control signal DAT1 is supplied to all the write bit line current circuits WBLD1. The control signal DAT1 indicates that the write data is "1" and in this case, is, for example, at the high level. The control signals DAT0 and DAT1 are complementary.

Figure 49:
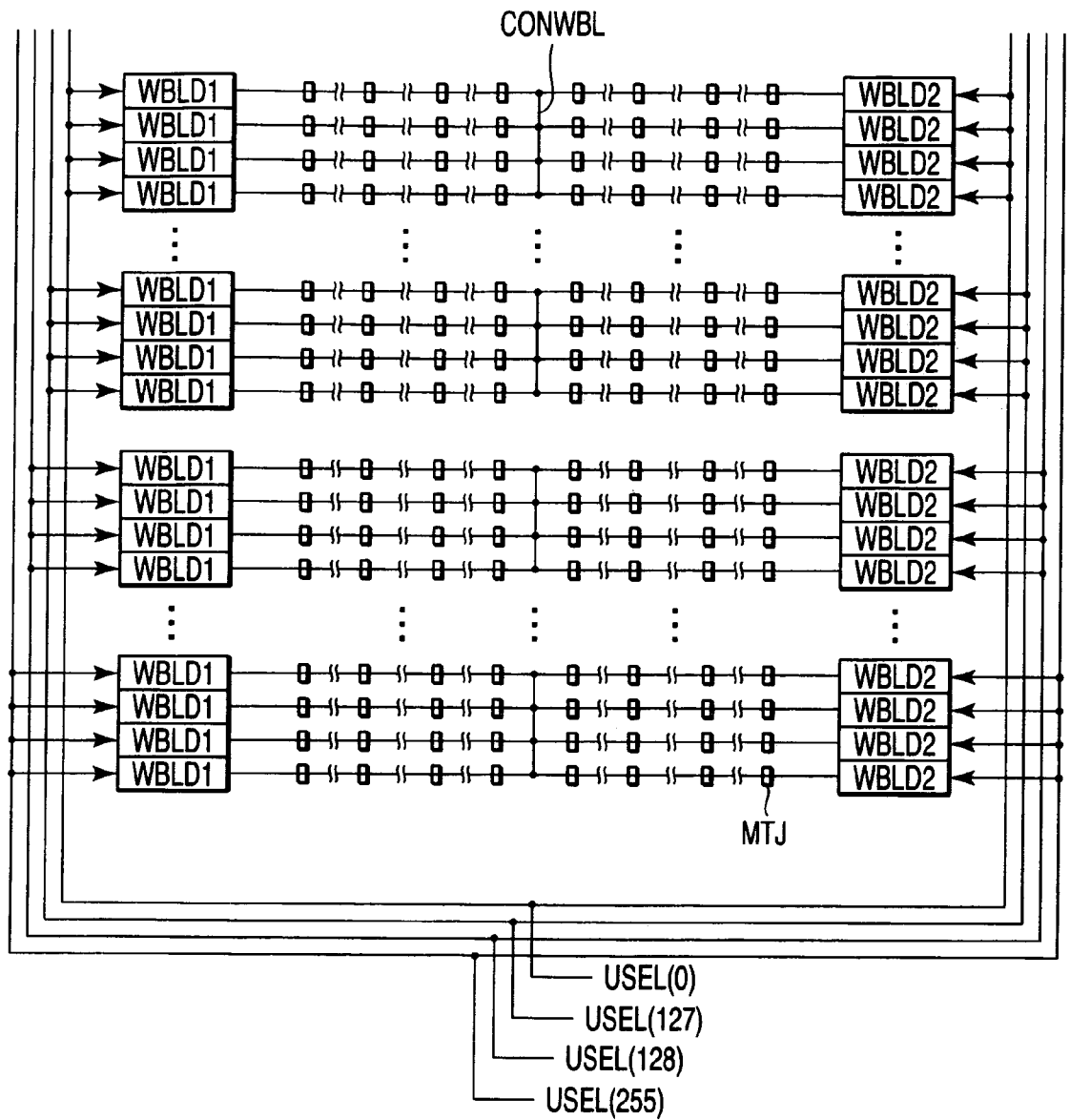

FIG. 49 is a diagram illustrating the address signal USEL (m) in which n is 255. An address signal USEL(0) is supplied to all the write bit line current circuits WBLD1 and WBLD2 connected to the first interconnected unit. Similarly, the address signal USEL(x) is supplied to all the write bit line current circuits WBLD1 and WBLD2 connected to the x+1-th interconnected unit.

Figure 50:
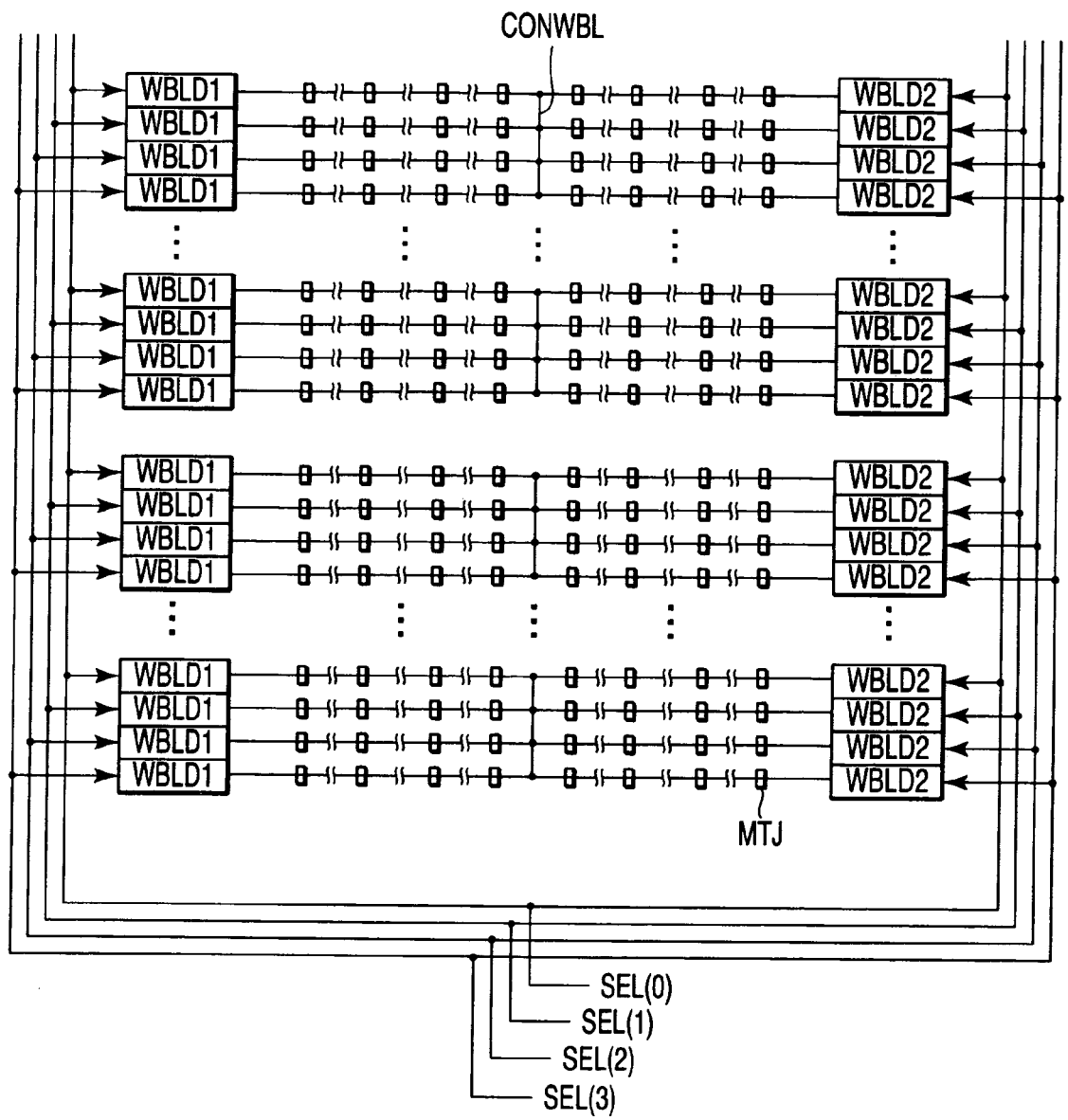

FIG. 50 is a diagram illustrating the address signal SEL (n). The address signal SEL(0) is supplied to the (uppermost) write bit line current circuits WBLD1 and WBLD2 with the smallest row address in each interconnected unit. The address signal SEL(0) indicates that these write bit line current circuits WBLD1 and WBLD2 are to be selected. Similarly, The address signal SEL(y) is supplied to the write bit line current circuits WBLD1 and WBLD2 with the y+1-th smallest row address in each interconnected unit (the y+1-th write bit line current circuits WBLD1 and WBLD2 from the top of the unit). The address signal SEL(y) indicates that these write bit line current circuits WBLD1 and WBLD2 are to be selected.

Figure 51:
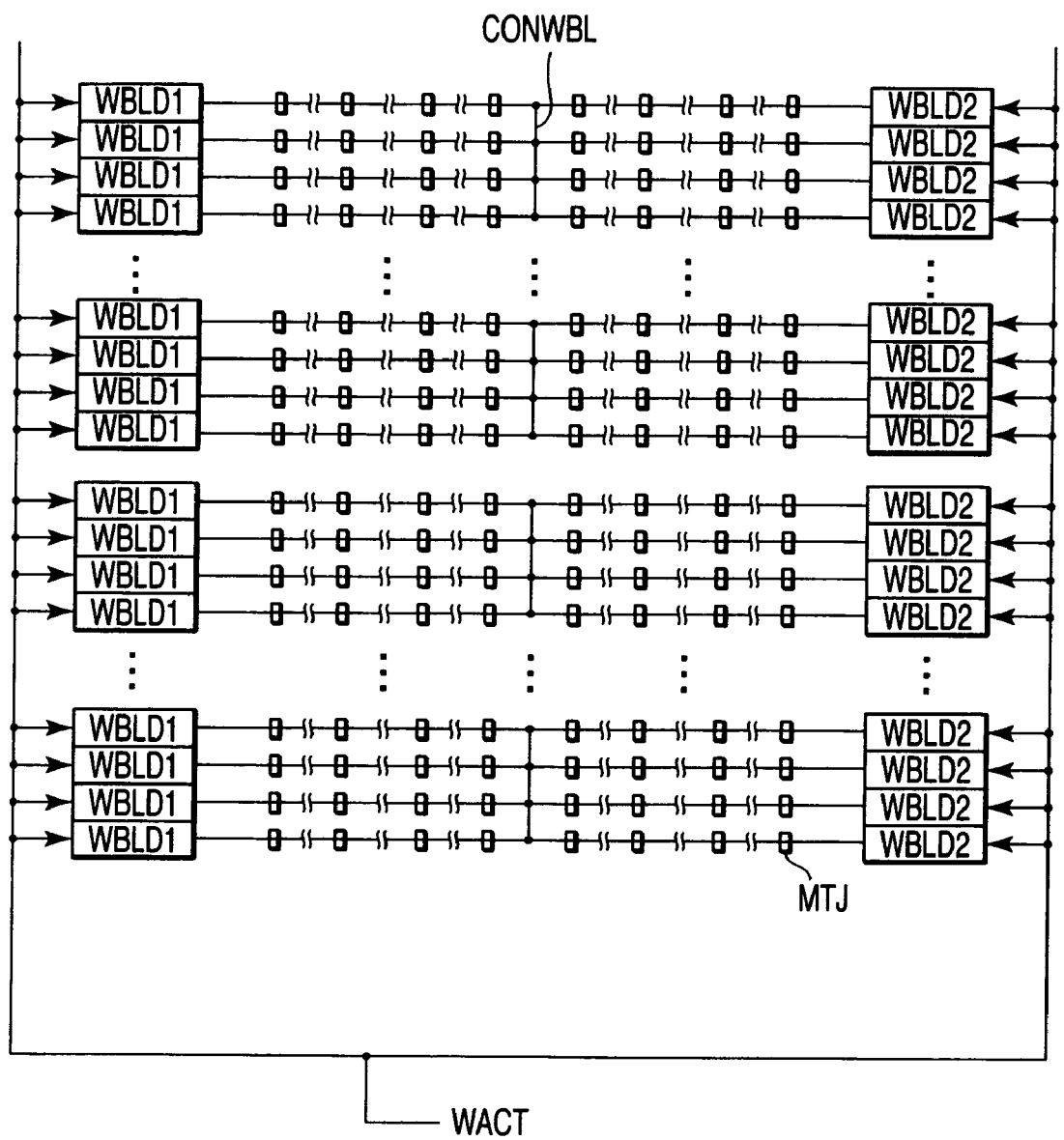

FIG. 51 is a diagram illustrating the signal WACT. The signal WACT is supplied to all the write bit line current circuits WBLD1 and WBLC2. The signal WACT indicates that the write bit line current circuit WBLD1 and WBLD2 are operative or inoperative.

In semiconductor memory device according to the second embodiment of the present invention, the numbers of drivers and sinks included in write bit line current circuits of the configuration of the first embodiment during a write. Specifically, the drivers and sinks connected to the write lines other than the selected ones (selected write bit line WBL and selected write word line WWL) are also activated depending on the direction of the write current. Thus, the write current passing through the selected MTJ elements is dispersed to other write lines. It is thus possible to conduct a write current larger than the one used in the prior art, through the write lines. In other words, a sufficient write current can be provided even if an increase in the length of the write lines results in an increase in the wiring resistance of the write lines.

Further, the total currents from the plurality of write lines flow into the selected write line. Consequently, even with an increase in the length of the write lines, a sufficient write current can be provided without applying a high voltage to the write lines.

Third Embodiment

In a third embodiment, in addition to the control of the second embodiment, control is performed such that no current flows through that part of the write line adjacent to the selected one which is adjacent to the selected MTJ elements.

Figure 12:
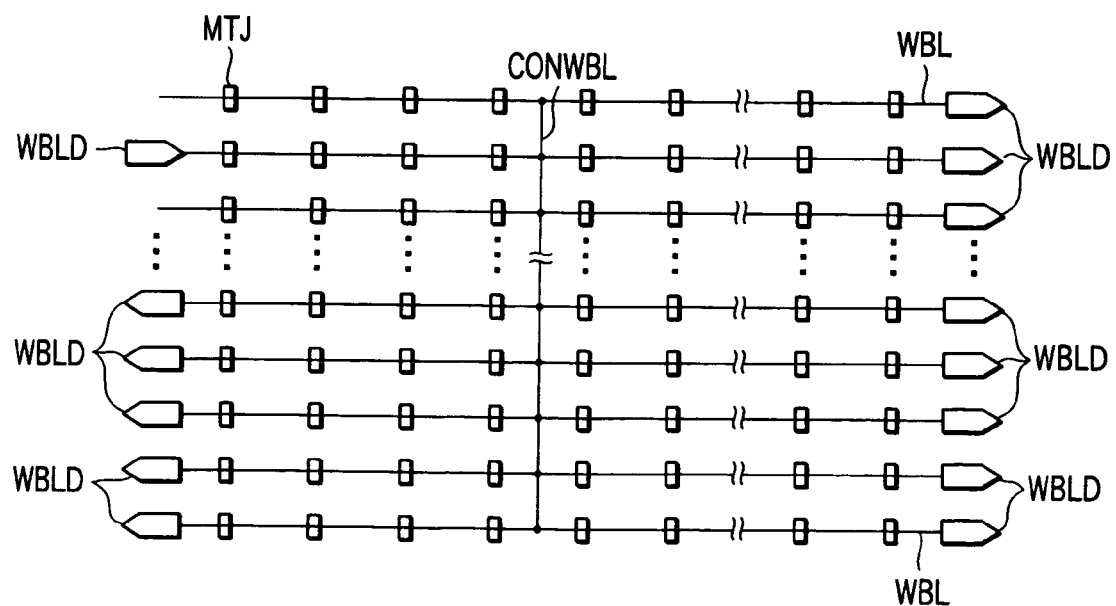
FIGS. 12 and 13 are diagrams each showing a state of a semiconductor memory device according to a third embodiment during a write.
Figure 13:
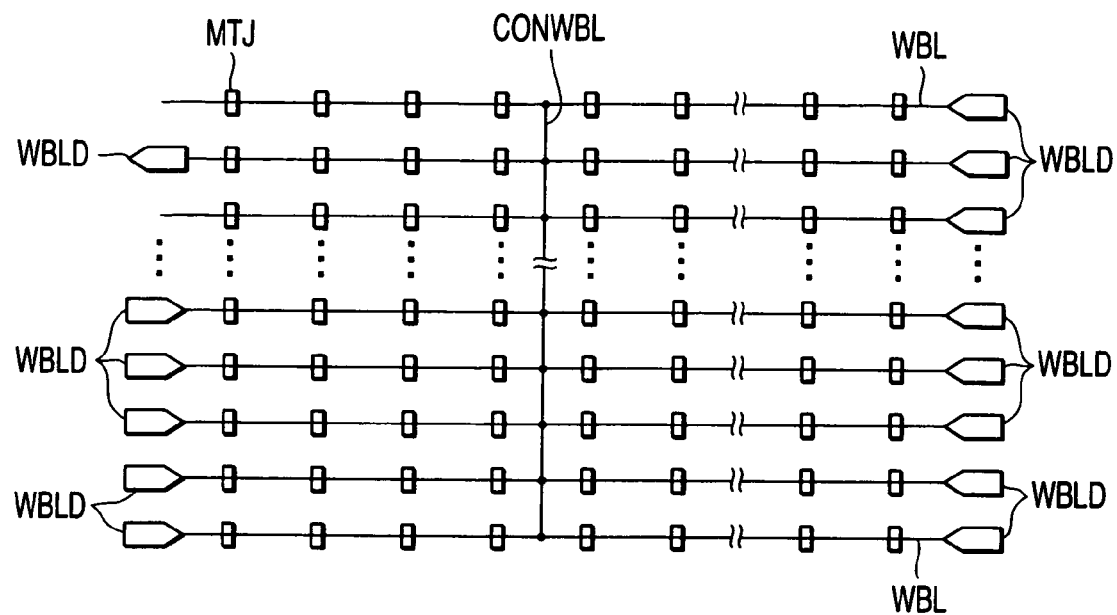

FIGS. 12 and 13 are each a diagram schematically showing a state of essential parts of a semiconductor memory device according to the third embodiment during a write. In FIG. 12, the write current flows rightward in the drawing through the selected write bit line WBL. The selected write bit line is the second one from the top of the drawing. FIG. 12 corresponds to the state of the second embodiment shown in FIG. 8. In FIG. 13, the write current flows through the selected write bit line WBL leftward in the drawing. FIG. 13 corresponds to the state of the second embodiment shown in FIG. 9.

As shown in FIG. 12, in one of the write bit line current circuits WBLD which is connected to the write bit line WBL (adjacent write bit line) adjacent to the selected one WBL and located on the same side of the unit as that on which the selected MTJ elements MTJ are arranged with respect to the connection line CONWBL, neither the driver nor the sink operates. In the other write bit line current circuits WBLD, the sink operates.

Further, as shown in FIG. 13, in one of the write bit line current circuits which is connected to the adjacent write bit line and located on the same side of the unit as that on which the selected MTJ elements MTJ are arranged with respect to the connection line CONWBL, neither the driver nor the sink operates. In the other write bit line current circuits WBLD, the driver operates.

The control in FIGS. 12 and 13 prevents a current from flowing through that part of the adjacent write bit line WBL which is adjacent to the selected MTJ elements.

The semiconductor memory device according to the third embodiment of the present invention is not only configured as the second embodiment but also prevents the current from flowing through the part of the adjacent write bit line (adjacent write bit line WBL and adjacent write word line WWL) which is adjacent to the selected MTJ elements. Thus, the semiconductor memory device not only produces the same effects as those of the second embodiment but can also prevent the application, to the selected MTJ elements, of a magnetic field induced by a current flowing through that part of the adjacent write bit line which is adjacent to the selected MTJ elements. Therefore, miswrites to the MTJ elements can be avoided.

Fourth Embodiment

In a fourth embodiment, the driver or sink at only one end of each of the write lines (unselected write lines) other than the selected one operates depending on the positions of the selected MTJ elements.

Figure 14:
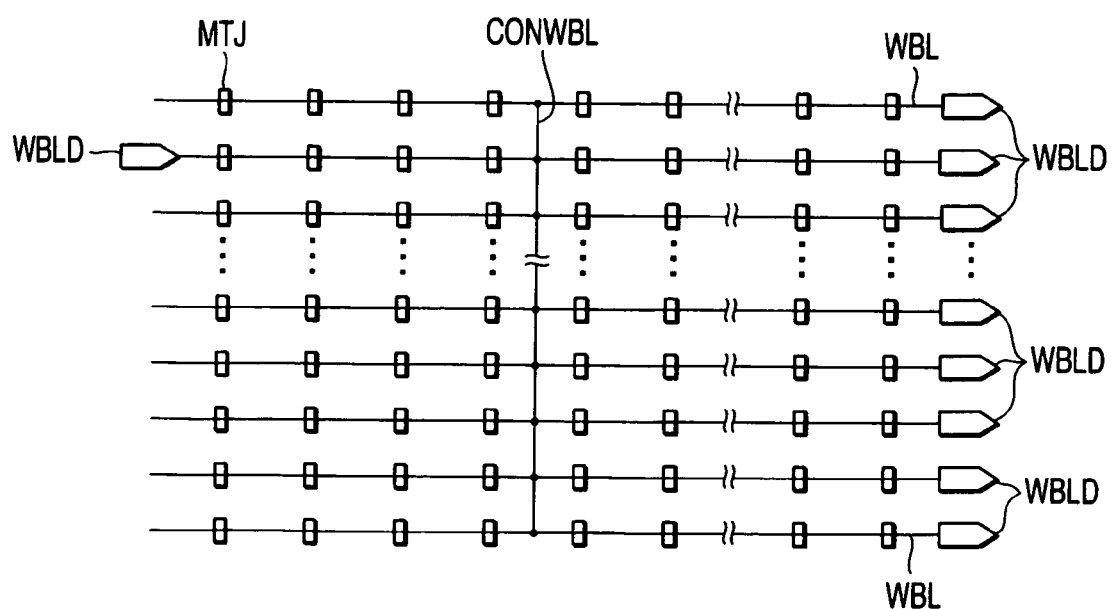
FIGS. 14 and 15 are diagrams each showing a state of a semiconductor memory device according to a fourth embodiment during a write.
Figure 15:
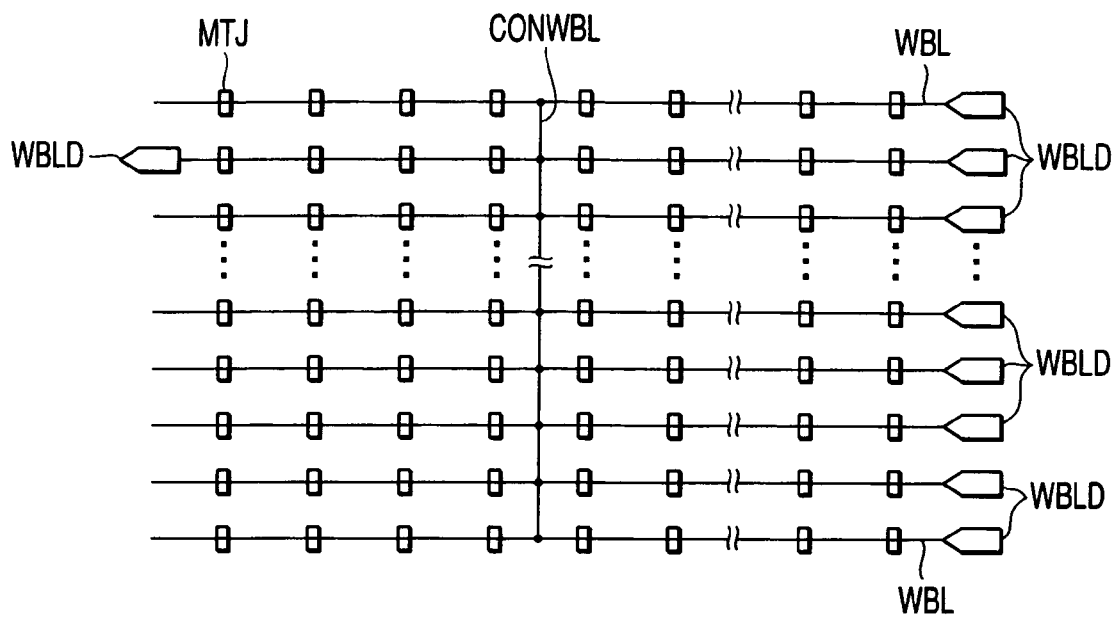

FIGS. 14 and 15 are each a diagram schematically showing a state of essential parts of a semiconductor memory device according to the fourth embodiment during a write. In FIG. 14, the write current flows rightward in the drawing through the selected write bit line WBL. The selected write bit line WBL is the second one from the top of the drawing. FIG. 14 corresponds to the state of the second embodiment shown in FIG. 8. In FIG. 15, the write current flows through the selected write bit line WBL leftward in the drawing. FIG. 15 corresponds to the state of the second embodiment shown in FIG. 9.

As shown in FIG. 14, none of the drivers and sinks located to the left of the connection line CONWBL operate except that connected to the selected write bit line WBL. Only the driver connected to the selected write bit line WBL operates. All the sinks located to the right of the connection line CONWBL operate.

Further, as shown in FIG. 15, none of the drivers and sinks located to the left of the connection line CONWBL operate except that connected to the selected write bit line WBL. The sink connected to the selected write bit line WBL is activated. All the drivers located to the right of the connection line CONWBL operate.

During a write, the write current flows through the selected write word line WWL. Accordingly, a magnetic field induced by the write current is also applied to the unselected MTJ elements MTJ belonging to the same columns as those of the selected MTJ elements MTJ. In this state, when the current flows through those parts of the write bit lines WBL (unselected write bit lines WBL) other than the selected one WBL which pass through the unselected MTJ elements MTJ to which the magnetic field from the selected write bit line WBL is applied, miswrites may be executed on the unselected MTJ elements MTJ. Thus, in the semiconductor memory device according to the fourth embodiment of the present invention, the drivers and sinks located on the same side of the unit as that on which selected MTJ elements MTJ are arranged with respect to the connection line CONWBL do not operate except that connected to the selected write bit line WBL. This avoids applying a magnetic field from the write bit line WBL to the unselected MTJ elements MTJ located on the same side of the unit as that on which the selected MTJ elements MTJ are arranged, the selected write word line WWL passing through the unselected MTJ elements MTJ. Therefore, it is possible to sharply reduce the possibility of miswrites on the unselected MTJ elements MTJ.

The write bit line WBL has been described in conjunction with the example of the first embodiment shown in FIG. 2. However, the examples shown in FIGS. 4 and 5 can be similarly controlled.

Fifth Embodiment

A fifth embodiment relates to a semiconductor memory device employing what is called a toggle write scheme (toggle MRAM). The toggle MRAM is described in U.S. Pat. No. 6,545,906B1 (Savtchenco et al.). The easy axis of magnetization of the MTJ elements MTJ in the toggle MRAM extends along a direction inclined at an angle of 45° to the write bit lines and write word lines in a plane consisting of write bit lines and write word lines. The toggle MRAM differs from a conventional semiconductor memory device in the structure of the MTJ elements and a timing for conducting the write current.

Figure 16:
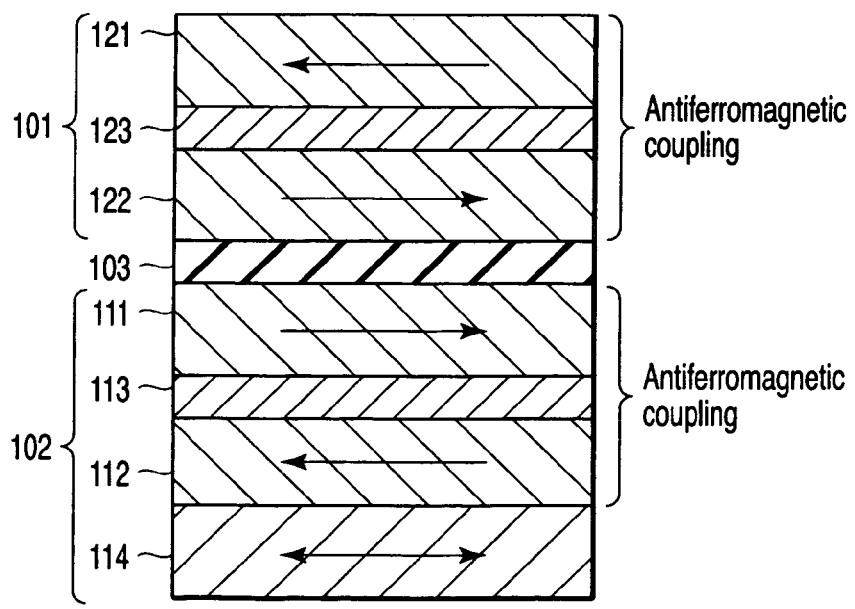
FIGS. 16 and 17 are diagrams each showing a state of an MTJ element used in a toggle MRAM.

First, description will be given of the semiconductor memory device employing the toggle write scheme. FIG. 16 is a sectional view schematically showing the structure of an MTJ element MTJ used in a toggle MRAM. In FIG. 16, the direction of magnetizations in a free layer and a pin layer are parallel (parallel state). As shown in FIG. 16, an insulating tunneling barrier layer 103 is sandwiched between a free layer 101 and a pin layer 102. The pin layer 102 has two ferromagnetic layers 111 and 112 consisting of ferromagnetic metal, a paramagnetic layer 113 sandwiched between the ferromagnetic layers 111 and 112 and consisting of paramagnetic metal, and an antiferromagnetic layer 114 consisting of antiferromagnetic metal. The structure consisting of the ferromagnetic layers 111 and 112 and the paramagnetic layer 113 is provided on the antiferromagnetic layer 114. The two ferromagnetic layers 111 and 112 are coupled in an antiferromagnetic manner.

The free layer 101 has two ferromagnetic layers 121 and 122 consisting of ferromagnetic metal and a paramagnetic layer 123 sandwiched between these ferromagnetic layers and consisting of paramagnetic metal. The two ferromagnetic layers 121 and 122 are coupled in an antiferromagnetic manner. In the parallel state, the direction of magnetizations of the two ferromagnetic layers 111 and 122, sandwiching the tunneling barrier layer 103 between them, are parallel.

Figure 17:
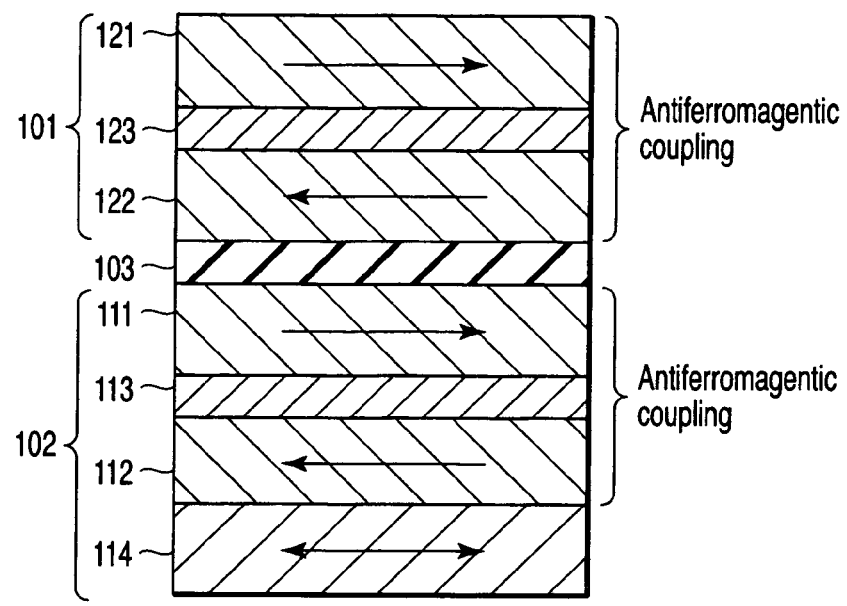

On the other hand, if the MTJ element MTJ is in an antiparallel state, the direction of magnetizations of the two ferromagnetic layers 111 and 122, sandwiching the tunneling barrier layer 103 between them, are antiparallel as shown in FIG. 17.

Now, a brief description will be given of a write method based on the toggle write scheme. If the toggle write scheme is employed, data is read from an MTJ element MTJ on which a write is to be executed. If the data read is the same as write data, no write is executed. A write is executed only when the data read is different from the write data.

With the toggle write scheme, a write changes the state of the MTJ element MTJ regardless of the state of the MTJ element MTJ prior to the write. For example, if the MTJ element MTJ is in an antiparallel state, a write brings the MTJ element MTJ into a parallel state. If the MTJ element MTJ is in the parallel state, a write brings the MTJ element MTJ into the antiparallel state.

Figure 18:
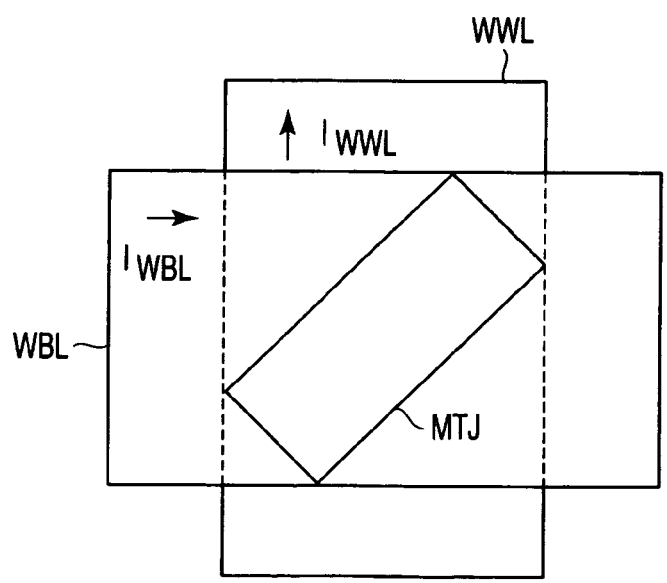
FIG. 18 is a diagram showing the direction of a current flowing through a write line.
Figure 19:
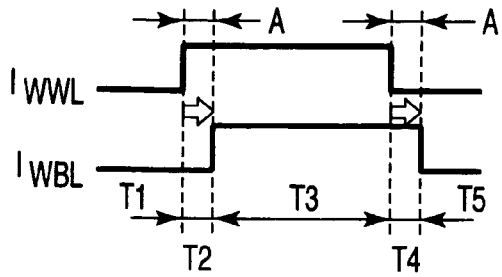
FIG. 19 is a diagram showing a timing for supplying a write current.

As shown in FIG. 18, IWWL is conducted through the write word line WWL and IWBL is conducted through the write bit line WBL to reverse the state of the MTJ element MTJ. Timings for providing the write currents IWWL and IWBL are as shown in FIG. 19. As shown in FIG. 19, there is a specific delay A between a timing for providing the write current IWWL and a timing for providing the write current IWBL.

Now, description will be given of the state of the MTJ element MTJ during periods T1 to T5 shown in the waveform diagram in FIG. 19. During a write operation described below, the direction of magnetization in the ferromagnetic layer of the pin layer remains unchanged.

Period T1 (Initial State)

Figure 20:
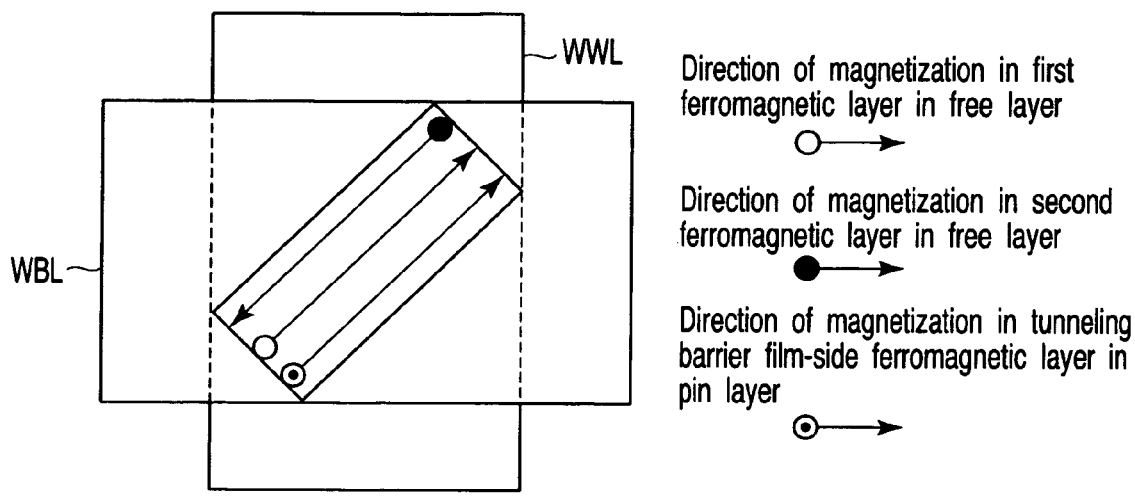
FIGS. 20, 21, 22, 23, and 24 are diagrams each showing a state of an MTJ element during a write.

As shown in FIG. 20, the MTJ element MTJ is in the parallel state or antiparallel state depending on the directions of magnetizations in the two ferromagnetic layers located opposite each other across the tunneling barrier layer. Specifically, in FIGS. 20 to 24, each of the first ferromagnetic layer and the second ferromagnetic layer of the free layer corresponds to one of the ferromagnetic layers 122 and 111 in FIGS. 16 and 17.

If the direction of magnetization of the ferromagnetic layer 122 in FIGS. 16 and 17 corresponds to that of the first ferromagnetic layer in FIG. 20, the MTJ element MTJ is initially in the parallel state. On the other hand, if the direction of magnetization of the ferromagnetic layer 122 in FIGS. 16 and 17 corresponds to that of the second ferromagnetic layer in FIG. 20, the MTJ element MTJ is initially in the antiparallel state. The direction of magnetizations in the first and second ferromagnetic layers of the free layer are opposite to each other. Accordingly, a synthetic magnetization of the free layer is almost zero.

Period 2 (Supply of IWWL)

Figure 21:
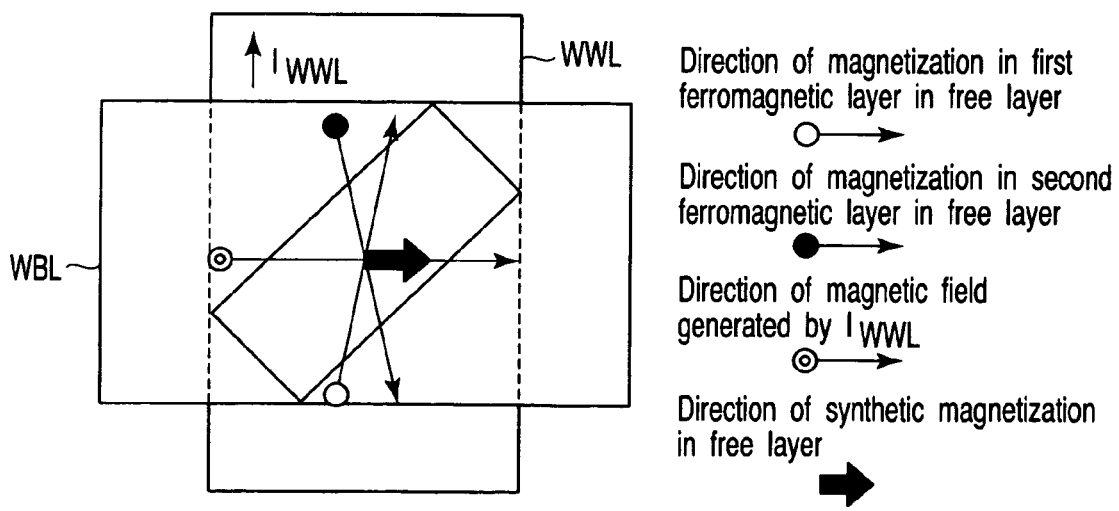

As shown in FIG. 21, the write current IWWL through the write word line WWL induces a magnetic field. As s result, the direction of magnetizations in the first and second ferromagnetic layers of the free layer follow the direction of the magnetic field induced by the write current IWWL. Therefore, a synthetic direction of magnetization appears of the free layer.

Here, the direction of magnetizations in the two ferromagnetic layers are prevented from following the direction of the magnetic field induced by the write current IWWL, by adjustably designing the antiferromagnetic coupling of the two ferromagnetic layers of the free layer. The direction of magnetizations in the two ferromagnetic layers of the free layer spin clockwise while maintaining the antiferromagnetic coupling. The magnetizations follow the magnetic field induced by the write current IWWL. Then, once the synthetic direction of magnetization of the free layer coincides with the direction of the magnetic field induced by the write current IWWL, the rotations of the direction of magnetizations of the two ferromagnetic layers of the free layer stops. In other words, the rotations make the synthetic direction of magnetization of the free layer parallel to the write bit line WBL.

Period T3 (Supply of IWWL and IWBL)

Figure 22:
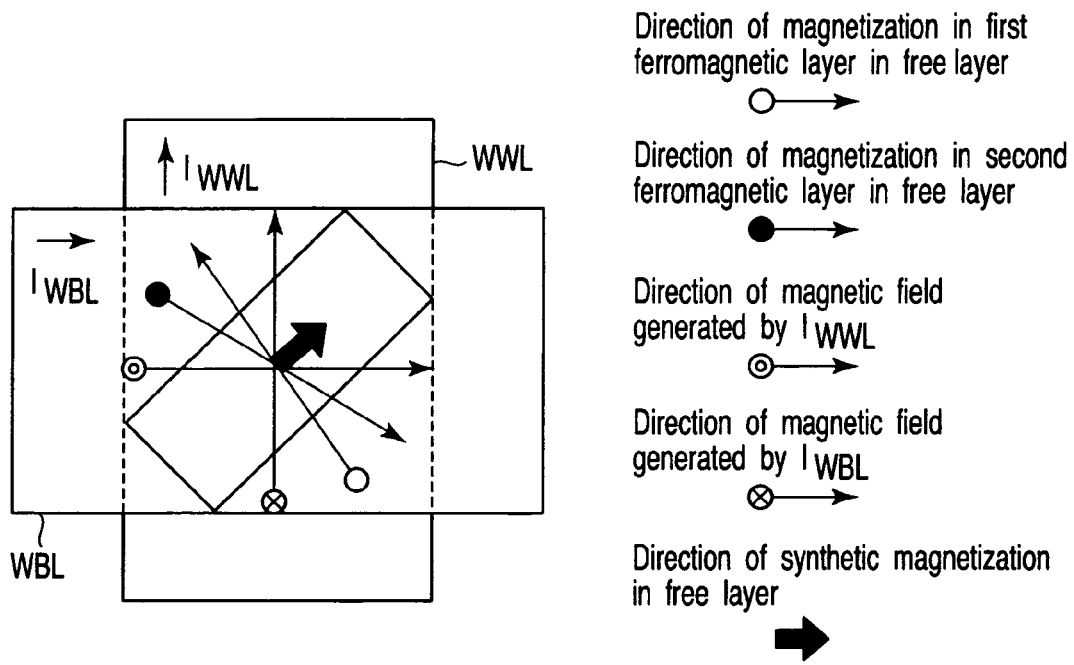

Then, as shown in FIG. 22, the write current IWBL flowing through the write bit line WBL with the write current IWWL passing through the write word line WWL induces a synthetic magnetic field. As a result, while maintaining the antiferromagnetic coupling, the direction of magnetizations in the two ferromagnetic layers of the free layer rotate until the synthetic direction of magnetization of the free layer coincides with the direction of the synthetic magnetic field induced by the write currents IWWL and IWBL. In other words, the rotations make the synthetic direction of magnetization of the free layer equal to the direction of the easy axis of magnetization of the MTJ element MTJ.

Period T4 (Supply of IWBL)

Figure 23:
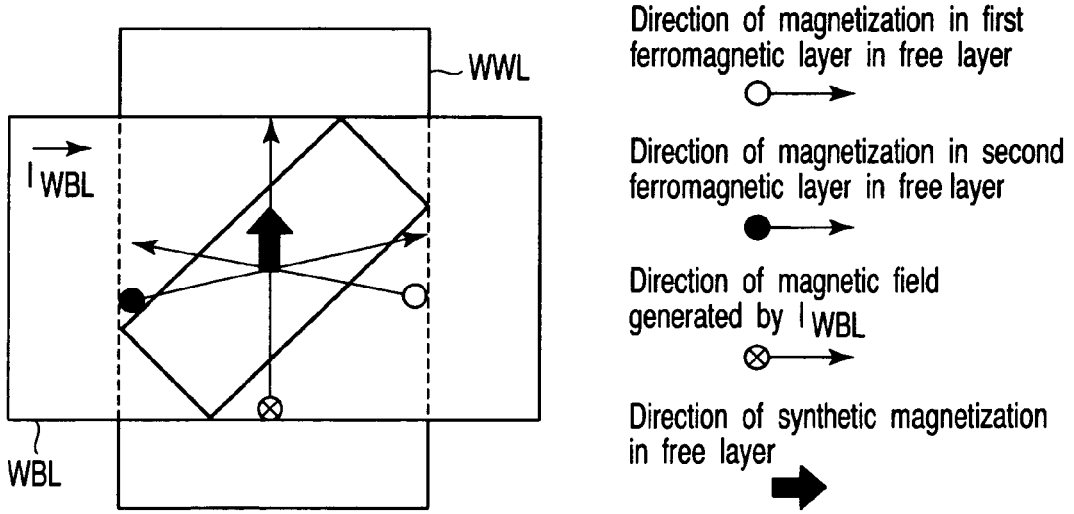

Then, as shown in FIG. 23, the write current IWWL conducted through the write bit line WBL is blocked. Then, a magnetic field is induced only by the write current IWBL flowing through the write bit line WBL. As a result, while maintaining the antiferromagnetic coupling, the direction of magnetizations of the two ferromagnetic layers of the free layer rotate until the synthetic direction of magnetization of the free layer coincides with the direction of the synthetic magnetic field induced by the write current IWBL. In other words, the rotations make the synthetic direction of magnetization of the free layer parallel to the write word line WWL.

Period T5 (Completion of the Write)

Figure 24:
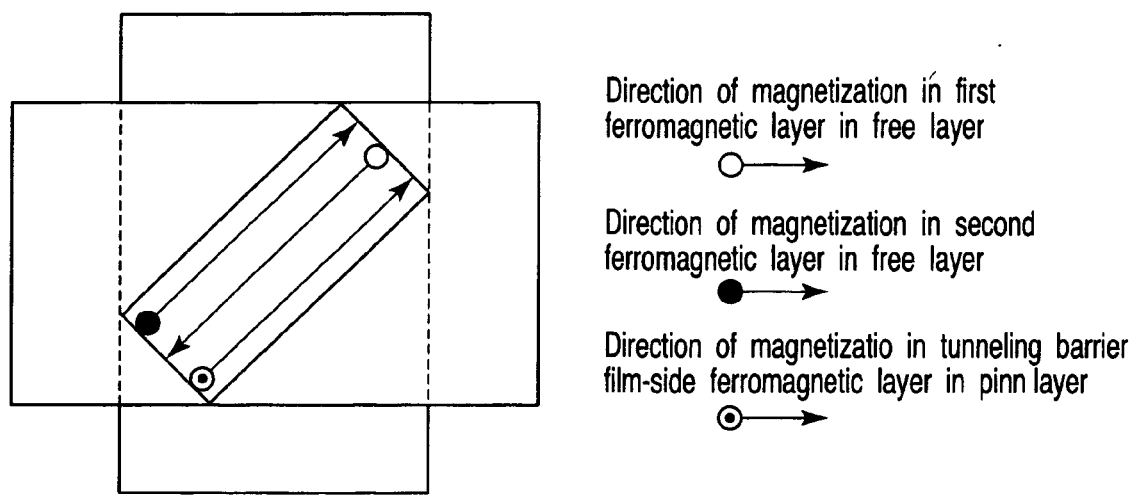

Then, as shown in FIG. 24, the write current IWBL conducted through the write bit line WBL is blocked. Then, while maintaining the antiferromagnetic coupling, the direction of magnetizations of the two ferromagnetic layers of the free layer rotate until they coincide with the direction of the easy axis of magnetization of the MTJ element MTJ.

The directions of magnetizations of the two ferromagnetic layers of the free layer have already rotated from the initial state at the period T4. Accordingly, energy is more stabilized when the directions of magnetizations are reversed than going back to the initial state. Therefore the directions of magnetizations keep rotating to be reversed even after the write current is blocked.

In the present example, as shown in FIG. 19, a current starts to be conducted through the write word line WWL the specific delay time A earlier than through the write bit line WBL. However, the opposite setting is possible, that is, a current may start to be conducted through the write bit line WBL the specific delay time A earlier than through the write word line WWL. In this case, the direction in which the direction of magnetizations rotate differ from that in the above example. However, as in the case of the above example, the direction of magnetizations of the two ferromagnetic layers of the free layer rotate so that the synthetic direction of magnetization of the free layer coincides with the direction of the magnetic field induced by the write word line WWL and write bit line WBL.

Figure 25:
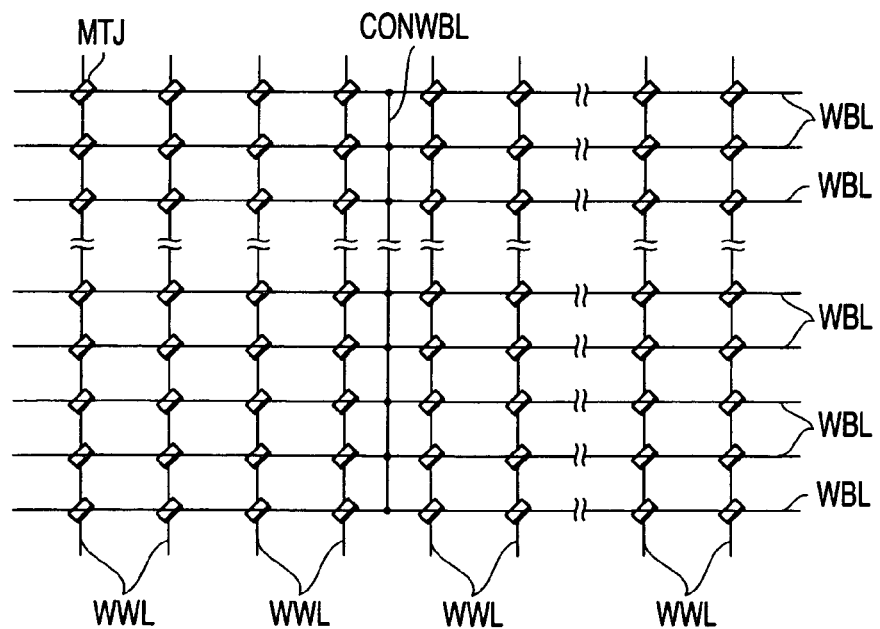
FIG. 25 is a diagram showing essential parts of a semiconductor memory device according to a fifth embodiment.

Now, description will be given of a fifth embodiment relating to a semiconductor memory device employing the toggle write scheme. FIG. 25 is a diagram schematically showing essential parts of the semiconductor memory device according to the fifth embodiment. As shown in FIG. 25, the easy axis of magnetization of the MTJ elements MTJ extends along a direction inclined at an angle of 45° to the write bit lines and write word lines. Further, the MTJ element MTJ according to the present embodiment has a configuration suitable for the toggle write scheme, for example, as shown in FIG. 17. FIG. 25 shows an example in which the connection line CONWBL electrically connects the write bit lines WBL. FIG. 25 corresponds to FIG. 2, showing the first embodiment. The remaining part of the configuration of the present embodiment is the same as that in FIG. 2, showing the first embodiment.

Figure 26:
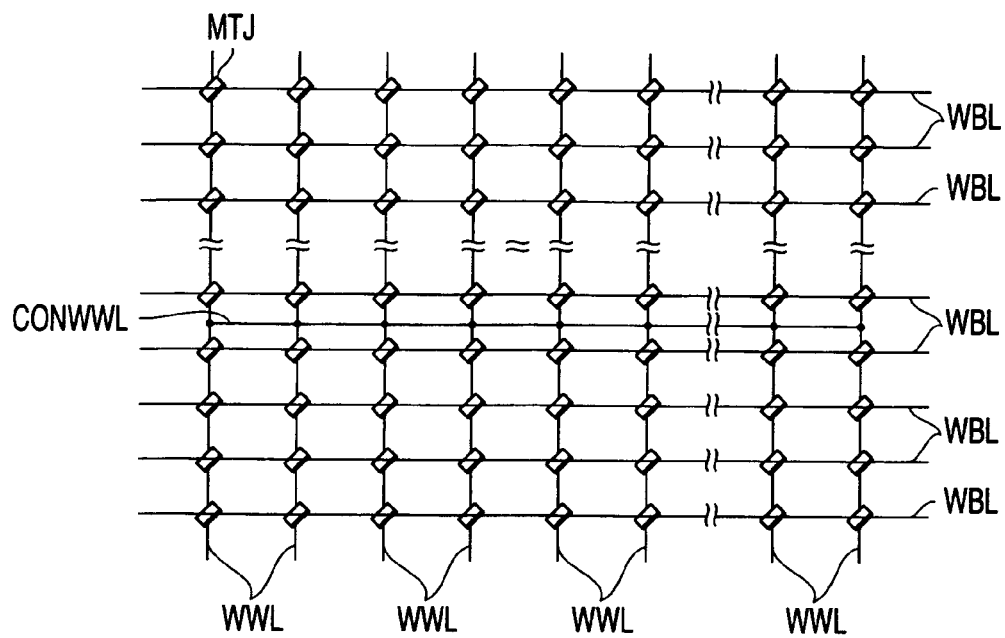
FIGS. 26 and 27 are diagrams each showing essential parts of a semiconductor memory device according to another example of the fifth embodiment.

Further, as shown in FIG. 26, the connection line CONWWL may electrically connect the write word lines WWL. FIG. 26 corresponds to FIG. 4, showing the first embodiment, and is the same as FIG. 4 except for the configuration of the MTJ element MTJ and the direction of the easy axis of magnetization.

Figure 27:
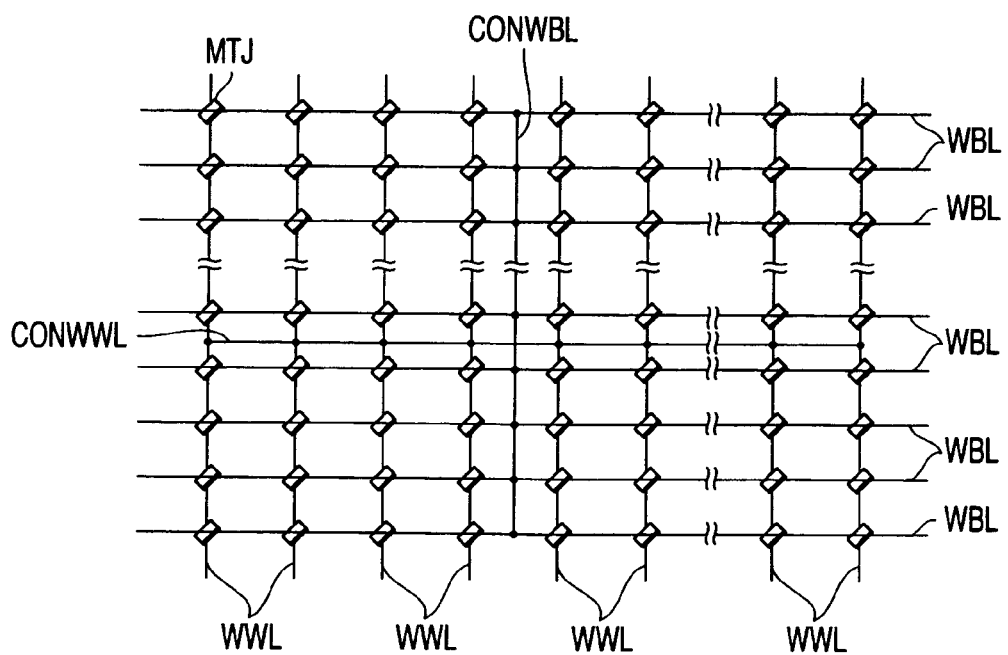

Moreover, as shown in FIG. 27, both connection lines CONWBL and CONWWL may be provided. FIG. 27 corresponds to FIG. 5, showing the first embodiment, and is the same as FIG. 5 except for the configuration of the MTJ element MTJ and the direction of the easy axis of magnetization.

In the semiconductor memory device according to the fifth embodiment, the write lines are electrically connected together by the connection line regardless of the direction of the easy axis of magnetization of the MTJ elements MTJ. Therefore, the fifth embodiment has the same advantages as those of the first embodiment.

Sixth Embodiment

Figure 28:
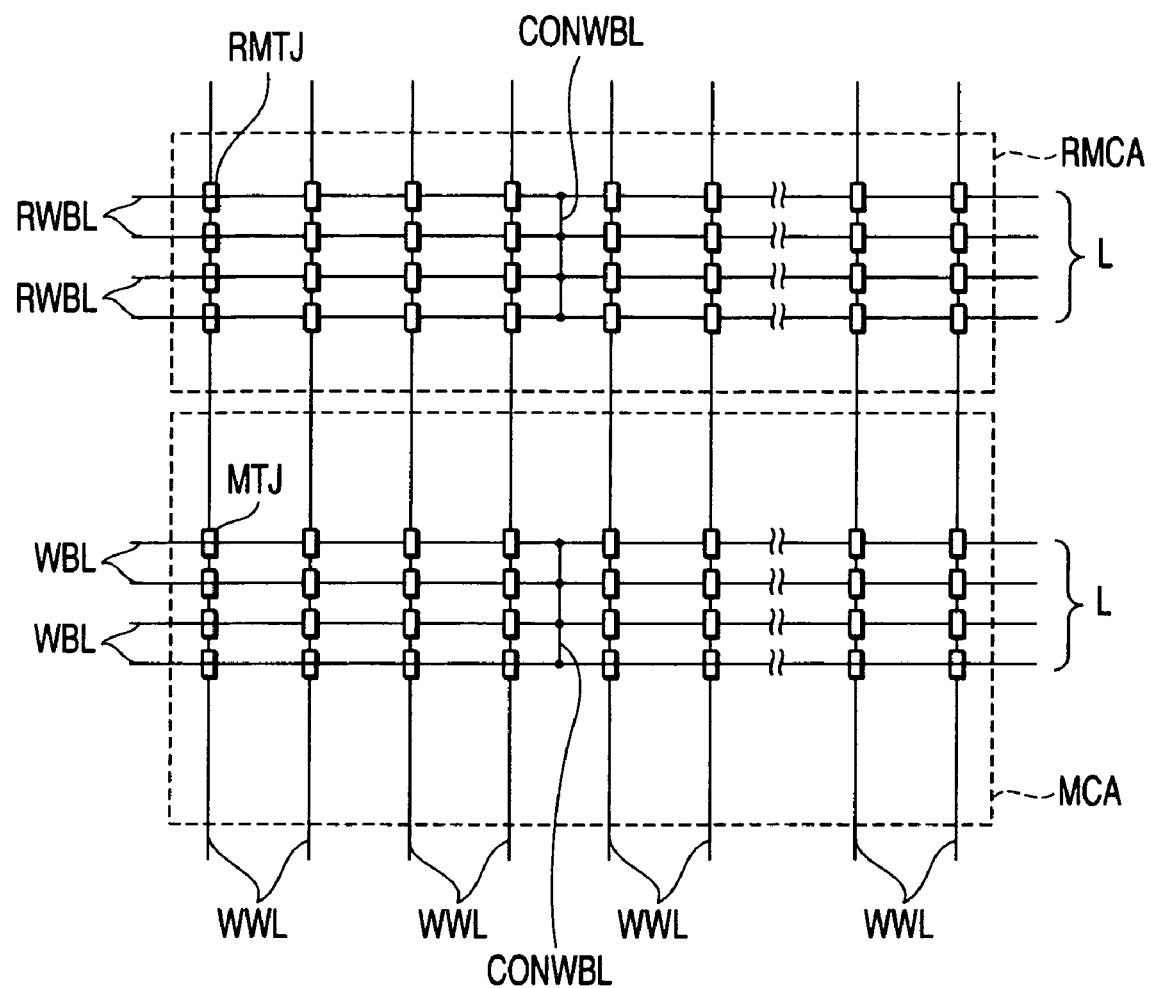
FIG. 28 is a diagram showing essential parts of a semiconductor memory device according to a sixth embodiment.

A sixth embodiment relates to the case in which a redundancy circuit is provided. FIG. 28 is a diagram schematically showing essential parts of the semiconductor memory device according to the sixth embodiment. As shown in FIG. 28, the semiconductor memory device has a memory cell array MCA configured in the same manner as in the first embodiment and a redundant memory cell array RMCA (for replacement). For example, for operation tests on the semiconductor memory device, an internal circuit is programmed using a program wiring section composed of a plurality of fuses or the like. The internal circuit allows switching to redundant MTJ elements MTJ in the redundant memory cell array MCA even if the address of a defective MTJ element MTJ or of a line containing such an MTJ element MTJ is input during actual use.

The configuration of the redundant memory cell array is similar to that of the memory cell array MCA. That is, redundant MTJ elements RMTJ are arranged in a matrix. Write bit lines RWBL and write word lines WWL for replacement cross so that the MTJ elements RMTJ constitute intersections. A connection line CONRWBL electrically connects the write bit lines RWBL. In this case, the number of write bit lines RWBL connected together by the connection line CONRWBL is set equal to that L of write bit lines WBL connected together by the connection line CONWBL in the memory cell array MCA.

When a defective MTJ element MTJ is to be replaced, the bit lines WBL connected together by one connection line CONWBL and the MTJ elements MTJ through which the bit lines WBL pass are used as a unit to replace the defective MTJ element MTJ with a write bit line RWBL and a redundant MTJ element RMTJ. Thus, even with the MTJ element MTJ is replaced with the redundant MTJ element RMTJ, the semiconductor memory device can be operated as in the case where replacement is not carried out. It is also possible to obtain the same advantages as those of the connection line in the memory cell array MCA.

Figure 29:
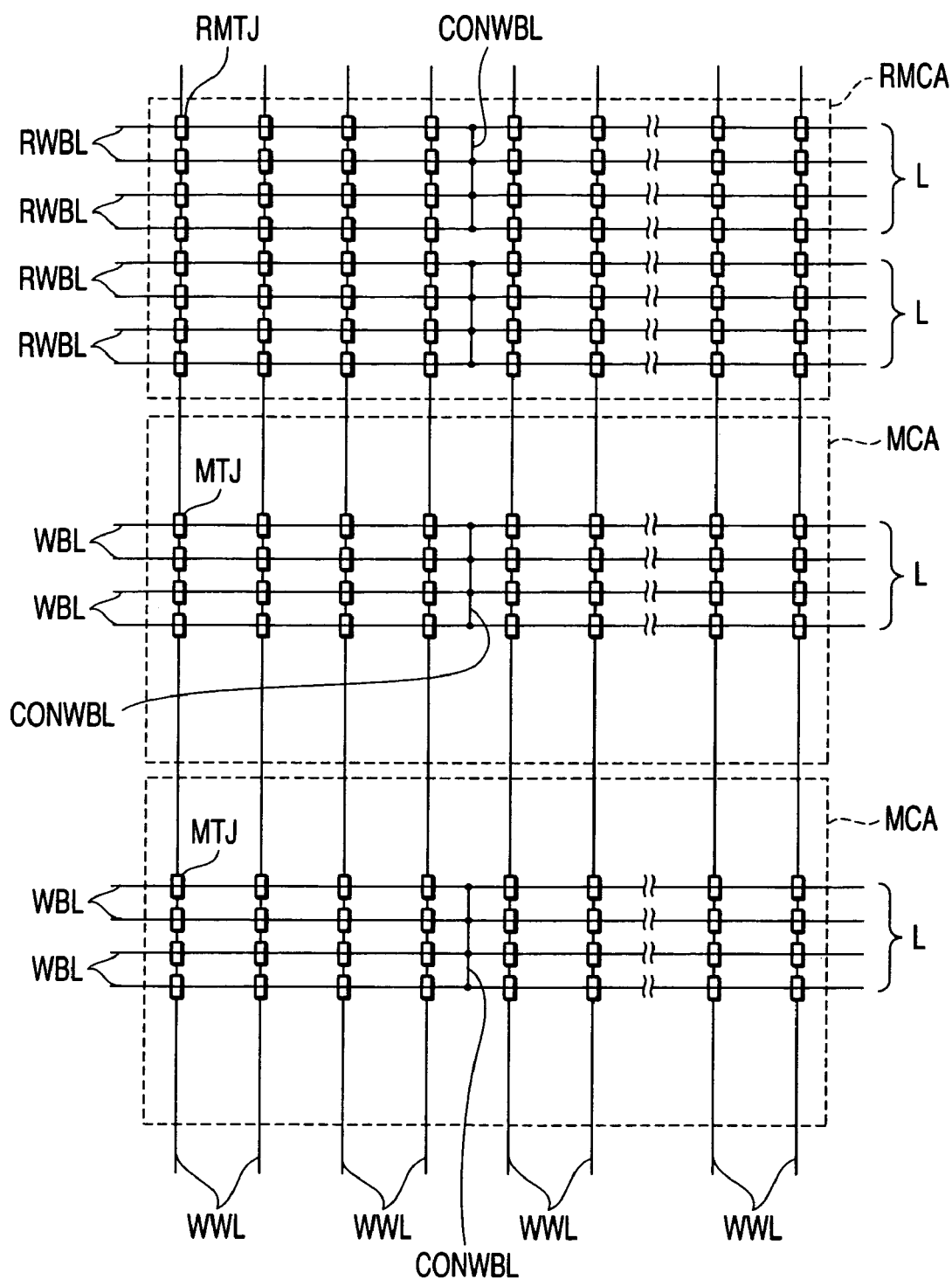
FIGS. 29 and 30 are diagrams each showing essential parts of a semiconductor memory device according to another example of the sixth embodiment.

In the example in the above description, one redundant memory cell array RMCA is provided for one memory cell array MCA. However, the present invention is not limited to this. For example, as shown in FIG. 29, each of a plurality of units in one redundant memory cell array RMCA may be replaced with a plurality of memory cell arrays MCA.

Figure 30:
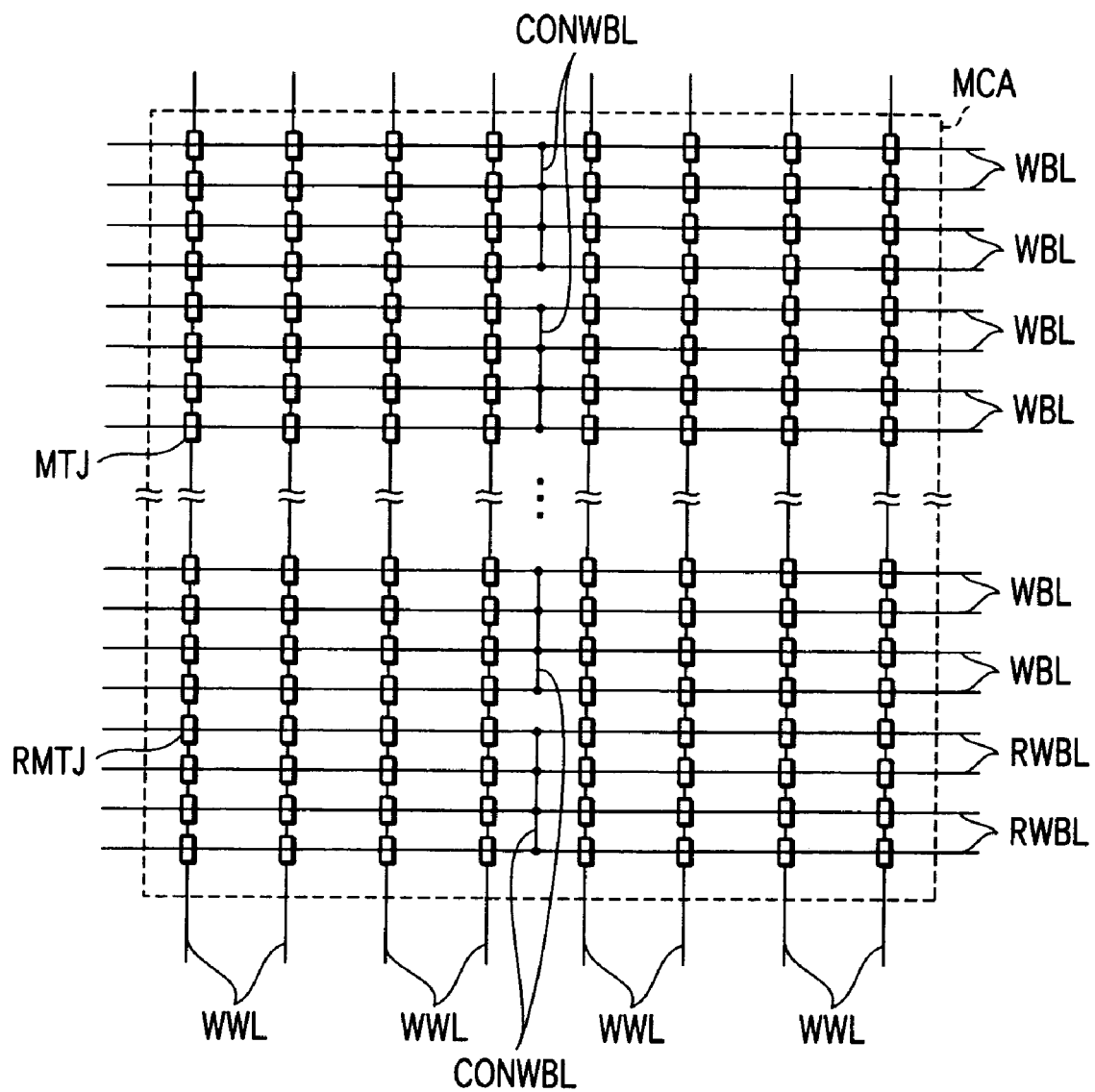

Further, in the example in the above description, the redundant memory cell array RMCA is provided in addition to the memory cell array MCA. However, a redundant memory cell portion may be provided in one memory cell array so that a defective memory cell can be replaced within the same memory array, for example, as shown in FIG. 30.

Moreover, fewer number of the write lines in one redundancy-replacement unit than that of the write lines connected together improves redundancy-based replacement efficiency.

In the semiconductor memory device according to the sixth embodiment of the present invention, a connection line electrically connects write lines in the memory cell array MCA, as in the case of the first embodiment. Thus, the same advantages as those of the first embodiment are gained.

Further, according to the sixth embodiment, the connection line CONRWBL electrically connects the write bit lines RWBL in the memory cell array RMCA. The number of write bit lines RWBL connected together is the same as that of write bit lines WBL connected together in the memory cell array MCA. Thus, even if a defective site is replaced, the advantages of the connection line are not impaired.

Seventh Embodiment

A seventh embodiment relates to a semiconductor memory device employing what is called resistance-divided memory cell. The resistance-divided cell is described in Jpn. Pat. Appln. KOKAI Publication 2004-220759 and U.S. Pat. No. 6,914,808. In a conventional semiconductor memory device, one memory cell has one MTJ element, and data is read using a current signal obtained by applying a specified voltage to the MTJ element or a voltage signal generated across the MTJ element by supplying a specified current to the MTJ element. In contrast, for the resistance-divided cell, one memory cell has two MTJ elements holding complementary data. Data is identified on the basis of the ratio of the resistance of one of the MTJ elements to that of the other MTJ element.

Figure 31:
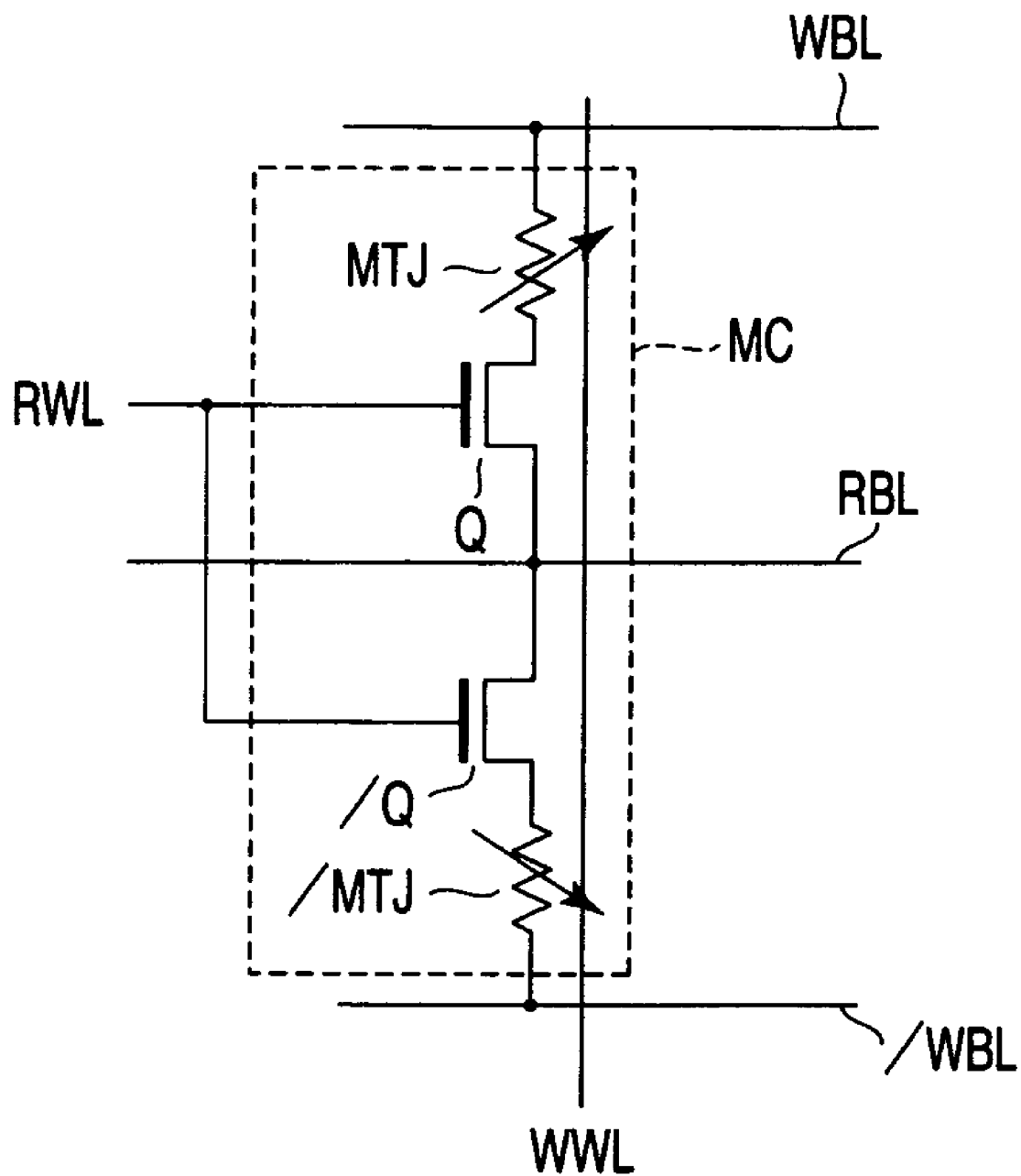
FIG. 31 is a diagram showing a resistance-divided type memory cell.

First, a brief description will be given of a semiconductor memory device employing a resistance-divided cell. FIG. 31 shows a resistance-divided cell. As shown in FIG. 31, one memory cell has two MTJ elements MTJ and /MTJ connected in series. Each of the MTJ elements has one end connected to a write bit line WBL or /WBL, respectively. On the other hand, the other ends of the MTJ elements are connected together via selection transistors Q and /Q. This connection node constitutes a read bit line RBL. A read word line RWL is connected to gates of the selection transistors Q and /Q.

Complementary data are stored in the MTJ elements MTJ and /MTJ. For example, when the MTJ element MTJ="1" data and MTJ element /MTJ="0", the memory cell stores "1". On the other hand, when the MTJ element MTJ="0" data and MTJ element /MTJ="1", the memory cell stores "0".

A write is executed by appropriately controlling the directions of currents through the write word lines WWL and write bit line WBL and /WBL so that the data in the MTJ elements MTJ and /MTJ are opposite to each other.

A read is executed by defining the resistances of the MTJ elements MTJ and /MTJ as R1 and R2, respectively, and reading a potential V·R2/(R1+R2) generated in the read bit line RBL as a result of the application of a voltage V between the write bit lines WBL and /WBL. This potential is compared with a reference potential to determine the data held by the memory cell. Naturally enough, the resistances R1 and R2 is high of low depending on the data held in the MTJ elements MTJ and /MTJ.

Thus, the value for a read signal is not dependent on the absolute resistance of the MTJ element MTJ but is determined by the ratio of the resistance of one MTJ element to the resistance of another MTJ element. Accordingly, even if the resistance of the MTJ element varies owing to a variation in manufacturing process or the like, the absolute value of a read signal voltage does not vary. Therefore, a fixed read margin is ensured.

Figure 32:
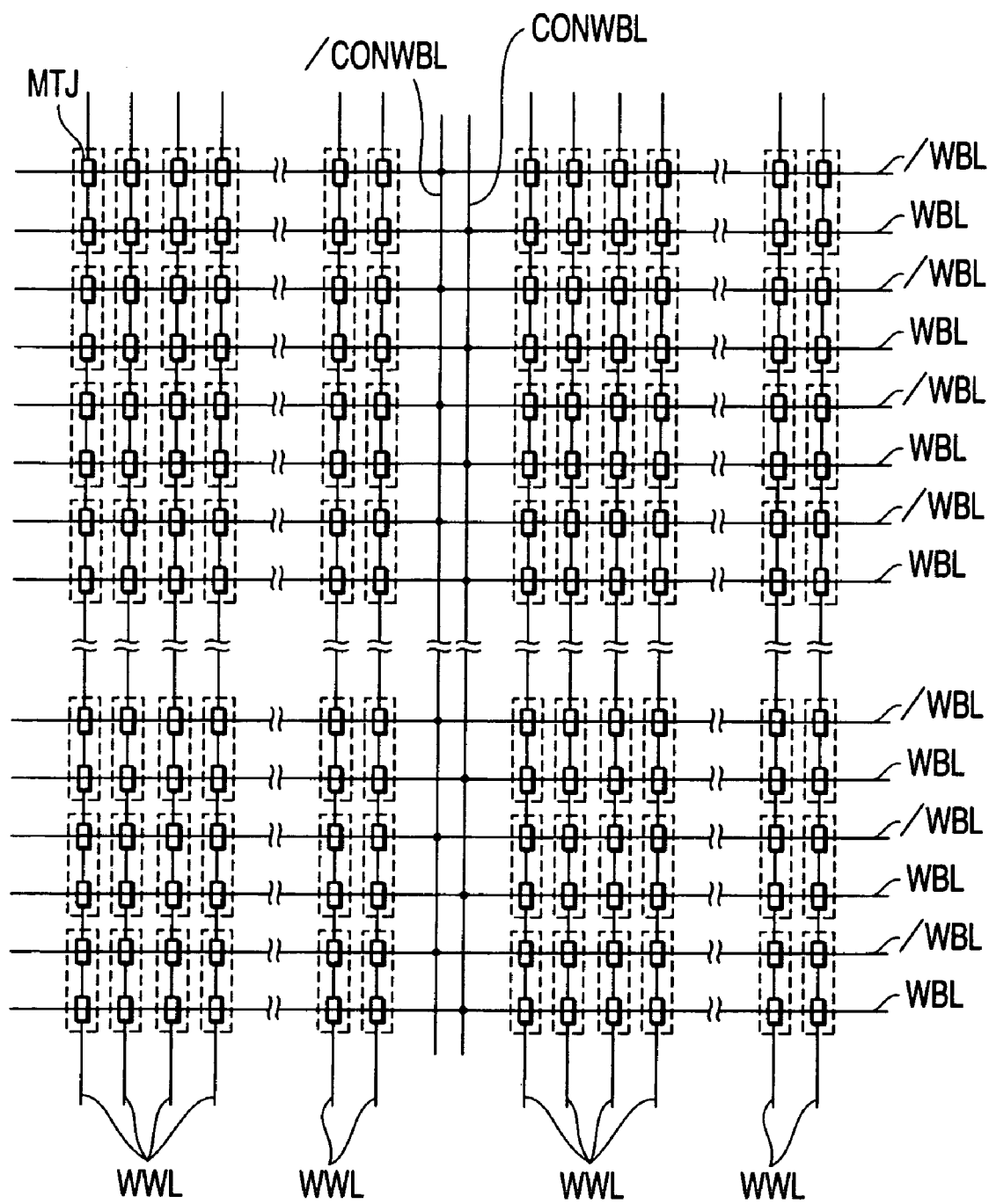
FIG. 32 is a diagram showing essential parts of a semiconductor memory device according to a seventh embodiment.

Now, description will be given of the seventh embodiment of the present invention relating to the semiconductor memory device employing the above resistance-divided cell. FIG. 32 is a diagram schematically showing essential parts of the semiconductor memory device according to the seventh embodiment of the present invention. As shown in FIG. 32, a plurality of write bit line pairs each consisting of write bit lines WBL and /WBL are provided. The positional relationship between the write bit lines WBL and /WBL is the same for all the bit line pairs. For example, the write bit line WBL is located closer to the top of the drawing, while the write bit line /WBL is located closer to the bottom of the drawing.

A resistance-divided memory cell MC is connected to between the bit lines of each pair. Each memory cell MC is placed on a matrix. The resistance-divided cell has two MTJ elements MTJ and /MTJ and two selection transistors Q and /Q (not shown) as in the case of the configuration shown in FIG. 31. Further, the connection node between the two MTJ elements MTJ and /MTJ is connected to the read bit line RBL. Each write word line WWL is provided so as to pass through the MTJ elements MTJ and /MTJ of the memory cells MC belonging to the same column.

Figure 33:
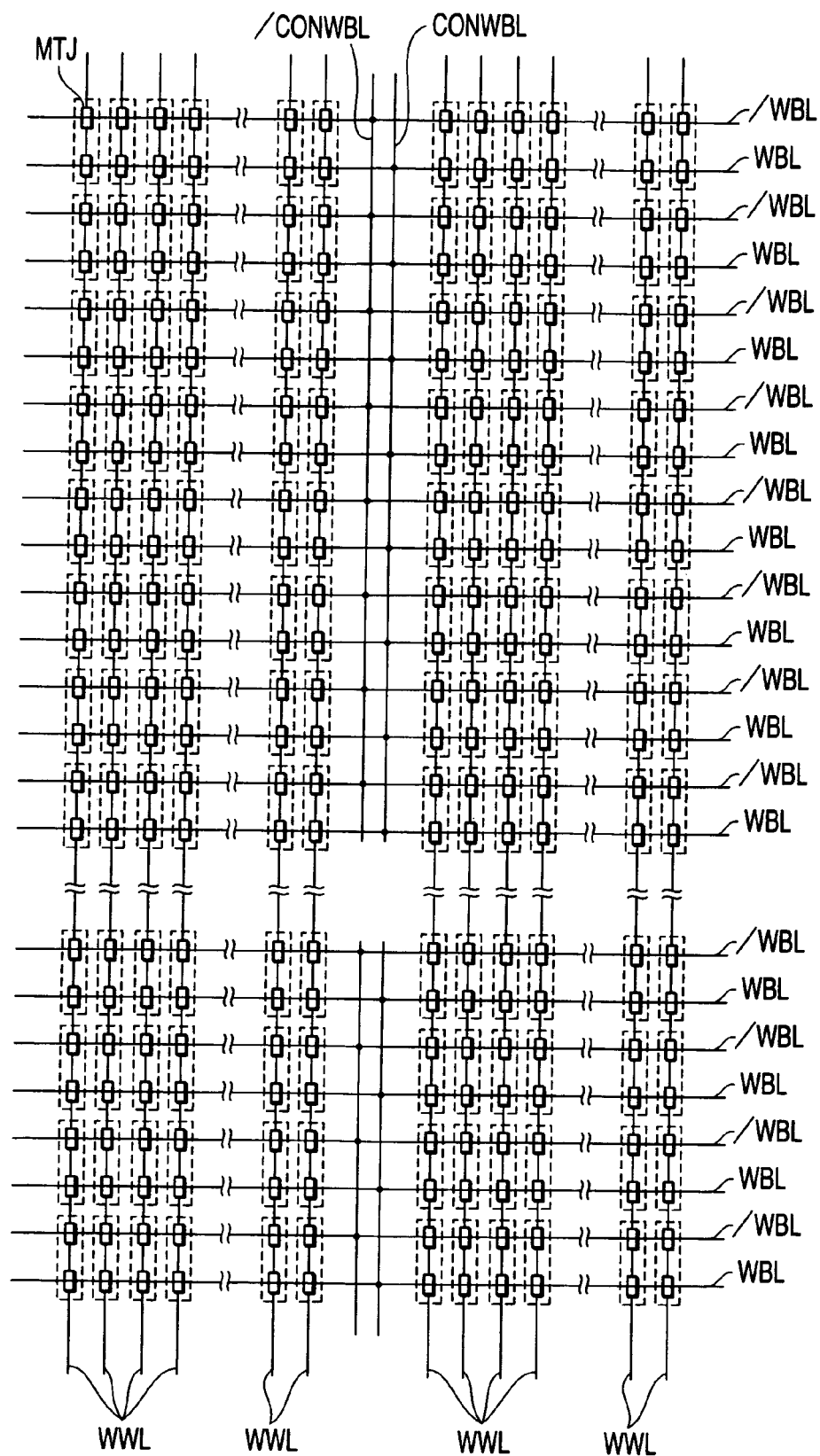
FIGS. 33, 34, and 35 are diagrams each showing essential parts of a semiconductor memory device according to another example of the seventh embodiment.
Figure 34:
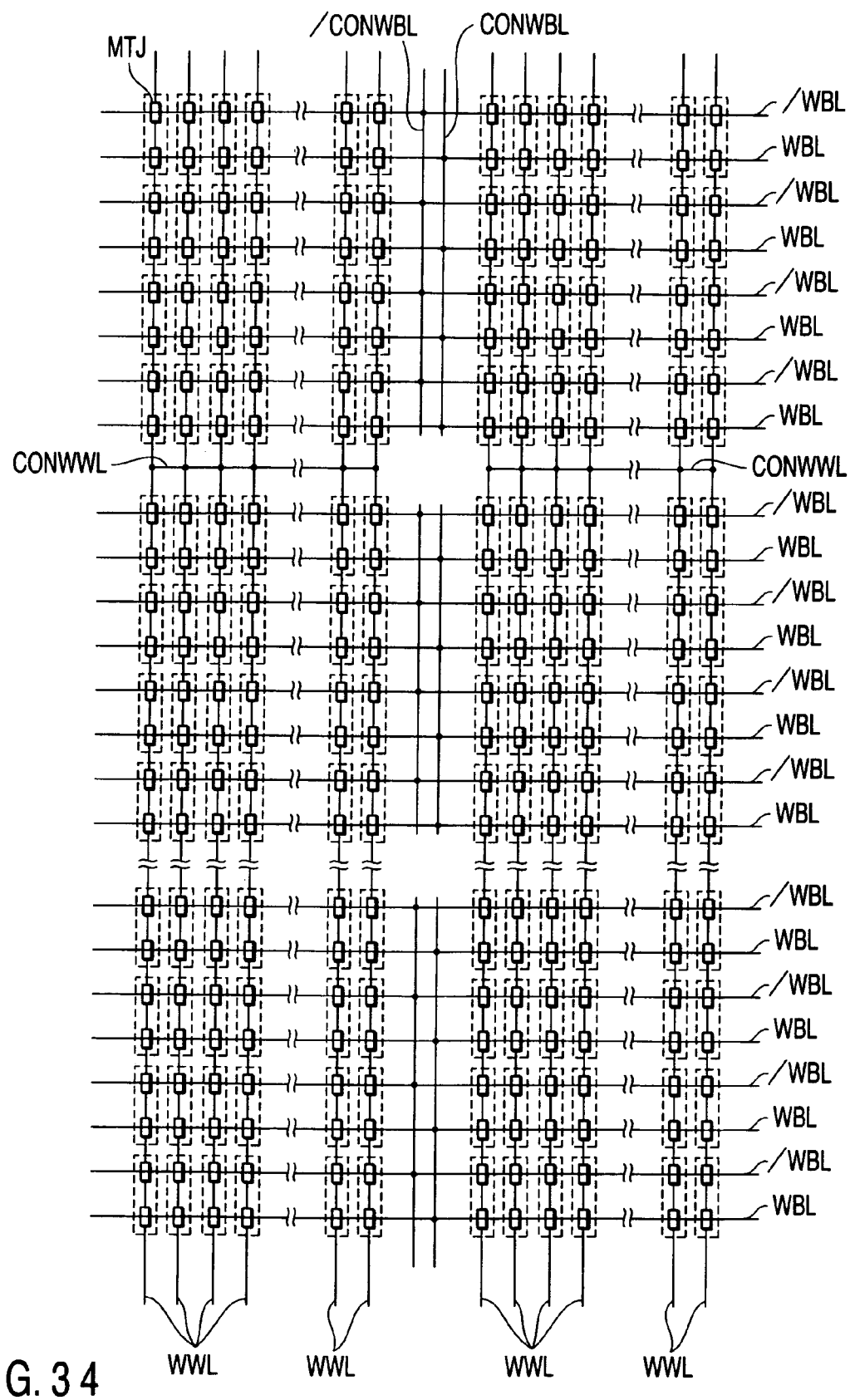

The write bit lines WBL are electrically connected together by the connection line CONWBL. The number of write bit lines WBL connected together may be arbitrary, for example, as shown in FIG. 33 (the figure illustrates four write bit lines WBL). Further, the write bit lines /WBL are electrically connected together by a connection line (second connection line) /CONWBL. The connection lines CONWBL and /CONWBL are typically located substantially in the center of the memory cell array MCA. Furthermore, as shown in FIG. 34, the write word lines WWL may be electrically connected together by the connection line CONWWL as in the case of FIG. 5. For example, in the present example, the connection line CONWBL is formed in the same layer as that of the write word lines WWL. The connection line CONWWL is formed in the same layer as that of the write bit lines WBL.

Figure 35:
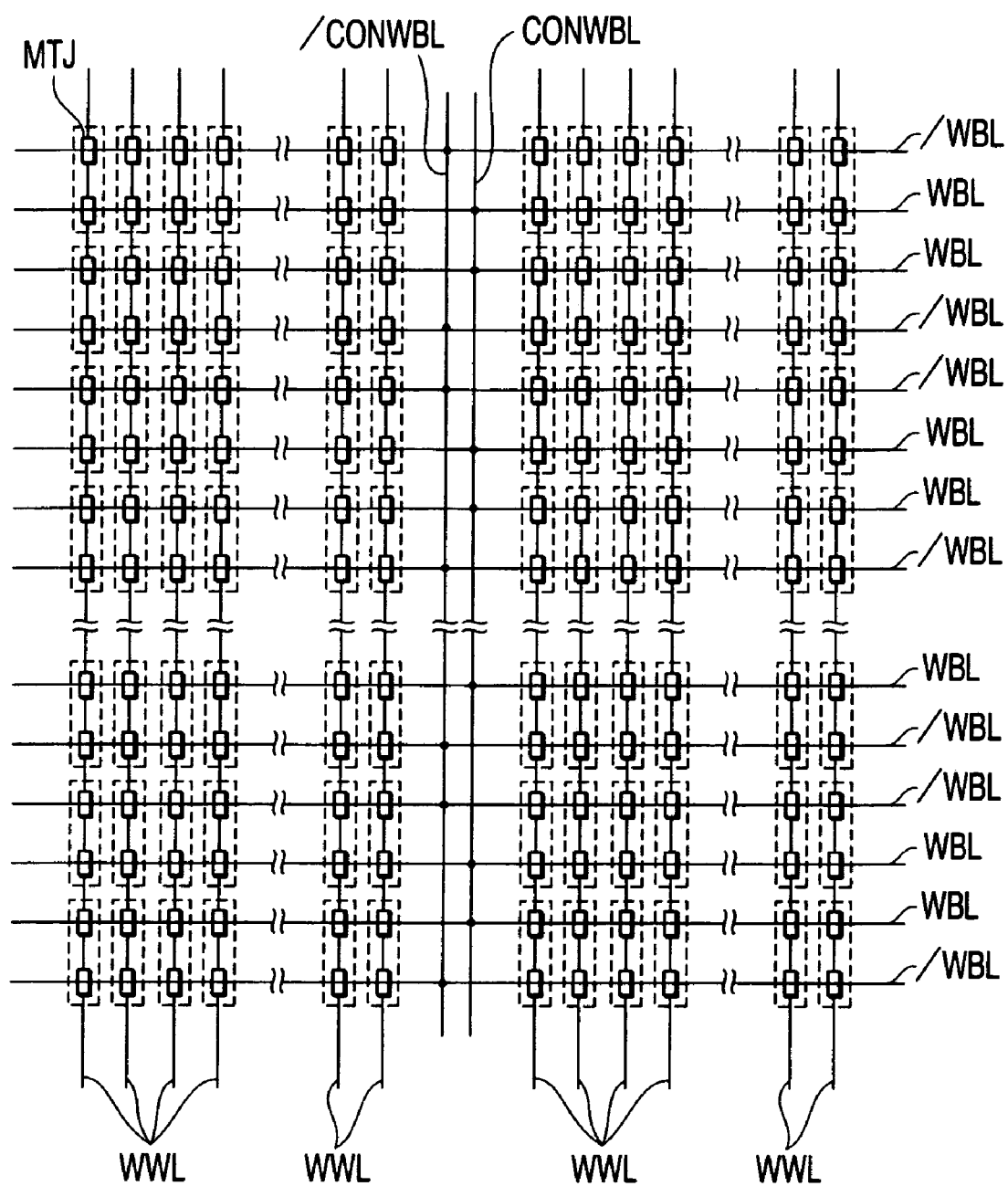

As shown in FIG. 35, the positional relationship between the write bit lines WBL and /WBL may be reversed between the adjacent write bit line pairs.

With the semiconductor memory device according to the seventh embodiment of the present invention, even with the resistance-divided memory cell, the same advantages as those of the first embodiment are gained by connecting the write bit lines WBL together and the write bit lines /WBL together.

Eighth Embodiment

In the first to seventh embodiments, the write bit line current circuit WBLD is provided for each write bit line WBL and the write word line current circuit WWLD is provided for each write word line WWL. In contrast, in an eighth embodiment, the write bit line current circuit WBLD and the write word line current circuit WWLD are shared by a plurality of write bit lines WBL and a plurality of write word lines WWL, respectively. In the description below, most common examples of a write method and a memory cell configuration will be shown. However, of course, the eighth embodiment is applicable to the fifth embodiment (toggle write scheme) or the seventh embodiment (resistance-divided memory cell).

Figure 38:
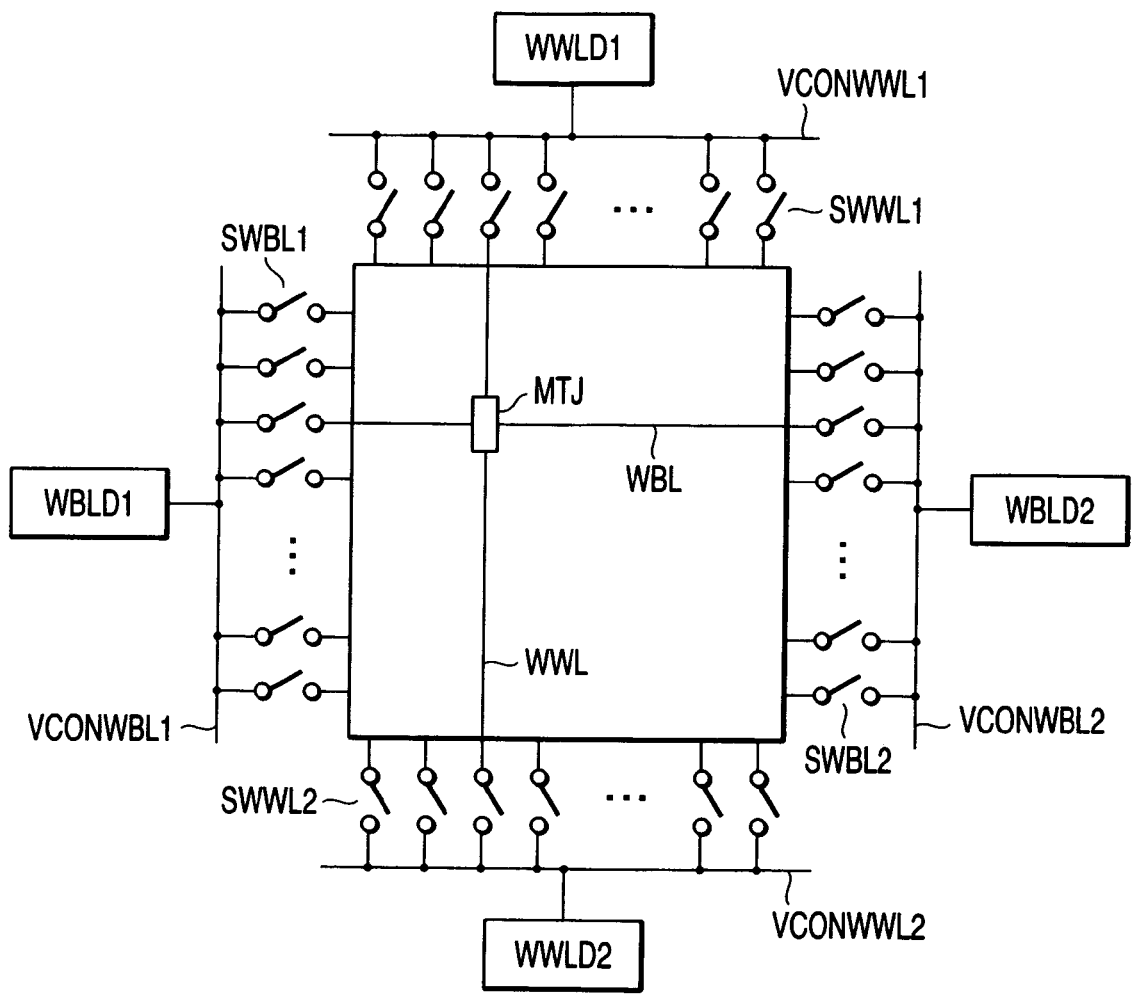
FIG. 38 is a diagram showing essential parts of a semiconductor memory device according to an eighth embodiment of the present invention.

FIG. 38 is a diagram showing essential parts of a semiconductor memory device according to the eighth embodiment of the present invention. As shown in FIG. 38, one end of each write bit line WBL is connected to one end of a switch circuit SWBL1, for example, a transistor. The other end of each switch circuit SWBL1 is connected to a common line VCONWBL1. The common line VCONWBL1 is connected to the write bit line current circuit WBLD1.

Likewise, the other end of each write bit line WBL is connected to a common line VCONWBL2 via a switch circuit SWBL2, for example, a transistor. The common line VCONWBL2 is connected to the write bit line current circuit WBLD2.

One end of each write word line WWL is connected to one end of a switch circuit SWWL1, for example, a transistor. The other end of each switch circuit SWWL1 is connected to a common line VCONWWL1. The common line VCONWWL1 is connected to the write bit line current circuit WWLD1.

Likewise, the other end of each write word line WWL is connected to a common line VCONWWL2 via a switch circuit SWWL2, for example, a transistor. The common line VCONWWL2 is connected to the write word line current circuit WWLD2.

A current is supplied to a selected write bit line WBL or write word line WWL depending on whether the switch circuit SWBL1, SWBL2, SWWL1, or SWWL2 is turned on or off. A control circuit described later controls the turn-on and -off of the switch circuits SWBL1, SWBL2, SWWL1, and SWWL2. This control will be described later in detail.

The memory cell array is the same as that in the first, fifth, or seventh embodiment. Further, the interconnection lines CONWBL and CONWWL can take any form shown in the first embodiment. For example, one or both of the interconnection lines CONWBL and CONWWL may be provided.

FIG. 38 illustrates the case in which one memory cell array has one common line VCONWBL1, one common line VCONWBL2, one common line VCONWWL1, and one common line VCONWWL2. However, a plurality of common lines may be provided for each type. Alternatively, a plurality of memory cell arrays may be provided so that adjacent memory cell arrays share the common lines VCONWBL1, VCONWBL2, VCONWWL1, and VCONWWL2.

At standby, all the switch circuits SWBL1, SWBL2, SWWL1, and SWWL2 are on. Thus, the potential of the write bit line WBL is precharged to that of the connection lines VCONWBL1 and VCONWBL2 (typically the common potential). Further, the potential of the write word line WWL is precharged to that of the connection lines VCONWWL1 and VCONWWL2 (typically the common potential). As described later, during a write, the predetermined switch circuit SWBL1, SWBL2, SWWL1, or SWWL2 is turned off.

The write bit line WBL and the write word line WWL may be precharged at standby as follows. As shown in FIG. 57, a switch circuit SWPWBL, for example, a transistor, is provided between a common potential line and one end of each write bit line WBL (the connection node formed with the switch circuits SWBL1 and SWBL2). Likewise, a switch circuit SWPWWL, for example, a transistor, is provided between the common potential line and the other end of each write word line WWL (the connection node formed with the switch circuits SWWL1 and SWWL2). Then, the switch circuits SWPWBL and SWPWWL are on during standby and off during a write.

Now, the circuit in FIG. 38 will be described in further detail. The description below relates only to the write bit line WBL and the write bit line current circuits WBLD1 and WBLD2. However, the same description also applies to the write word line WWL and the write word line current circuits WWLD1 and WWLD2.

Figure 39:
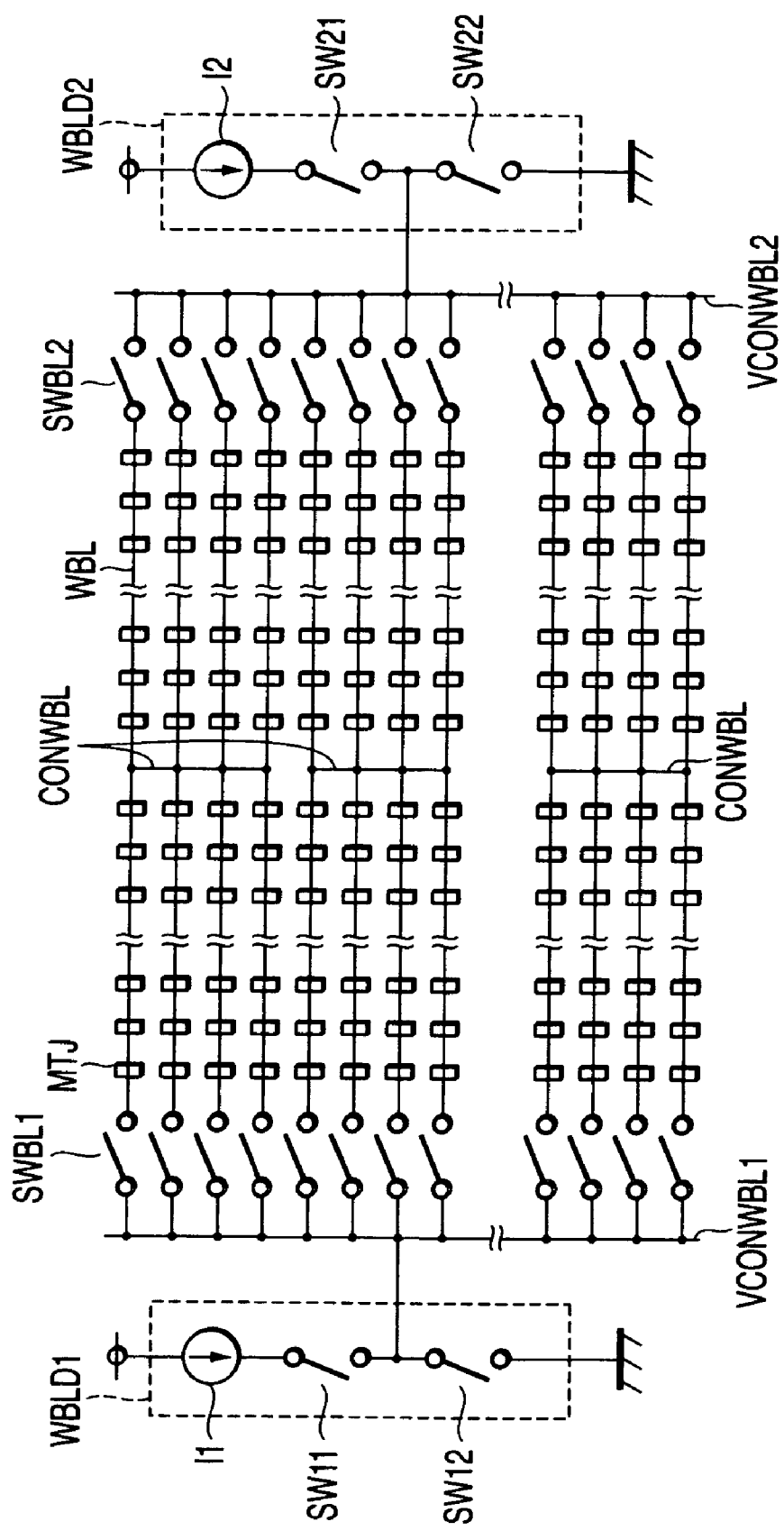
FIGS. 39, 40, and 41 are diagrams each showing a part of the semiconductor memory device in FIG. 38 in detail.
Figure 40:
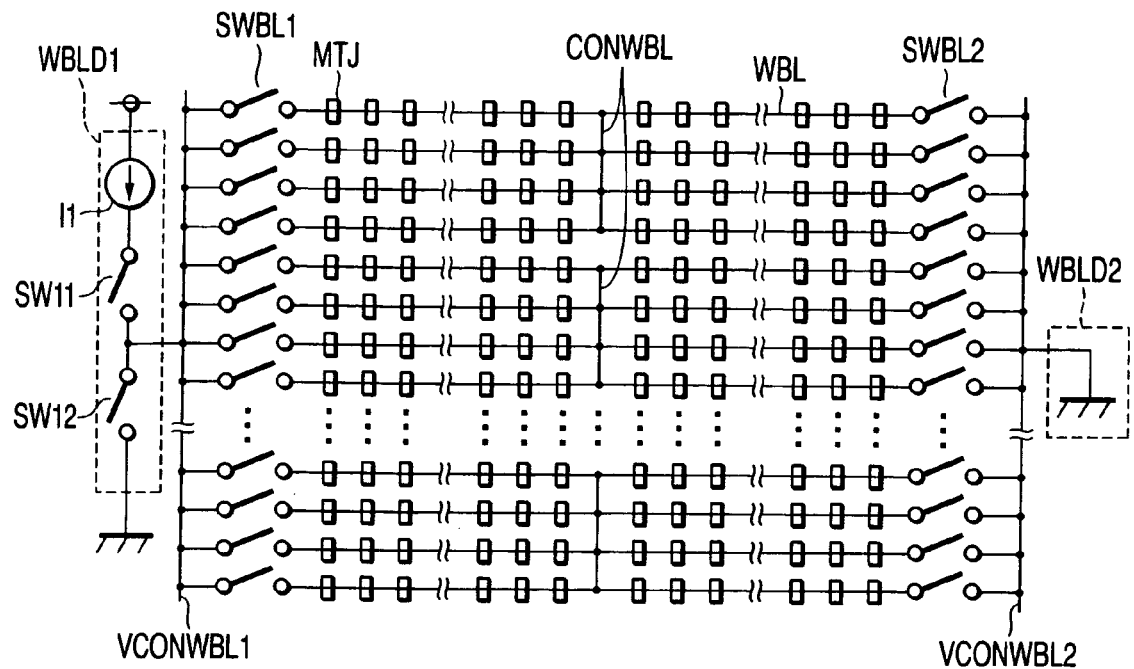
Figure 41:
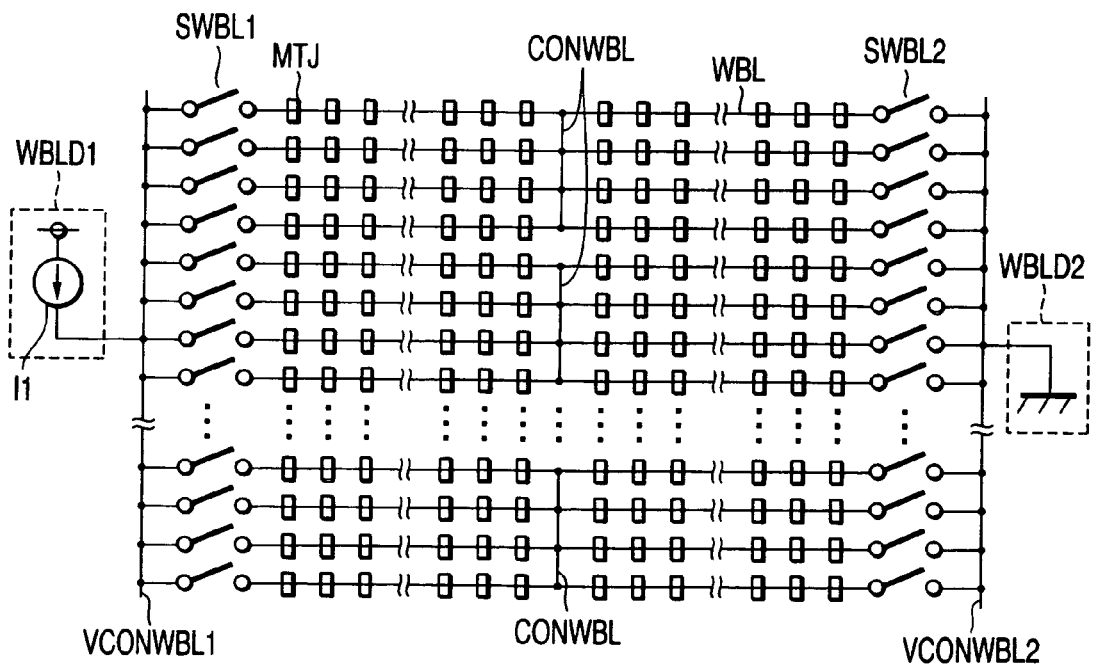

First, the write bit line current circuits WBLD1 and WBLD2 will be described with reference to FIGS. 39 to 41. FIGS. 39 to 41 are diagrams showing a part of the semiconductor memory device in FIG. 38 in detail. FIGS. 39 to 41 illustrate the case in which four write bit lines WBL are connected together by the connection line CONWBL.

In FIG. 39, the write current flows through the write bit line WBL in both directions. As shown in FIG. 39, the write bit line current circuit WBLD1 is composed of a current source I1 and switch circuits SW11 and SW12 connected in series between a power supply potential terminal and a common potential terminal. The write bit line current circuit WBLD2 is composed of a current source I2 and switch circuits SW21 and SW22 connected in series between the power supply potential terminal and the common potential terminal. The connection node between the switch circuits SW11 and SW12 is connected to the connection line VCONWBL1. The connection node between the switch circuits SW21 and SW22 is connected to the connection line VCONWBL2.

In FIGS. 40 and 41, the write current flows through the write bit line WBL in one direction. With a typical write method, the current needs not flow in both directions in either the write bit line WBL or write word line WWL. With the toggle write scheme, it is sufficient that the current flows in only one direction is both write bit line WBL and write word line WWL. In this case, it is possible to use a write current circuit of the configuration shown in FIGS. 40 and 41.

As shown in FIGS. 40 and 41, the part corresponding to the write bit line current circuit WBLD2 is not provided. The connection line VCONWBL2 is simply connected to the common potential terminal. In FIG. 40, the write bit line current circuit WBLD1 is the same as that shown in FIG. 39.

In FIG. 41, the write bit line current circuit WBLD1 has only the current source I1, connected to the connection line VCONWBL1.

Figure 42:
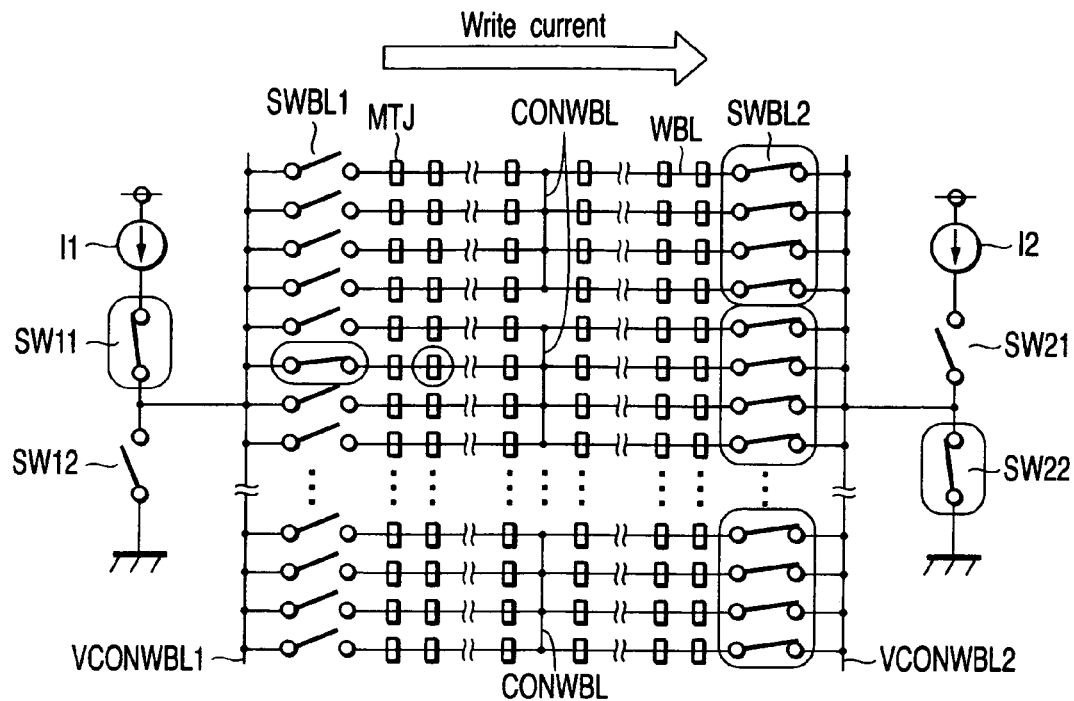
FIGS. 42, 43, 44, and 45 are diagrams each showing a state of a semiconductor memory device according to an eighth embodiment during a write.
Figure 43:
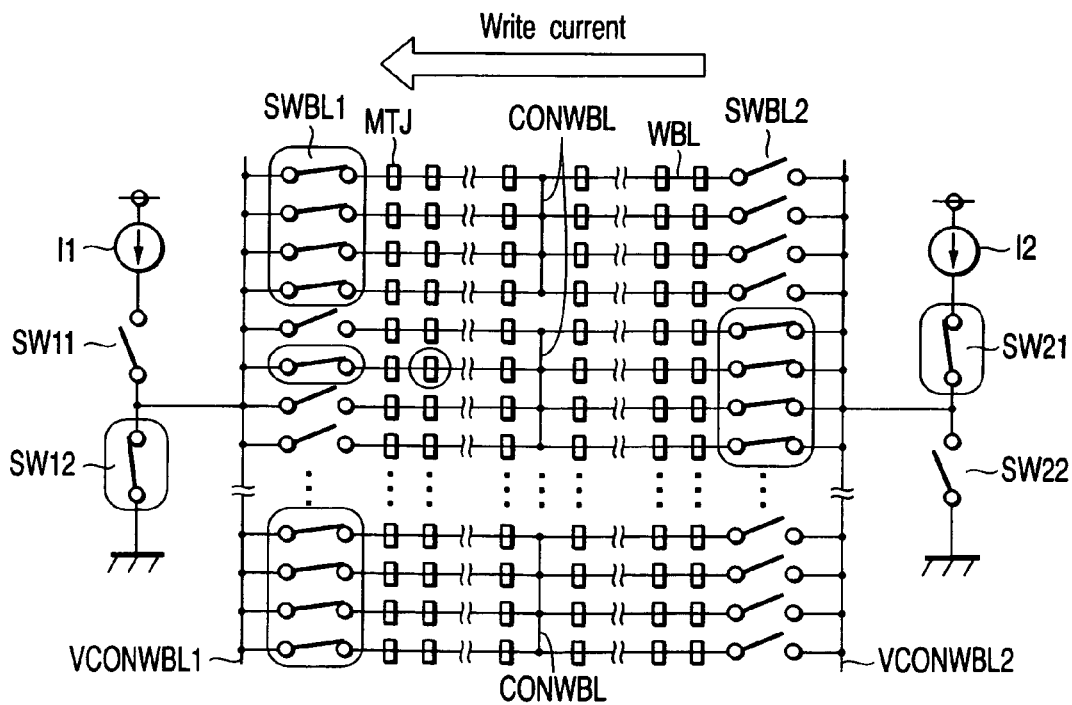
Figure 44:
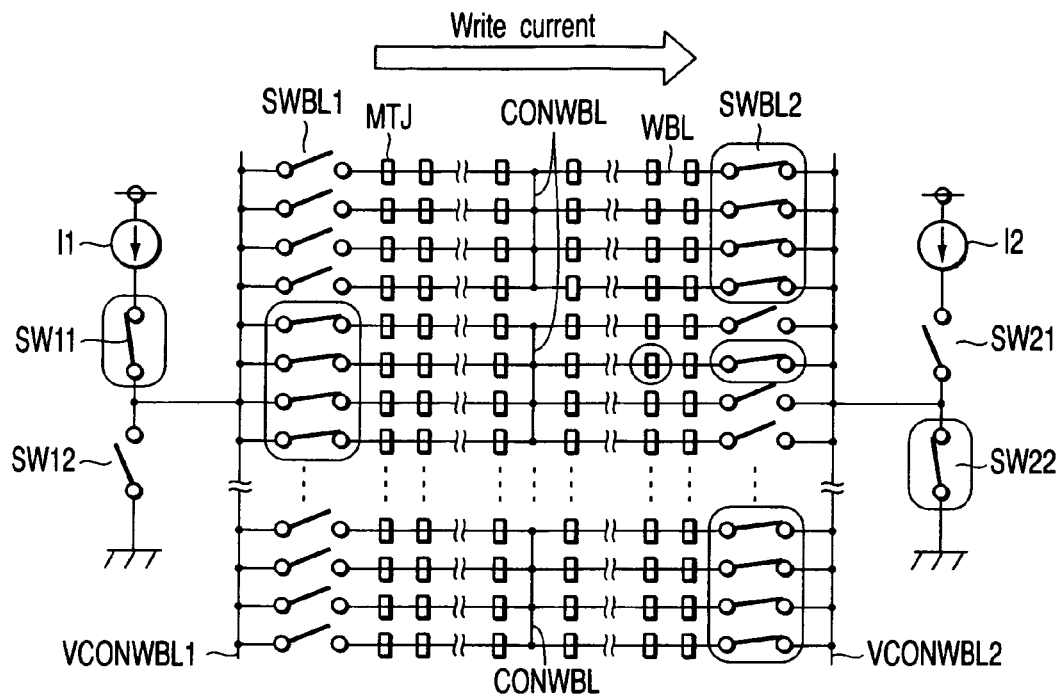
Figure 45:
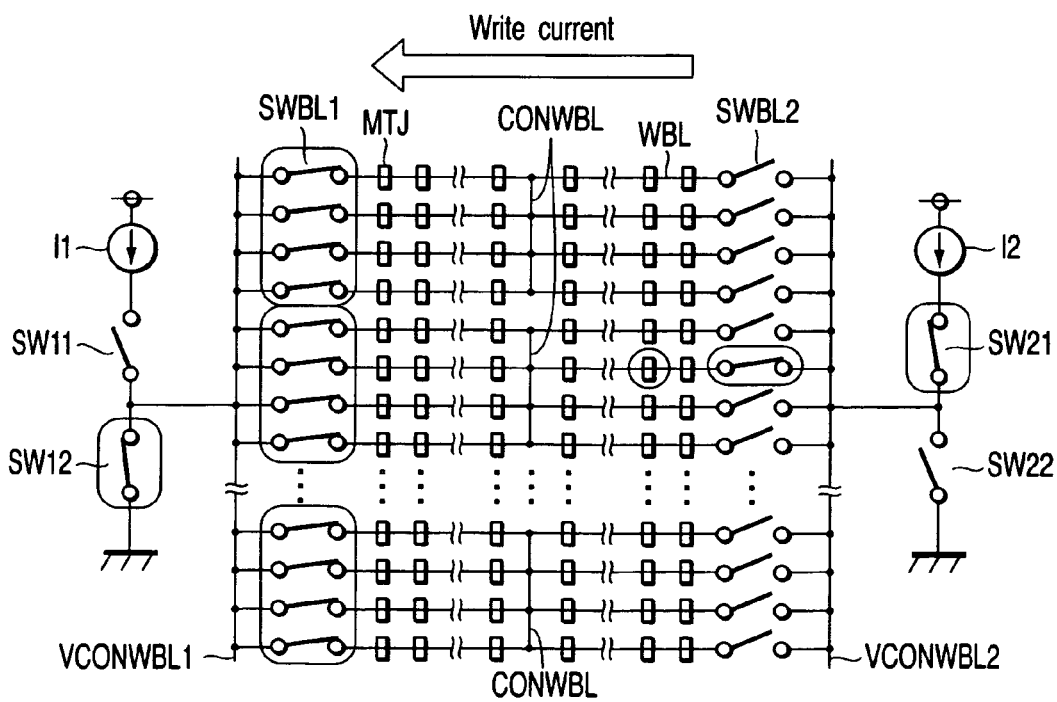

Now, with reference to FIGS. 42 to 45, description will be given of the control of the switch circuits SWBL1 and SWBL2 during a write. In FIGS. 42 to 45, in the second interconnected unit from the top, a write is executed on the MTJ elements MTJ (shown by circle) through which the second write bit line WBL from the top of the unit passes. In FIGS. 42 and 43, the selected MTJ elements MTJ are located to the left of the connection line CONWBL in the drawings. In FIGS. 44 and 45, the selected MTJ elements MTJ are located to the right of the connection line CONWBL in the drawings. Moreover, in FIGS. 42 and 44, the write current flows from the left to right of the drawings (for example, a write of "1"). In FIGS. 43 and 45, the write current flows from the right to left of the drawings (for example, a write of "0").

In FIG. 42, the switches SW11 and SW22 (shown by circle) are turned on. Further, only one of switches SWBL1 which is connected to the selected write bit line WBL is turned on. All the switches SWBL2 are turned on.

In FIG. 43, the switches SW12 and SW21 are turned on. Further, all the switches SWBL1 connected to the interconnection units (unselected interconnected units) other than those (selected interconnected units) containing the selected MTJ elements MTJ are turned on. All the switches SWBL2 connected to the unselected interconnected units remain off. For the switches SWBL1 and SWBL2 connected to the selected interconnected units, the switch SWBL1 connected to the selected bit line WBL and all the switches SWBL2 are on.

In FIG. 44, the switches SW11 and SW22 are turned on. Further, all the switches SWBL2 connected to the unselected interconnected units are turned on. All the switches SWBL1 connected to the unselected interconnected units remain off. For the switches SWBL1 and SWBL2 connected to the selected interconnected units, the switch SWBL2 connected to the selected bit line WBL and all the switches SWBL1 are on.

In FIG. 45, the switches SW12 and SW21 are turned on. Further, only one of switches SWBL2 which is connected to the selected write bit line WBL is turned on. All the switches SWBL1 are turned on.

If the current flows through the write bit line WBL in only one direction suffices, then for example, in FIGS. 42 and 44, the switches SW11 and SW22 may be always on. In this case, the write bit line current circuits WBLD1 and WBLD2 are configured in the same manner as in FIG. 40 or 41.

As shown in FIG. 46, each switch circuit SWBL1 is controlled by a write bit line write control circuit WBLC1. Each switch circuit SWBL2 is controlled by a write bit line write control circuit WBLC2. Each write bit line write control circuit WBLC1 is supplied with control signals LSEL, DAT1, and WACT, and address signals USEL(m) and SEL(n).

Each write bit line write control circuit WBLC2 is supplied with control signals RSEL, DAT0, and WACT, and the address signals USEL(m) and SEL(n). These control and address signals are the same as those in the second embodiment. Each of the switch circuits SWBL1 and SWBL2 is controlled in accordance with a combination of the control signals LSEL, RSEL, DAT0, DAT1, USEL(m), SEL(n), and WACT. As a result, in accordance with the positions of the selected MTJ elements, the positions of the selected MTJ elements with respect to the connection line CONWBL, and write data, a state similar to the one shown in any of FIGS. 42 to 45 is formed, with a magnetic field applied to the selected MTJ elements.

In the semiconductor memory device according to the eighth embodiment of the present invention, the write bit lines WBL are connected together and/or the write word lines WWL are connected together, as in the case of the first embodiment. Thus, the same effects as those of the first embodiment are produced.

Further, according to the eighth embodiment, the write bit lines WBL share the write bit line current circuits WBLD1 and WBLD2. The write bit lines WWL share the write word line current circuits WWLD1 and WWLD2. This serves to reduce the required numbers of write bit line current circuits WBLD1 and WBLD2 and write word line current circuit WWLD1 and WWLD2.

Ninth Embodiment

A ninth embodiment relates to a read system circuit.

Figure 60:
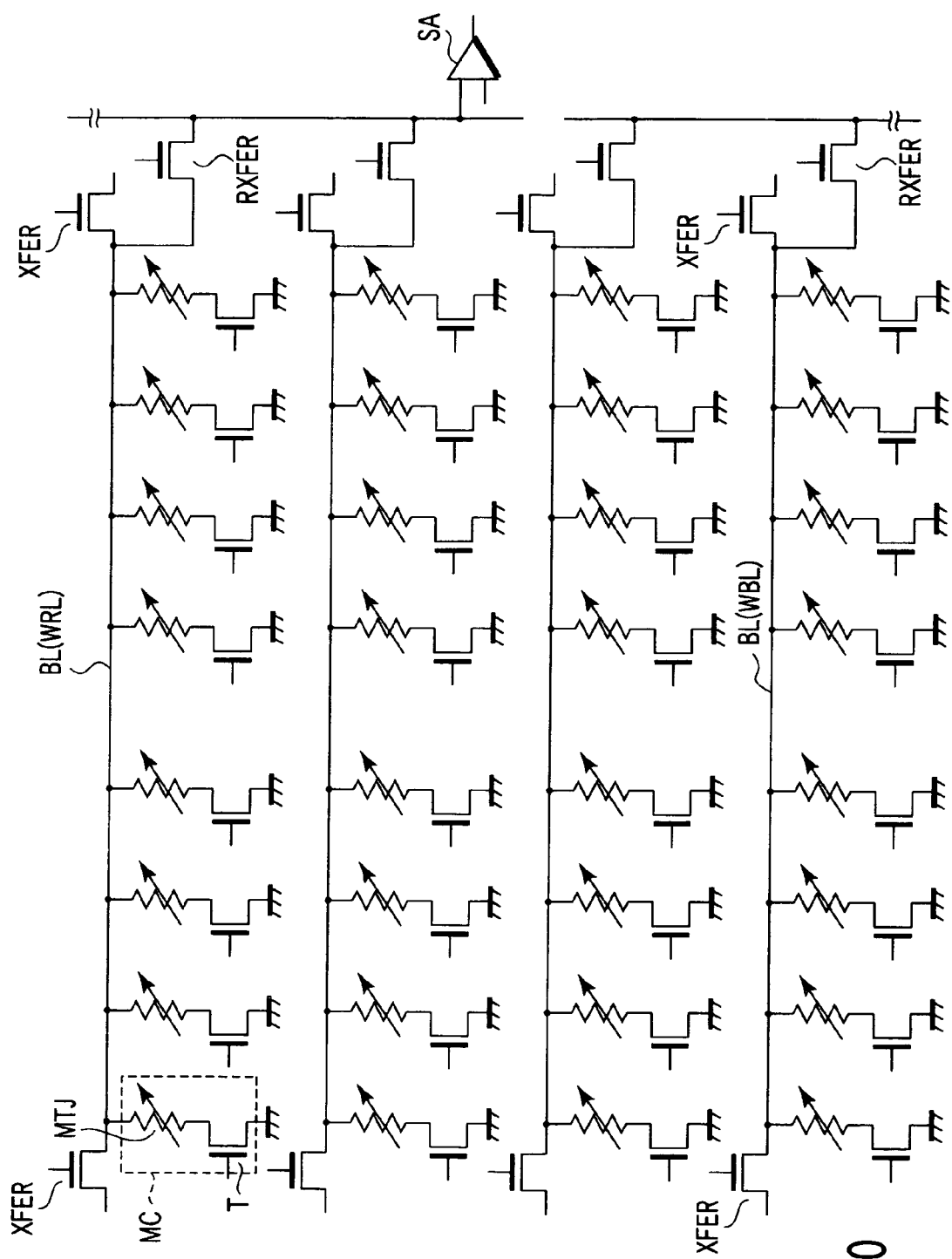
FIG. 60 is a diagram showing an example in which a write bit line and a read bit line are provided in the same wiring.

In general, a write bit line and a read bit line are provided in the same wiring. Hereinafter, in the case where a line is simply expressed as a bit line, it denotes that a write bit line and a read bit line are shared. FIG. 60 shows an example in which a write bit line and a read bit line are provided in the same wiring. As shown in FIG. 60, a transfer gate transistor XFER for selecting a desired bit line at a write operation is connected to both ends of a bit line BL.

One end of the bit line BL is connected to a sense amplifier SA via a transfer gate transistor RXFER for selecting the desired bit line at a read operation. A reference potential is supplied to the sense amplifier SA. Each memory cell MC is composed of an MTJ element MTJ and a selector transistor T connected in series between the bit line BL and a common potential line.

A read system circuit shown in FIG. 60 can be applied when write bit lines WBL are not connected by a connection line CONWBL as the embodiments of the present invention. Therefore, this circuit can be used when only the write word lines WWL are interconnected.

On the contrary, when write bit lines WBL are interconnected, it is necessary to employ a so-called read/write separation type memory cell (R/W separation cell) described below. The R/W separation cell is disclosed in the specifications of Jpn. Pat. Appln. KOKAI Publication P2002-170376, U.S. Pat. Nos. 6,529,404, and 6,714,442, for example.

Figure 61:
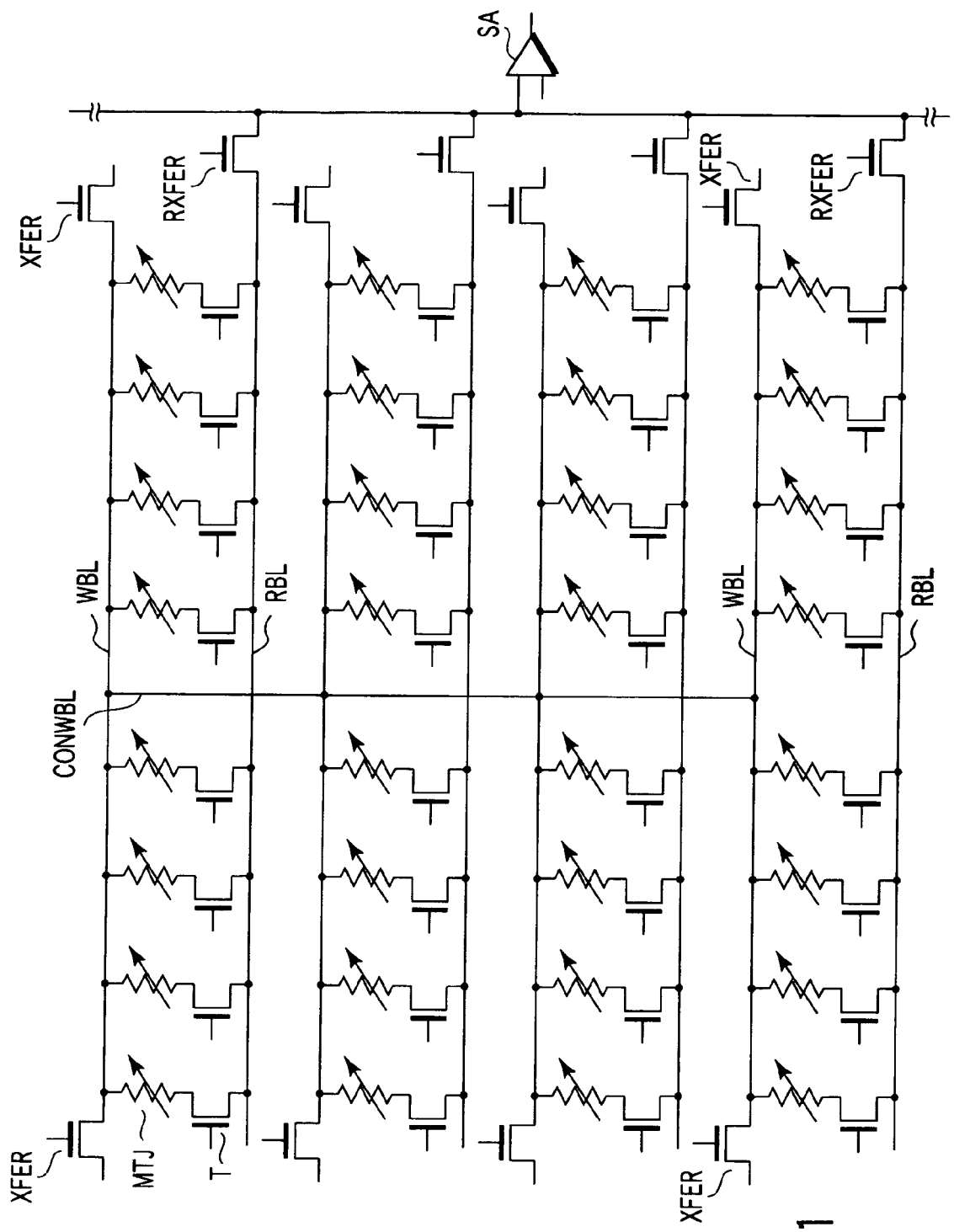
FIG. 61 is a diagram showing essential parts of a semiconductor memory device according to a ninth embodiment of the present invention.

FIG. 61 shows essential parts of a semiconductor memory device according to the ninth embodiment of the present invention. In more detail, in FIG. 61, the write bit lines WBL are interconnected and the R/W separation cell is applied. As shown in FIG. 61, the write bit lines WBL are interconnected by the connection line CONWBL. One end of each MTJ element MTJ is connected to the write bit line WBL; the other end is connected to one end of the selector transistor T; and the other end of the selector transistor T is connected to read bit lines RBL. Each read bit line RBL is connected to an input end of the sense amplifier via the transfer gate transistor RXFER.

A read operation in the present embodiment can be made as follows, for example. First, a potential of a write bit line WBL is set at a ground potential. Next, a selector transistor T is turned on, and data stored in an MTJ element MTJ is transferred to a read bit line RBL. Then, a sense amplifier SA is activated to sense data. A write operation is identical to a case in which no R/W separation cell is applied.

A write word line WWL is not illustrated here. The write word line WWL is irrelevant to the read operation, and thus, whether or not the read bit line RBL is separated/shared is irrelevant to whether or not the write word lines WWL are interconnected according to embodiments.

Further, the present embodiment shows an example of using so-called 1T1R-configured memory cells where a memory cell MC is configured by serially connected one MTJ element MTJ and one selector transistor T. However, of course, the present embodiment can be applied to other configured memory cells as well.

In addition, while FIGS. 60 and 61 each show an example in which four bit lines BL and read bit lines RBL share one sense amplifier SA, more bit lines BL and read bit lines RBL, for example, the 8 bit lines can share one sense amplifier SA. Moreover, the sense amplifiers may be provided for each bit line BL and for each read bit line RBL. Further, read bit lines RBL which belongs to different interconnected units may share one sense amplifier SA.

With the semiconductor memory device according to the ninth embodiment of the present invention, as in the first embodiment, the write bit lines WBL are interconnected and/or the write word lines WWL are interconnected. Thus, advantageous effect identical to that of the first embodiment can be attained.

According to the ninth embodiment, when write bit lines WBL are interconnected, the R/W separation cell is employed. Thus, even when the write bit lines WBL are interconnected, data can be read out from a desired MTJ element MTJ.

Tenth Embodiment

A tenth embodiment relates to I/O allocation in a memory cell array.

Figure 62:
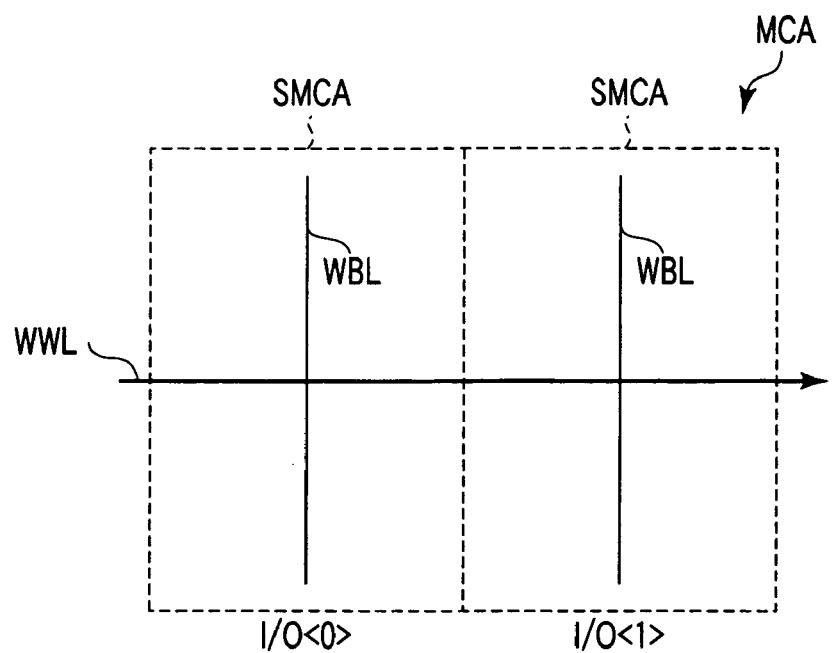
FIG. 62 is a diagram illustrating allocation of a conventional I/O.

In order to achieve a high data transfer rate, there is a need for multiple bit products, a so-called multi-I/O capable of inputting and outputting two or more bits at one read/write operation. In order to achieve this, in one memory cell array of one I/O, a system for selecting two or more memory cells in one read/write operation may be used. FIG. 62 illustrates a conventional case, i.e., I/O allocation in the case when write word lines WWL are not interconnected. Now, a description will be given by way of example of a case in which two I/Os are provided in one memory cell array MCA.

When write word lines WWL are not interconnected, the memory cell array MCA is generally divided into regions as many as number of I/Os allocated to one memory cell array, and one I/Os allocated to one region. That is, as shown in FIG. 62, when two I/Os are allocated to one memory cell array, the memory cell array is divided into two regions (I/O blocks). For example, I/O<0> is allocated to a left side I/O block, and I/O<1> is allocated to a right I/O block. Then, write bit lines WBL which belong to each I/O block are selected at the same time when one read/write operation. As a result, by one read/write operation, data can be written into more than one (two, for FIG. 62) memory cells (MTJ elements).

On the contrary, when the write word lines WWL are interconnected, for example, at the center of a memory cell array as in the embodiments of the invention, the dividing technique shown in FIG. 62 cannot be used. This is because a write current which flows through one write word line WWL at one side (for example, at the left side) is branched at the other side (for example, at the right side), and the current which flows through each of the write word lines WWL at the other side is smaller than a required one for a write operation. Note that performing write operation for each I/O can solve the problem, but it requires a longer time to complete the operation.

Figure 63:
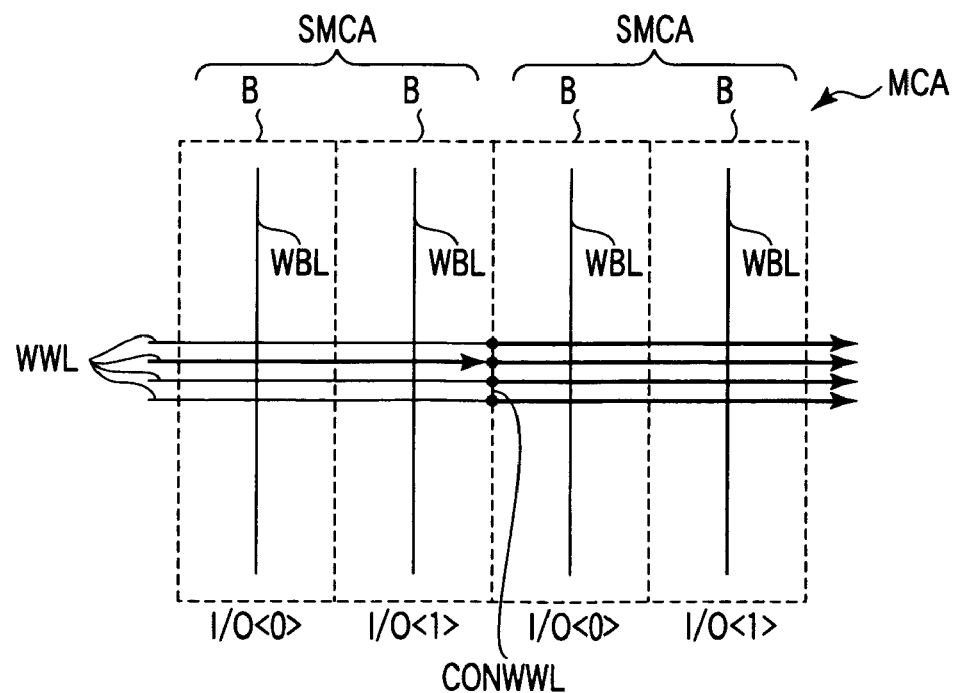
FIG. 63 is a diagram showing essential parts of a semiconductor memory device according to a tenth embodiment of the present invention.

In order to overcome this problem, in the tenth embodiment, an I/O is allocated as shown in FIG. 63. FIG. 63 shows essential parts of a semiconductor memory device according to the tenth embodiment of the present invention. As shown in FIG. 63, a memory cell array MCA is divided into two sub-arrays SMCA with a connection line CONWWL used as a border, and each sub-array SMCA is further divided into two I/O blocks B, for example. In addition, in each sub-array SMCA, I/O<0> is allocated to one (for example, left side) I/O block B, and I/O<1> is allocated to the other (for example, right side) I/O block B. Namely, one memory cell array MCA is divided into two sub-arrays SMCA, and more than one I/Os are allocated to each of these sub-arrays similarly.

A description will be given with respect to a case of a write operation on a memory cell (MTJ element MTJ) allocated to the left sub-array SMCA. As indicated by the arrow in the drawing, in the left side sub-array SMCA, a write current flows in one write word line WWL, and is branched at the connection line CONWWL. The divided write currents flow in four lines WWL in the right sub-array SMCA.

Further, the write current is supplied to a respective one of the write bit lines WBL in an I/O block B of I/O<0> and an I/O block B for I/O<1> in the left sub-array SMCA. As a result, in the left sub-array SMCA, data is written at the same time into each of the MTJ elements MTJ in the I/O block B of I/O<0> and the I/O block B of I/O<1>. Namely, more than one I/O blocks in a left half or a right half of one memory cell array MCA are activated at the same time, and a write operation can be made.

For the sake of simplification, FIG. 63 shows one write bit line WBL in each I/O block. However, more write bit lines WBL are periodically provided, and may be interconnected as shown in FIG. 55 or not.

In FIG. 63, the same I/O is allocated to the same side block in each sub-array SMCA, but this allocation is not limited thereto. For example, with respect to each I/O block B, I/O<0>, I/O<1>, I/O<1>, and I/O<0> are allocated from the left of FIG. 63, whereby a mirror face object may be provided with the connection line CONWWL as a border.

Moreover, two or more I/O blocks can be allocated to one memory cell array MCA. For example, four I/O blocks may be allocated to one memory cell array MCA, for example, as shown in FIG. 64. FIG. 64 shows essential parts of a semiconductor memory device according to another example of the tenth embodiment.

As shown in FIG. 64, a memory cell array MCA is divided into two sub-arrays SMCA with the connection line CONWWL as a border, and each sub-array SMCA is divided into four I/O blocks B. Then, in each sub-array SMCA, I/O<0>, I/O<1>, I/O<2>, and I/O<3> are allocated from the left in an I/O block B.

With the semiconductor memory device according to the tenth embodiment of the present invention, as in the first embodiment, write bit lines WBL are interconnected and/or write word lines WWL are interconnected. Thus, advantageous effect identical to that of the first embodiment can be attained.

In addition, according to the tenth embodiment, a memory cell array is divided into two sub-arrays SMCA with the connection line SMCA as a border, and each sub-array SMCA is divided into more than one I/O blocks B. Thus, even when write word lines WWL are interconnected, data can be written into more than one MTJ elements MTJ by one control.

Eleventh Embodiment

An eleventh embodiment relates to a configuration of a peripheral circuit for write bit lines WBL on the tenth embodiment. The present embodiment also relates to a case in which a current needs to be able to flow in a write bit line WBL in the both direction. A configuration shown below can be applied to a write word line WWL.

Figure 65:
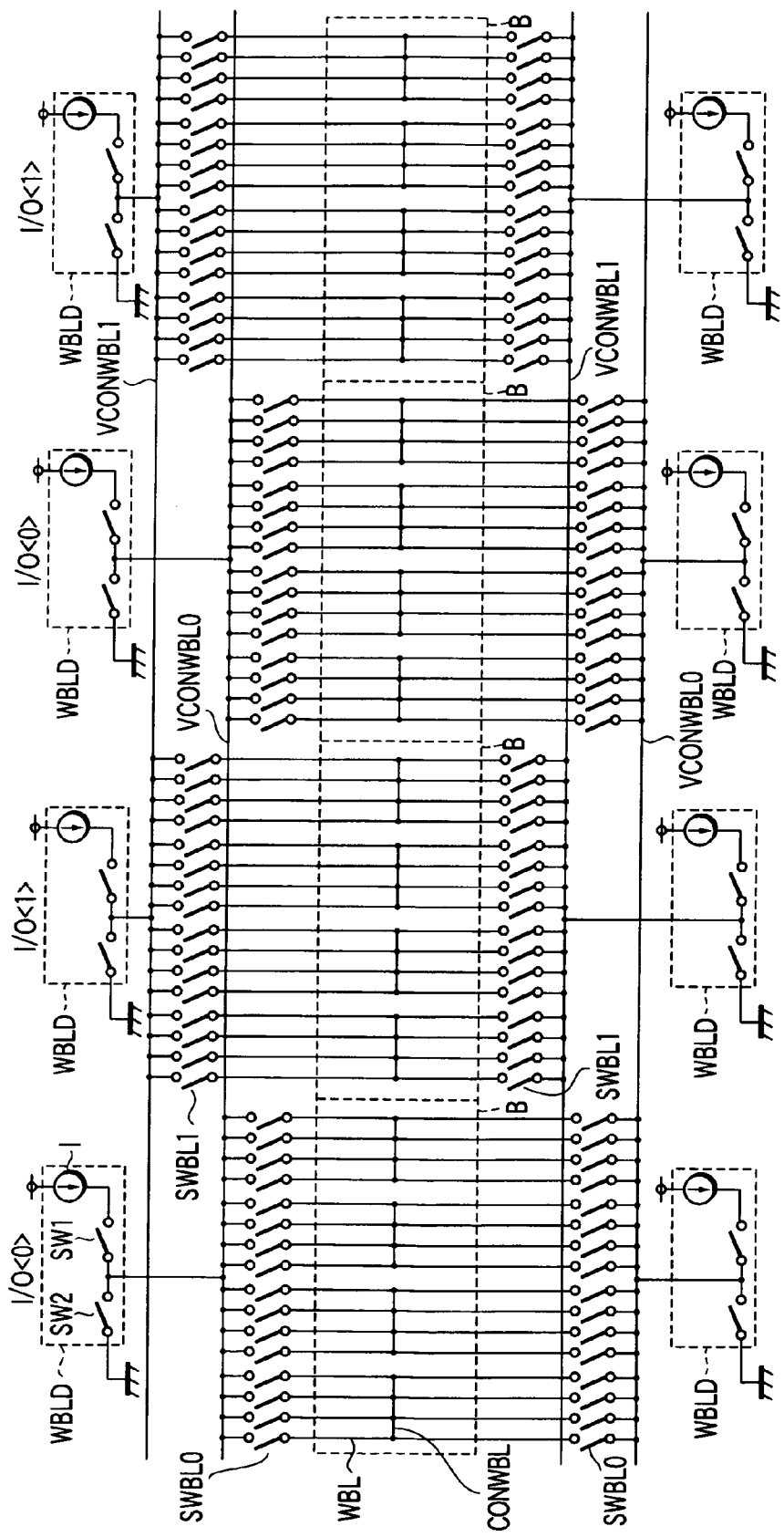
FIG. 65 is a diagram showing essential parts of a semiconductor memory device according to an eleventh embodiment of the present invention.

FIG. 65 shows essential parts of a semiconductor memory device according to the eleventh embodiment of the present invention. FIG. 65 shows a case in which each of the write bit lines WBL which belong to the same I/O block B, which is divided into two in the memory cell array, is connected to the same connection line.

A more detailed description will be given below. As shown in FIG. 65, a memory cell array MCA is divided into sub-arrays SMCA and I/O blocks B in accordance with the same rule shown in FIG. 63.

Write bit lines WBL are interconnected by the connection line CONWBL on a four by four line basis, for example. Common lines VCONWBL0 and VCONWBL1 are provided at the upper side of a memory cell array MCA. Common lines VCONWBL0 and VCONWBL1 are also provided at the lower side of the memory cell array.

Each of the write bit lines WBL which belong to an I/O block B to which I/O<0> is allocated is connected to the common line VCONWBL0 via a switch circuit (transfer gate) SWBL0 such as a transistor.

Similarly, each of the write bit lines WBL which belong to an I/O block B to which I/O<1> is allocated is connected to the common line VCONWBL1 via a switch circuit (transfer gate) SWBL1 such as a transistor.

AS many write bit line current circuits WBLD as the I/O blocks B connected to each of the common lines VCONWBL0 and VCONWBL1 are connected to each of the common lines VCONWBL0 and VCONWBL1.

Each of the write bit line current circuits WBLD is composed of a constant current source I, a switch circuit SW1, and a switch circuit SW2 which are connected in series between a power supply end and a common potential end. A connection node between the switch circuit SW1 and the switch circuit SW2 is connected to the common lines VCONWBL0 or VCONWBL1.

In the configuration shown in FIG. 65, two write bit line current circuits WBLD are connected to each of the common lines VCONWBL0 and VCONWBL1. Thus, a total of driving capabilities of the two write bit line current circuits WBLD may be large enough to allow to flow a required write current. Therefore, the driving capability of each of the write bit line current circuits WBLD may be ½ of one required to flow the write current. The driving capability used here denotes a current supply capability and a current drawing capability.

Also with the configuration shown in FIG. 65, a layout area occupied by a write bit line current circuit is reduced by a reduced number of write bit line current circuits WBLD.

Further, one write bit line current circuit WBLD can be provided for each of the common lines VCONWBL0 and VCONWBL1. This can reduce the layout area.

Figure 66:
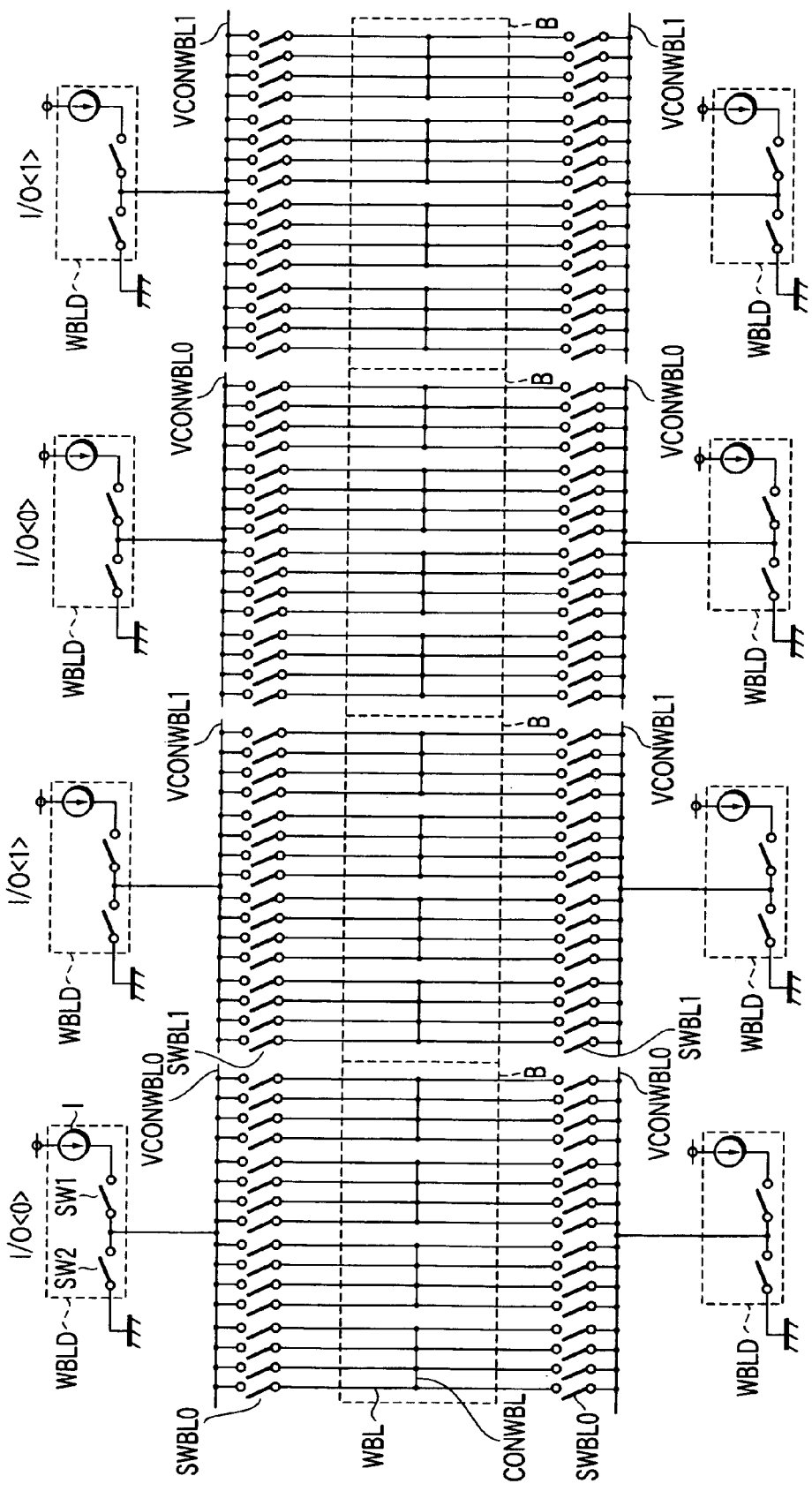
FIG. 66 is a diagram showing essential parts of a semiconductor memory device according to another example of the eleventh embodiment.

On the contrary, FIG. 66 shows a case in which connection lines for connecting write bit lines WBL are independent for each I/O block B. FIG. 66 shows essential parts of a semiconductor memory device according to another example of the eleventh embodiment.

As shown in FIG. 66, one set of common lines VCONWLB0 or one set of common lines VCONWBL1 are provided for each I/O block B. In addition, one write bit line current circuit WVLD is connected to a respective one of the common lines VCONWML0 and VCONWBL1. Each write bit line current circuit WBLD has a capability of driving a required write current.

In the configuration shown in FIG. 66, a distance between each write bit line current circuit WBLD and the corresponding I/O block B can be reduced to the minimum. Thus, resistance and parasitic capacitance of the wiring resistance between these circuit and block can be reduced. Therefore, influence caused by the wiring resistance can be limited to minimum, and a high speed write operation can be achieved. It is suffice that a total of two common lines VCONWBL0 or VCONWBL1 are allocated on the top and bottom of each I/O block. Thus, an area of the wiring region is reduced.

Figure 67:
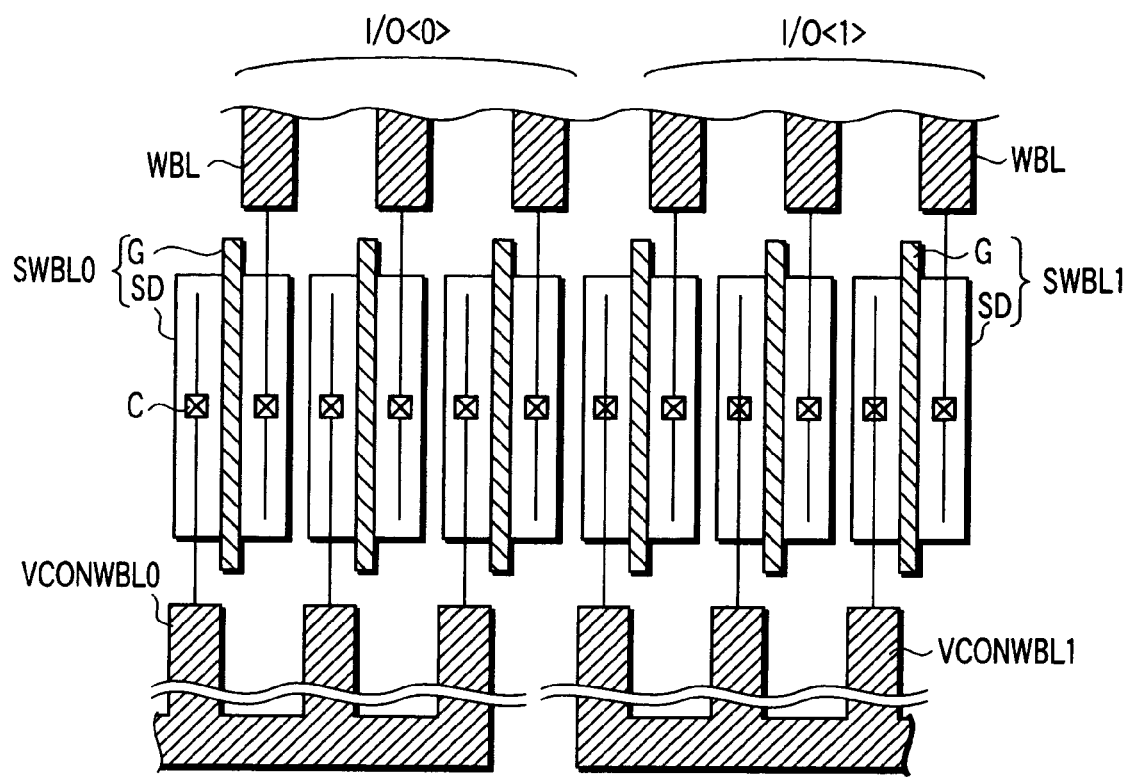
FIG. 67 is a diagram showing a layout of the semiconductor memory device according to the eleventh embodiment.

Now, a layout of the switch circuits SWBL0 and SWBL1 will be described here. FIG. 67 shows a layout of the semiconductor memory device according to the eleventh embodiment.

As shown in FIG. 67, a pair of source/drain diffusion regions SD configuring a part of one of the switch circuits SWBL0 and SWBL1 is independent of a pair of source/drain diffusion regions SD configuring a part of the other one of the switch circuits SWBL0 and SWBL1. One gate electrode G is provided between each pair of source/drain diffusion regions SD. The gate electrode G extends in the same direction as the write bit line WBL. One of each pair of the source/drain diffusion regions SD is electrically connected to the write bit line WBL, and the other one is electrically connected to the common line VCONWBL0 or VCOMWBL1.

Figure 68:
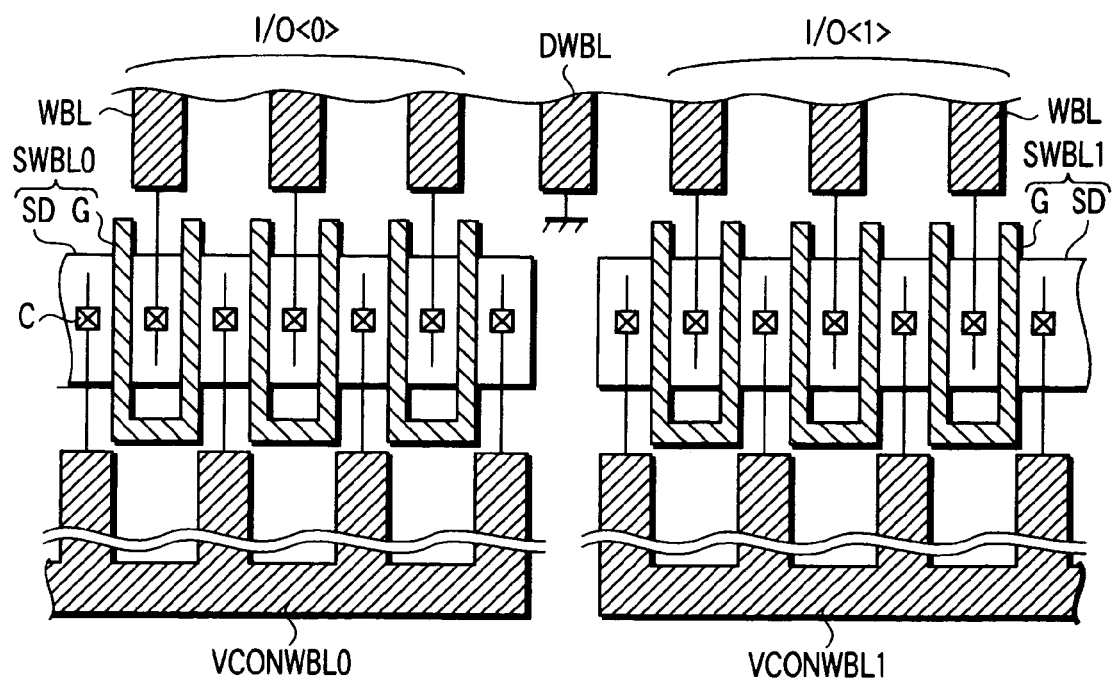
FIG. 68 is a diagram showing a layout of the semiconductor memory device according to another example of the eleventh embodiment.

One end of each of the switch circuits SWBL0 and SWBL1 which belong to the same I/O block B is connected to a respective one of the same common lines VCONWBL0 and VCONWBL1. Thus, the source/drain diffusion regions SD may be shared between the adjacent switch circuits SWBL0 and SWBL1 from the viewpoint of reduction of the parasitic capacitance of the source/drain diffusion layer regions SD and layout size reduction. FIG. 68 shows a layout of a semiconductor memory device according to another example of the eleventh embodiment.

As shown in FIG. 68, one source/drain diffusion region SD for switch circuits SWBL0 and SWBL1 is shared with a source/drain diffusion region SD for the adjacent switch circuits SWBL0 and SWBL1. That is, the source/drain diffusion region SD connected to the write bit line WBL is in line with another source/drain diffusion region with a gate electrode G is sandwiched between these regions. Two gate electrodes G extend in the same direction of the write bit line WBL at both of the right and left sides of a contact for the write bit line WBL, and these two gate electrodes G are realized by a common bended gate electrode. The gate electrodes G have such a structure, so that its layout can be reduced even without reducing a channel width of the switch circuit SWBL0 or SWBL1.

Between I/O blocks B, the source/drain diffusion regions SD need to be separated from each other. Thus, it is not necessary to allocate the write bit line WBL at the upper side in the drawing showing the separated region. However, it is desirable that the periodicity of wiring patterns is not deformed from the viewpoint of controllability in lithography process. Thus, a dummy bit line DWBL having the same pattern as the write bit line WBL is allocated to a separated portion of the I/O block B. In this manner, element isolating regions can be provided while the periodicity of memory cells is maintained.

While FIG. 68 shows a write bit line WBL or the like, it is desirable to allocate a via plug or the like at a portion of a dummy bit line DWBL in the same manner as ordinary memory cells, if possible, from the viewpoint of lithography. More than one dummy bit lines DWBL may be provided instead of single one. Further, the dummy bit line WBL is preferably connected to a common potential terminal to fix a potential.

The present embodiment shows an example in which the gate electrode G of the switch circuits SWBL0 and SWBL1 extends in parallel to the write bit line WBL in a plane. However, when a memory cell write current is sufficiently small, the gate electrode G can also extend along a direction orthogonal to the write bit line WBL in a plane. In that case as well, as is the case with FIG. 68, the dummy bit line DWBL can be provided, and a spare region generated by this allocation can be used for drawing the gate electrode G or a contact region for connection between the gate electrode G and an upper wiring.

Figure 69:
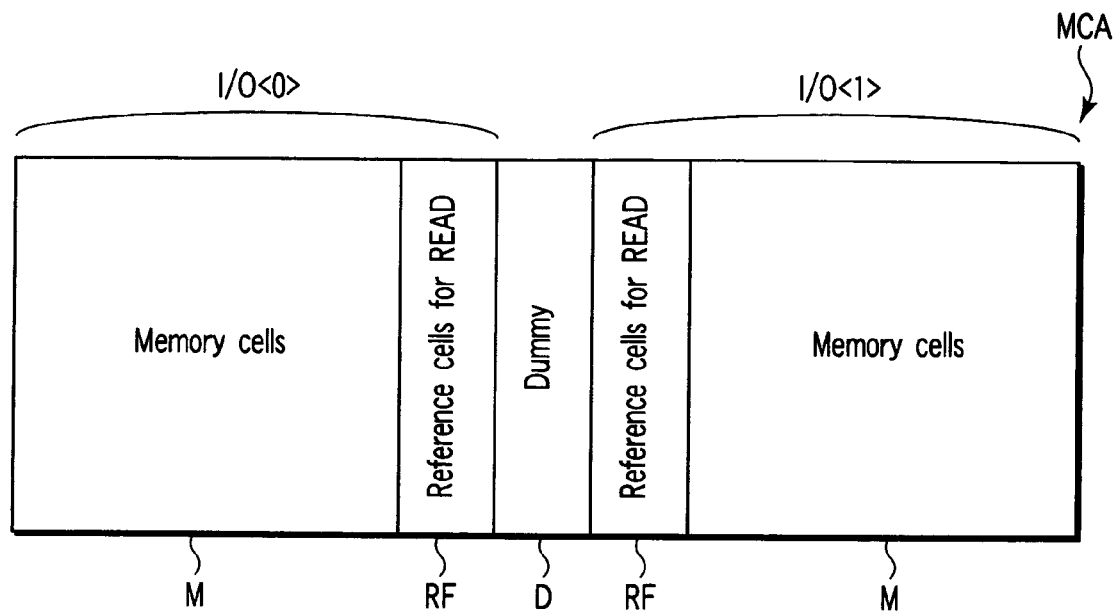
FIGS. 69 and 70 are diagrams each showing a semiconductor memory device according to another example of the eleventh embodiment.

As shown in FIG. 69, a region RF including reference cells for read may be provided between a region M including memory cells and a region D of the dummy bit line DWBL with the I/O block B as a border.

Figure 70:
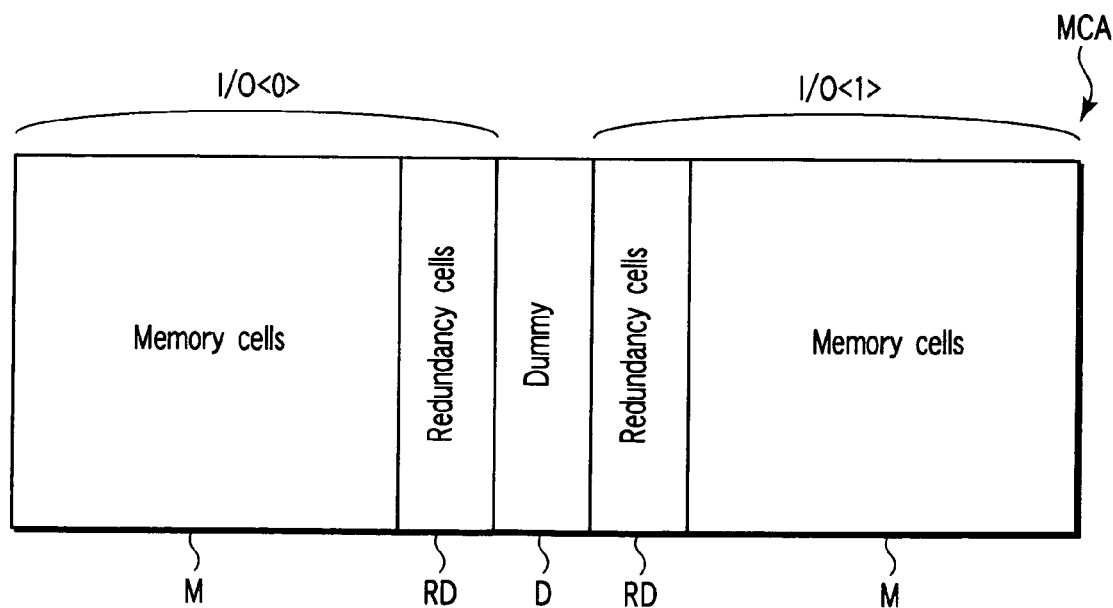

As shown in FIG. 70, a region RD including redundancy memory cells can be provided instead of the region RF. That these regions RF and RD is more desirable to exist inside of a memory cell array MCA than at an end of the memory cell array MCA from the viewpoint of lithography.

A layout of the layers other than the write bit lines WBL, for example of the MTJ elements MTJ, is desirable to be similar to ordinary memory cells as much as possible from the viewpoint of lithography.

While the present embodiment shows an example of using a constant current source, another write method may be possible.

With the semiconductor memory device according to the eleventh embodiment of the present invention, as in the first embodiment, write bit lines WBL are interconnected and/or write word lines WWL are interconnected. Thus, advantageous effect identical to that of the first embodiment can be attained.

Moreover, according to the eleventh embodiment, even when more than one I/Os are allocated to one memory cell array MCA, a peripheral circuit and a layout can be provided efficiently.

Twelfth Embodiment

A twelfth embodiment relates to a read operation.

Figure 71:
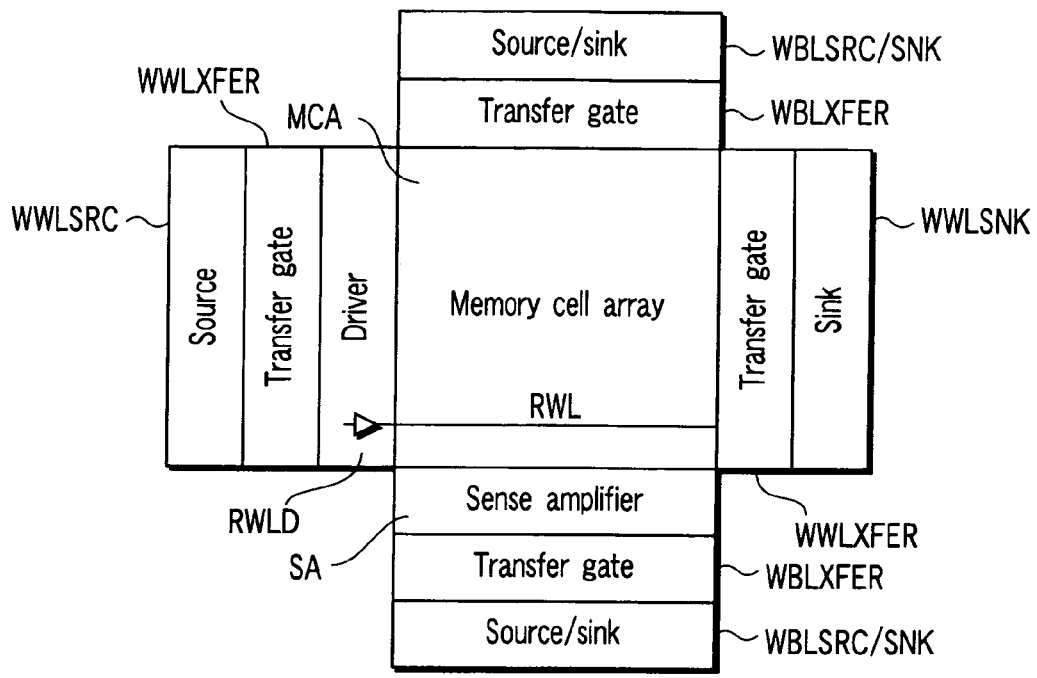
FIG. 71 is a diagram showing a layout of a semiconductor memory device according to a twelfth embodiment of the present invention.

FIG. 71 shows a layout of essential parts of a semiconductor memory device according to the twelfth embodiment of the present invention. As shown in FIG. 71, a read word line driver RWLD is provided to the left, for example, of a memory cell array MCA. That is, a read word line RWL is driven as a so-called single end configuration from one end of the read word line. Namely, the read word line RWL is shared by all the I/O blocks B contained in one memory cell array MCA. The read word line driver RWLD may be provided to the right side of the memory cell array MCA.

As an example, the read word line driver RWLD is still provided at one end of the memory cell array MCA and can be shared by the adjacent memory cell arrays MCA.

Figure 72:
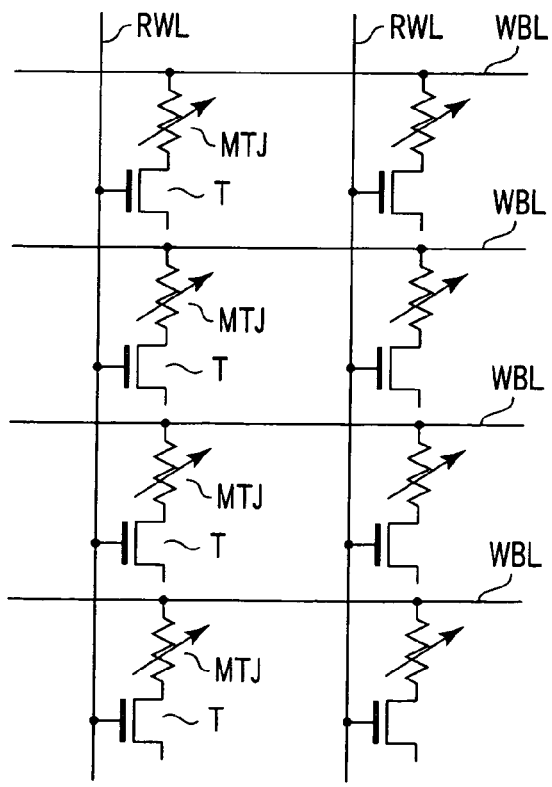
FIG. 72 is a diagram showing a read word line.

The read word line RWL, as shown in FIG. 72, is connected to a gate electrode of a selector transistor T which belongs to the same column (or lines) in a direction which is different from that of the write bit line WBL.

As shown in FIG. 71, a write word line WWL switch circuit (transfer gate, XFER) and a control circuit WWLXFER are provided at the left and right side of the memory cell array MCA. A write word line source and control circuit WWLSRC is provided outside of one circuit WWLXFER. A write word line sink and control circuit WWLSNK is provided at the outside of the other circuit WWLXFER.

A sense amplifier SA is provided, for example, at lower side of the memory cell array MCA. A write bit line switch circuit (transfer gate, XFER) and control circuit WBLXFER are provided at the upper and lower side of the memory cell array MCA. A write bit line source/sink circuit and control circuit WBLSRC/SNK are provided at the outside of the circuit WBLXFER. The sense amplifier SA may be provided at the upper side of the memory cell array MCA.

Figure 73:
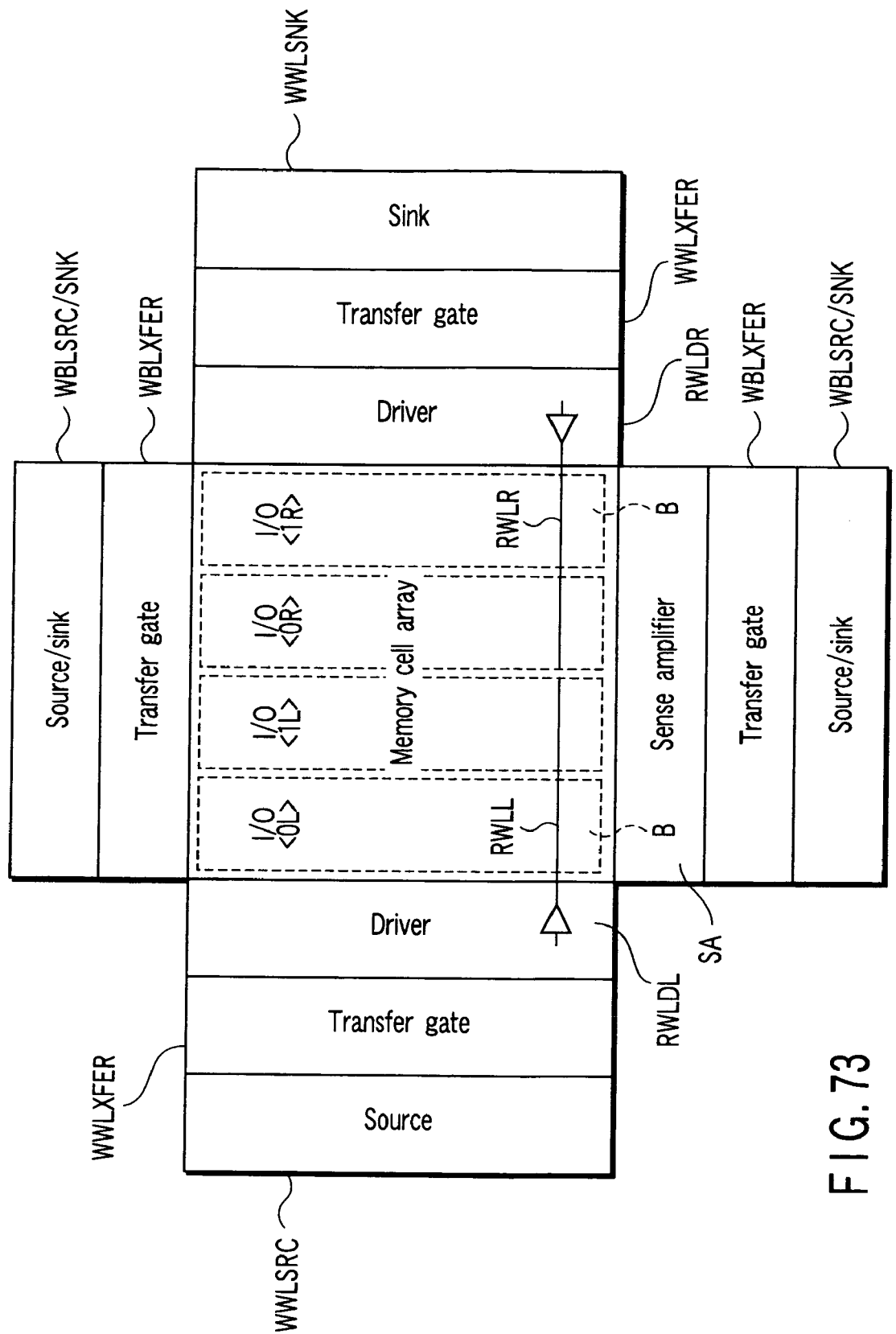
FIG. 73 is a diagram showing a layout of a semiconductor memory device according to another example of the twelfth embodiment.

Alternatively, when the memory cell array MCA is divided into more than I/O blocks like FIG. 63, for example, a configuration as shown in FIG. 73 can be employed. FIG. 73 shows a layout of essential parts of a semiconductor memory device according to another example of the twelfth embodiment.

As shown in FIG. 73, the memory cell array MCA is divided into four I/O blocks. I/O<0>, I/O<1>, I/O<0>, and I/O<1> are allocated to each block from the left, and they are described as I/O<0L>, I/O<1L>, I/O<0R>, and I/O<1R>.

The read word line RWL is separated between a block B to which I/O<1L> is allocated and a block B to which I/O<0R> is allocated. In addition, read word line drivers RWLDL and RWLDR are provided at the outside of the left and right side of the memory cell array MCA, respectively. The left read word line RWLL is driven by the read word line driver RWLDL. The right read word line RWLR is driven by the read word line driver RWLDR.

FIG. 73 shows a case in which one memory cell array MCA is divided in accordance with the same rule as that shown in FIG. 63. Also in the case where more than one I/Os are used, however, the read word lines RWLL and RWLR and the read word line drivers RWLDL and RWLDR can be provided as shown in FIG. 73.

With the semiconductor memory device according to the twelfth embodiment of the present invention, as in the first embodiment, write bit lines WBL are interconnected and/or write word lines WWL are interconnected. Thus, advantageous effect identical to that of the first embodiment can be attained.

In addition, the configuration shown in FIG. 73 according to the present embodiment can make the length of the read word line RWL half of that of FIG. 71. Thus, the wiring capacitance (parasitic capacitance) and the wiring resistance are ½, which realizes a higher read word line speed.

Also, according to the configuration shown in FIG. 73, independent control is possible at the left portion and right portion of the memory cell array MCA, thus enabling a so-called interleave operation at the left and right of the memory cell array. Namely, a read operation is possible alternately at the left and right of the memory cell array in an interleave operation.

Moreover, according to the configuration shown in FIG. 73, for example, when a semiconductor memory device adopts a toggle type MTJ, the following advantage can be attained. In the toggle write scheme, a read operation needs to be made before a write operation, i.e., a so-called Read before Write operation is required. According to the configuration shown in FIG. 73, the read operation and the write operation is possible independently between the left portion and the right portion of the memory cell array MCA in interleave operation. Thus, in the toggle write scheme, while the write operation is made at one portion of the memory cell array MCA, the read operation can be made at the same time to prepare for the write operation at the other portion.

Thirteenth Embodiment

A thirteenth embodiment relates to an operation of a switch circuit (transfer gate) for connecting write lines and common lines (common power lines) which interconnect write lines.

It is desirable that a potential of a write line is fixed to a specific potential, for example, a common potential or the like in a unselected state, a standby state or the like in a write operation. On the other hand, from the viewpoint of a switching noise or current consumption, it is desirable that fewer transfer gates make a switching operation at the same time. Of course, it is desirable that a circuit configuration is as simple as possible from the viewpoint of a chip size and the like. Hereinafter, a description will be given with respect to the present embodiment configured in consideration of these matters.

[In the Case where a Current Flows in a Write Line in a Unidirectional Manner]

First, a description will be given with respect to a write line in which a current flows in a unidirectional manner regardless of information to be written. A description to such write lines will be given taking write word lines WWL as an example.

When a toggle write is employed, a write current flows in one direction in both of the write word lines WWL and write bit lines WBL regardless of write data. Therefore, in such a case, the following configuration can be applied to the write bit line WBL as well.

Figure 74:
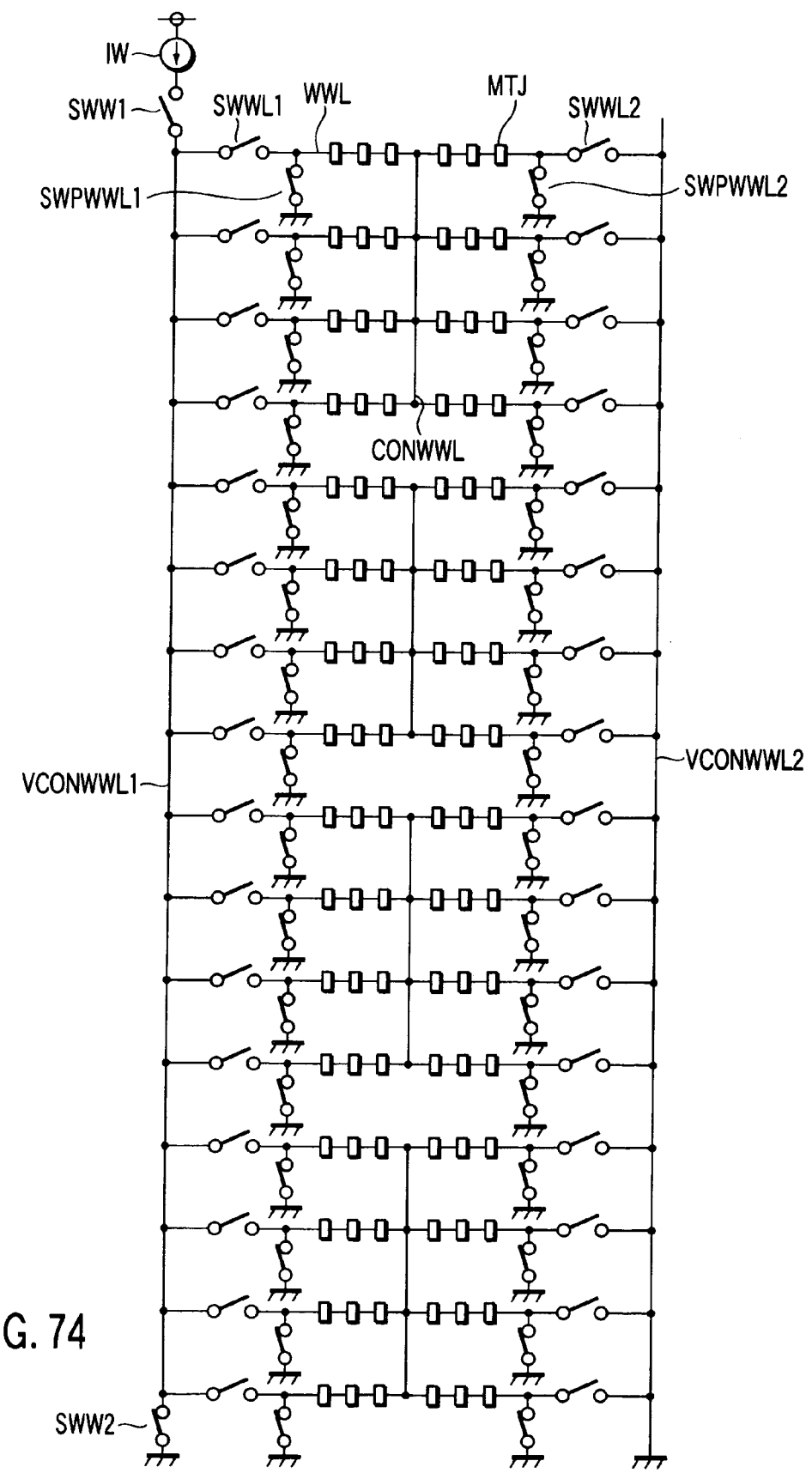
FIG. 74 is a diagram showing a state of a semiconductor memory device according to a first example of a thirteenth embodiment.
Figure 75:
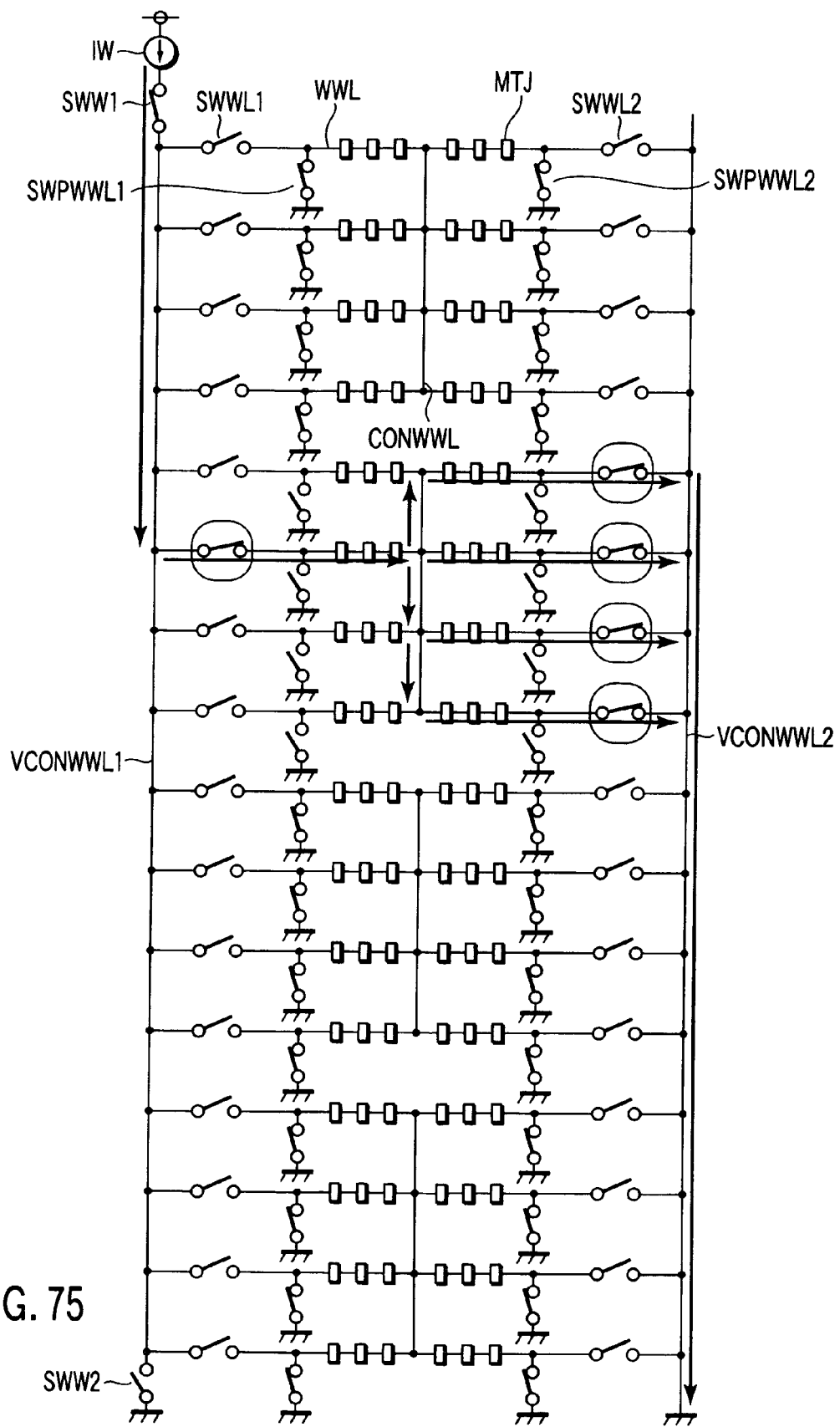
FIGS. 75 and 76 are diagrams each showing a state of the semiconductor memory device according to the first example of the thirteenth embodiment.
Figure 76:
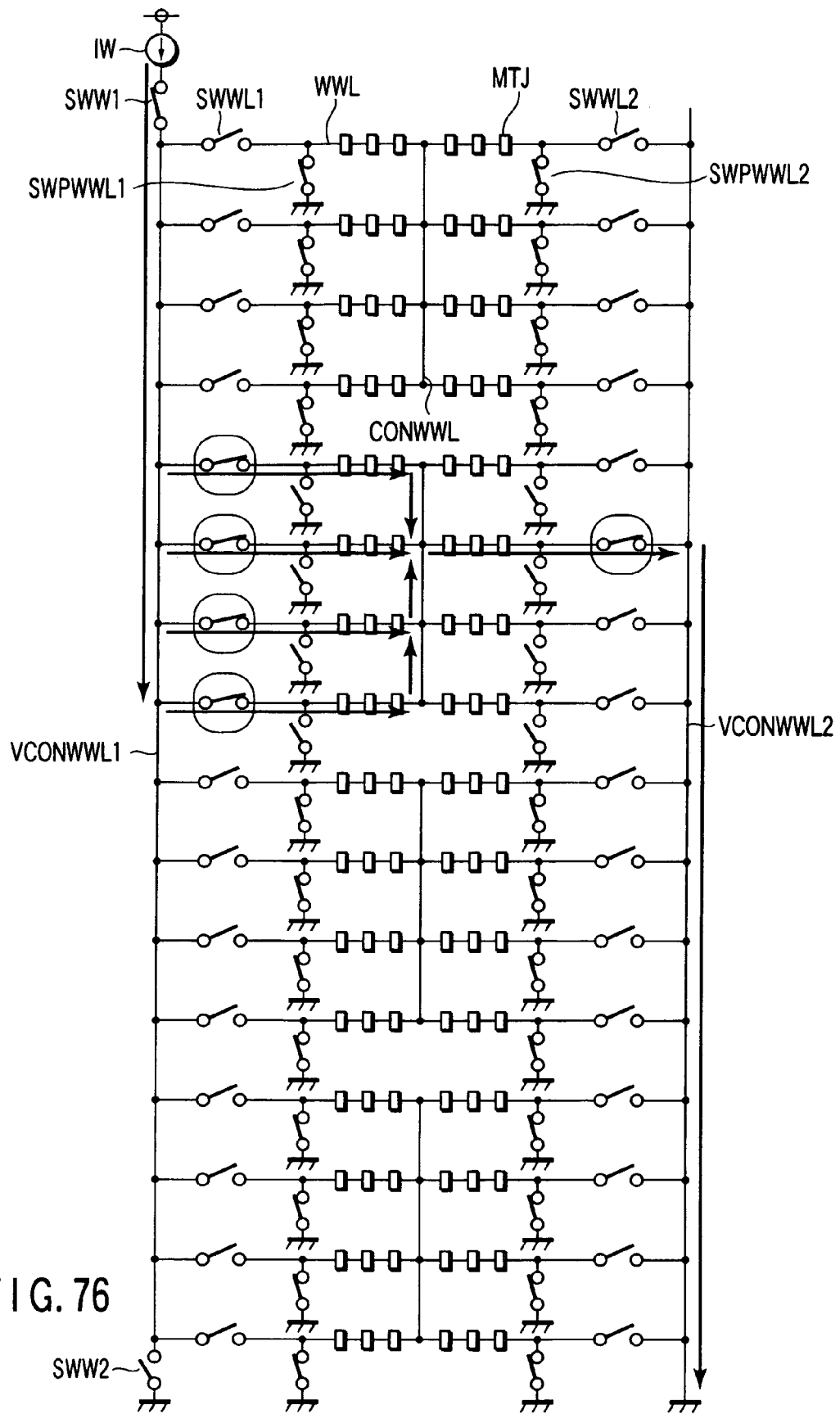

FIGS. 74 to 76 each shows a semiconductor memory device according to a first example of the thirteenth embodiment of the present invention. FIGS. 74, 75 and 76 show a standby state, when data is written into an MTJ element MTJ at the left side of a connection line CONWWL, and when data is written into an MTJ element MTJ at the right side of the connection line CONWWL, respectively. FIGS. 75 and 76 each shows an example of making a write operation for an MTJ element MTJ in a second top interconnected unit in the drawings.

As shown in FIGS. 74 to 76, write word lines WWL (for example, four lines) passing through MTJ elements MTJ are connected by the connection line CONWWL. One end of each write line WWL is connected to a common line VCONWWL1 via a switch circuit (transfer gate) SWWL1 composed of, for example, a transistor. One end of the common line VCONWWL1 is connected to a constant current source IW via a switch circuit SWW1 composed of, for example, a transistor, and the other end is connected to a common potential end via a switch circuit SWW2 composed of, for example, a transistor.

The other end of each write word line WWL is connected to a common line VCONWWL2 via a switch circuit (transfer gate) SWWL2 composed of, for example, a transistor. The common line VCONWWL2 is also connected to a common potential end.

A connection node between one end of each write word line WWL and the switch circuit SWWL1 is connected to a specific potential end (for example, common potential end) via the switch circuit SWPWWL1 composed of, for example, a transistor.

A connection node between the other end of each write line WWL and the switch circuit SWWL2 is connected to a specific potential end (for example, common potential end) via the switch circuit SWPWWL2 composed of, for example, a transistor.

As shown in FIG. 74, in a standby state, all the switch circuits SWPWWL1 and SWPWWL2 are turned on, and all the switch circuits SWWL1 and SWWL2 are turned off. As a result, all the write word lines WWL are fixed to a common potential. The switch circuit SWW1 is turned off, and the switch circuit SWW2 is turned on.

During a write operation, as shown in FIGS. 75 and 76, the common line VCONWWL1 is electrically disconnected from the common potential, and is connected to the constant current source IW. In a selected interconnected unit, all the switch circuits SWPWWL1 and SWPWWL2 are turned off.

When data is written into the MTJ element MTJ at the left side of the connection line CONWWL, write operation is carried out as shown in FIG. 75. That is, in an interconnected unit including a selected MTJ element MTJ, the switch circuit SWWL1 connected to the selected write word line WWL and all the switch circuits SWWL2 are turned on. As a result, a write current as indicated by the arrow flows. As for the number of switch circuits (enclosed in circle) which operates at this time, a total of five switch circuits SWWL1 and SWWL2 operate, and a total of eight switch circuits SWPWWL1 and SWPWWL2 operate.

When data is written into the MTJ element MTJ at the right side of the connection line CONWWL, write operation is carried out as shown in FIG. 76. That is, in an interconnected unit including a selected MTJ element MTJ, all the switch circuits SWWL1 and the switch circuit SWWL2 connected to the selected write word line WWL are turned on. As a result, a write current as indicated by the arrow flows. As for the number of switch circuits (enclosed in circle) which operate at this time, a total of five switch circuits SWWL1 and SWWL2 operate, and a total of eight switch circuits SWPWWL1 and SWPWWL2 operate.

In this manner, a total of five switch circuits SWWL1 and SWWL2 operate, and a total of eight switch circuits SWPWWL1 and SWPWWL2 operate regardless of a position of the selected MTJ element. Thus, a switching noise can be reduced to the minimum and low current consumption can be achieved.

In FIGS. 74 to 76, the switch circuits SWPWWL1 and SWPWWL2 are connected to both ends of write word lines WWL. However, a similar operation can be made even if only either of these switch circuits is connected. In one interconnected unit, the switch circuits SWPWWL1 and SWPWWL2 are not provided for all the write word lines WWL, but only one of the switch circuits may be provided at least for one write word line WWL, thereby enabling a similar operation. By doing this, the number of switch circuits operating at the time of a write operation further decreases.

A second example of the present embodiment will be described with reference to FIGS. 77 to 79. In the example shown in FIGS. 74 to 76, a potential of the write word line WWL is fixed by the switch circuits SWPWWL1 and SWPWWL2 provided for each write word line WWL. In contrast, in the present example, a potential of a write word line WWL during a standby mode is fixed without using such a switch circuit. The present example utilizes the fact that one of two common lines can always be set to a common potential because only a write current flows in a write line (write word line WWL) in only one direction.

Figure 77:
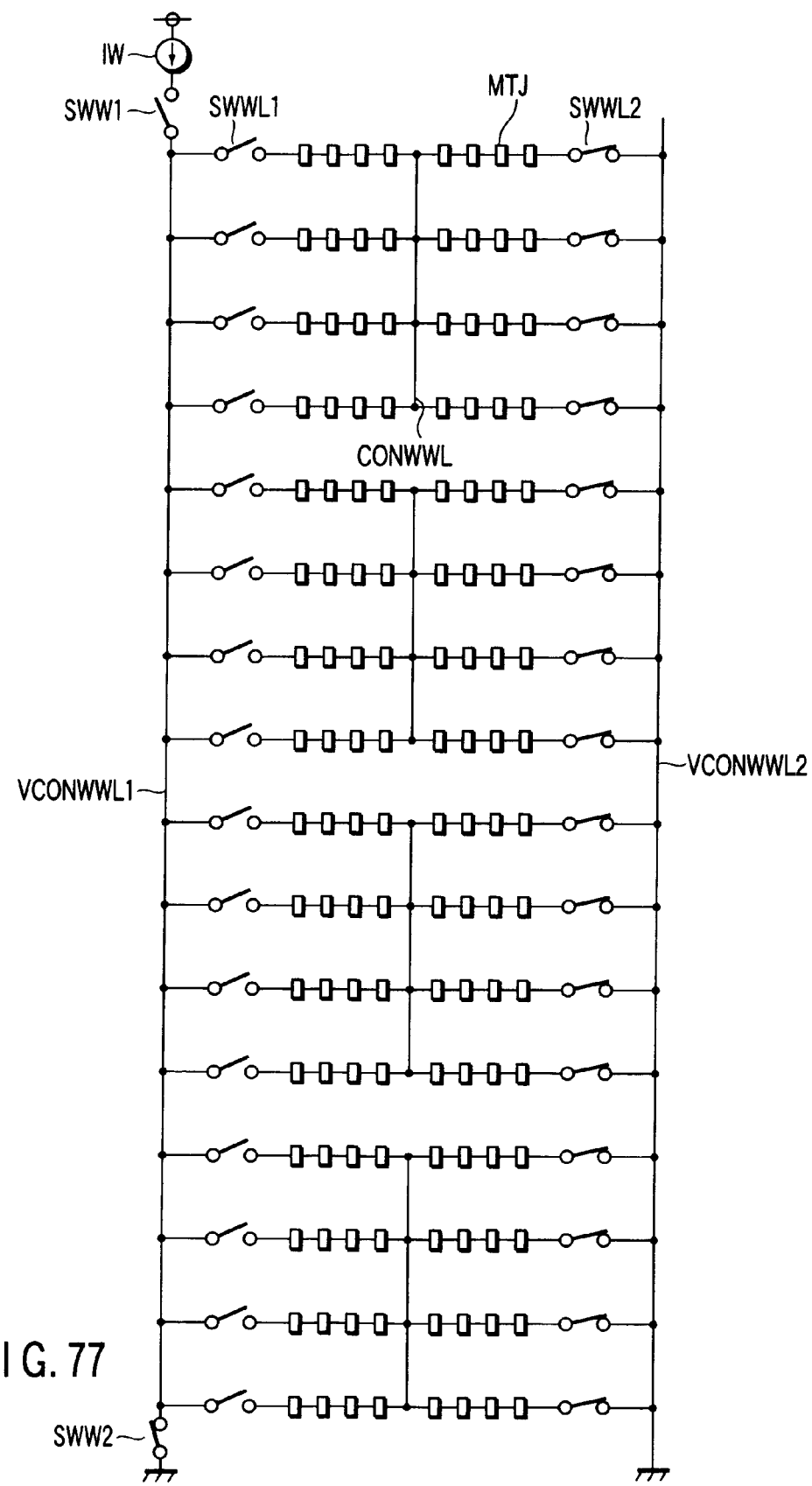
FIGS. 77, 78 and 79 are diagrams each showing a state of a semiconductor memory device according to a second example of the thirteenth embodiment.
Figure 78:
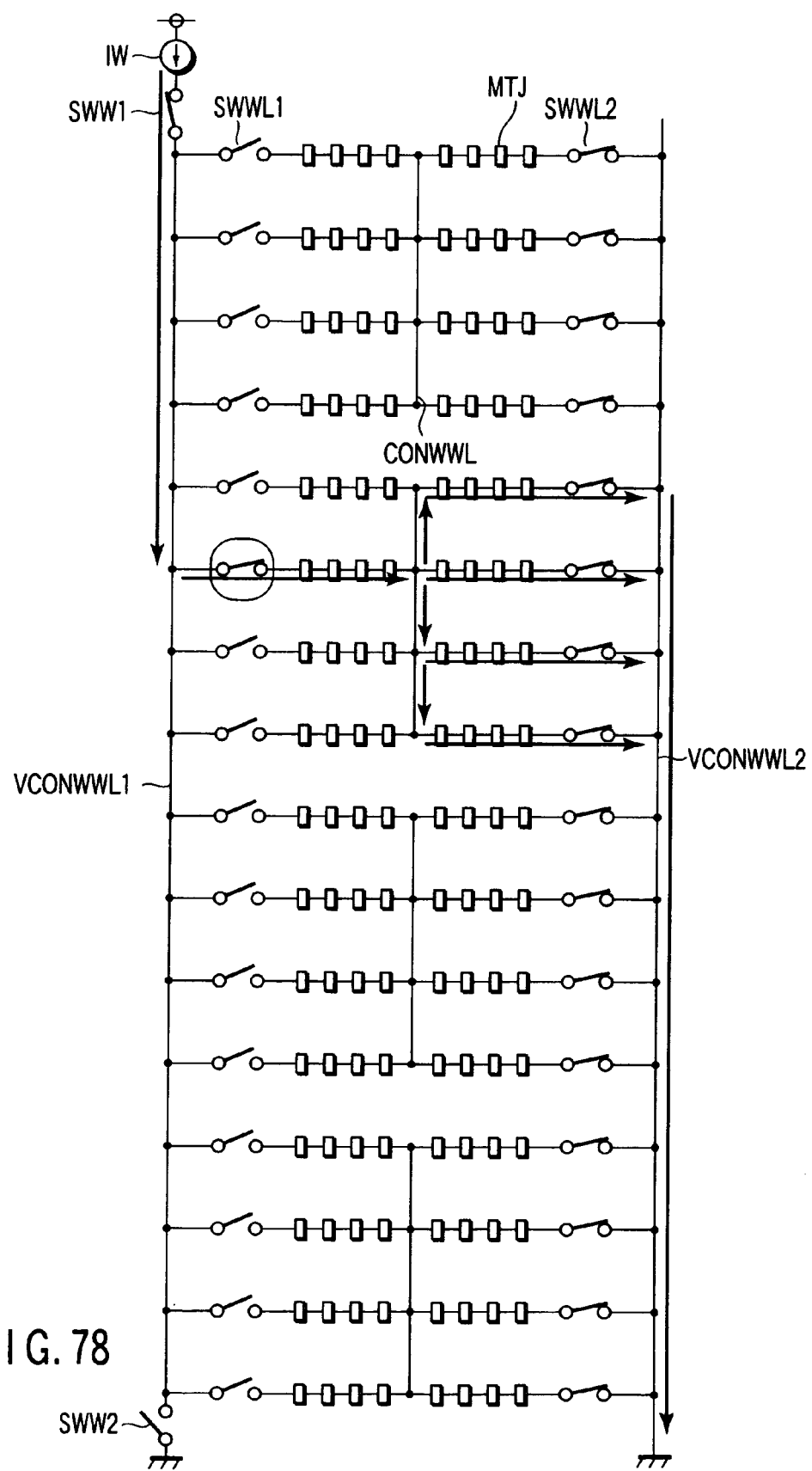
Figure 79:
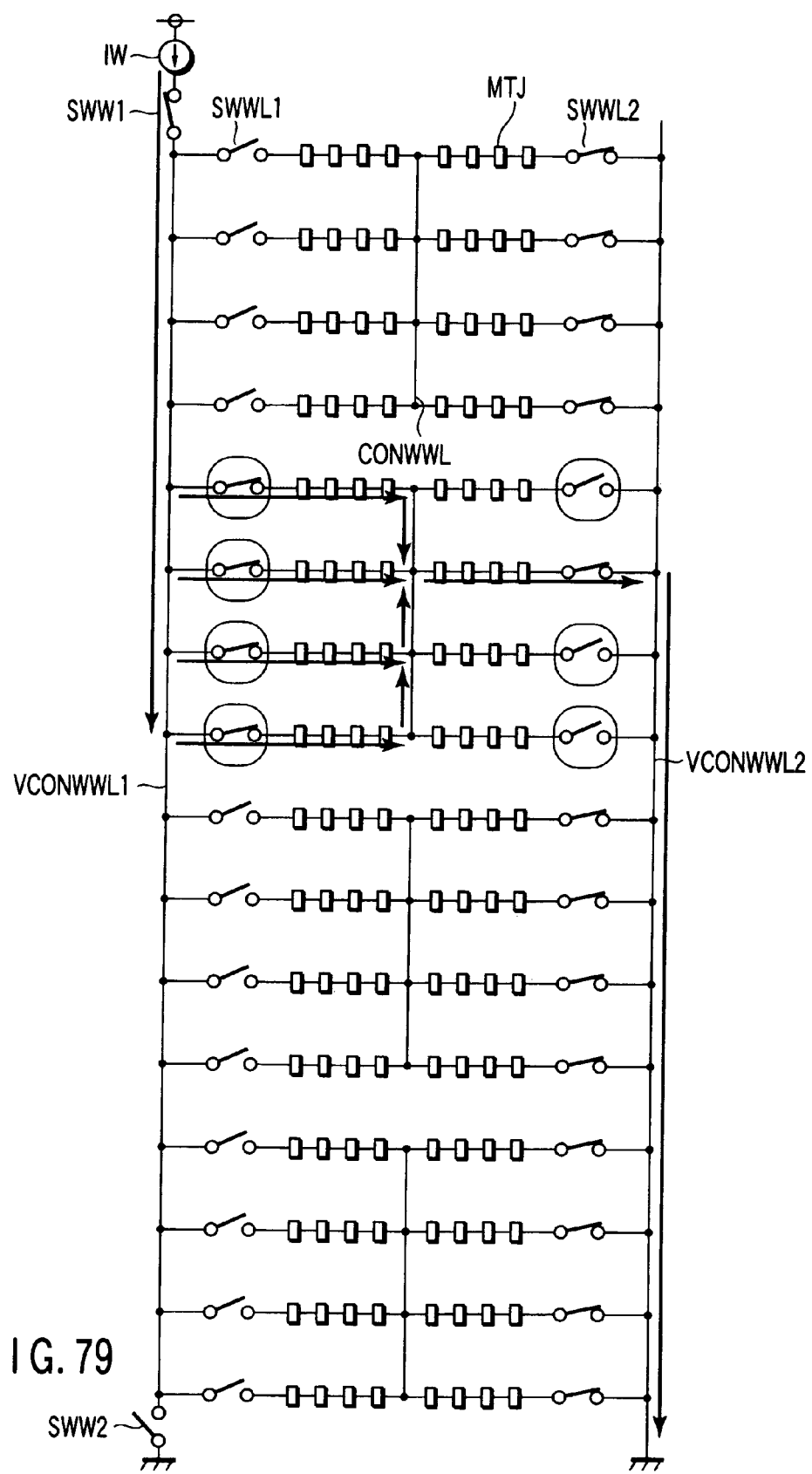

FIGS. 77 to 79 each shows a semiconductor memory device according to the second example of the thirteenth embodiment. FIGS. 77, 78 and 79 show a standby state, when data is written into an MTJ element MTJ at the left side of a connection line CONWWL, and when data is written into an MTJ element MTJ at the right side of the connection line CONWWL, respectively. FIGS. 78 and 79 each illustrates a write operation for an MTJ element MTJ in a second top interconnected unit in the drawings.

As shown in FIGS. 77 to 79, the configurations are identical to FIGS. 77 to 79 without the switch circuits SWPWWL1 and SWPWWL2. As shown in FIG. 77, in a standby state, all the switch circuits SWWL1 are turned off, and all the switch circuits SWWL2 are turned on. As a result, all the write word lines WWL are connected to a common line VCONWWL2 set to a common potential, and the potential of write word lines WWL is fixed to the common potential.

When data is written into the MTJ element MTJ at the left side of the connection line CONWWL, write operation is carried out as shown in FIG. 78. That is, the switch circuit SWWL1 connected to a selected write word line WWL is turned on. As a result, a write current as indicated by the arrow flows. At this time, only one switch circuit SWWL1 (enclosed in circuit) operates.

When data is written into the MTJ element MTJ at the right side of the connection line CONWWL, write operation is carried out as shown in FIG. 79. That is, in a selected interconnected unit, all the switch circuits SWWL1 are turned on, and the switch circuits SWWL2 connected to all the word lines WWL other than the selected write word line WWL are turned off. As a result, a write current as indicated by the arrow flows. A total of seven switch circuits (enclosed in circuit) consisting of four switch circuits SWWL1 and three switch circuits SWWL2 operate at this time.

As described above, one or seven switch circuits operate according to the position of the selected MTJ element MTJ. Thus, a switching noise can be reduced to the minimum and low current consumption can be achieved.

[In the Case where a Current Flows in a Write Line in a Bidirectional Manner]

Now, a description will be given to write lines in which a current can flow in two direction in accordance with information to be written. A description to such write lines will be described taking such write lines as an example.

Figure 82:
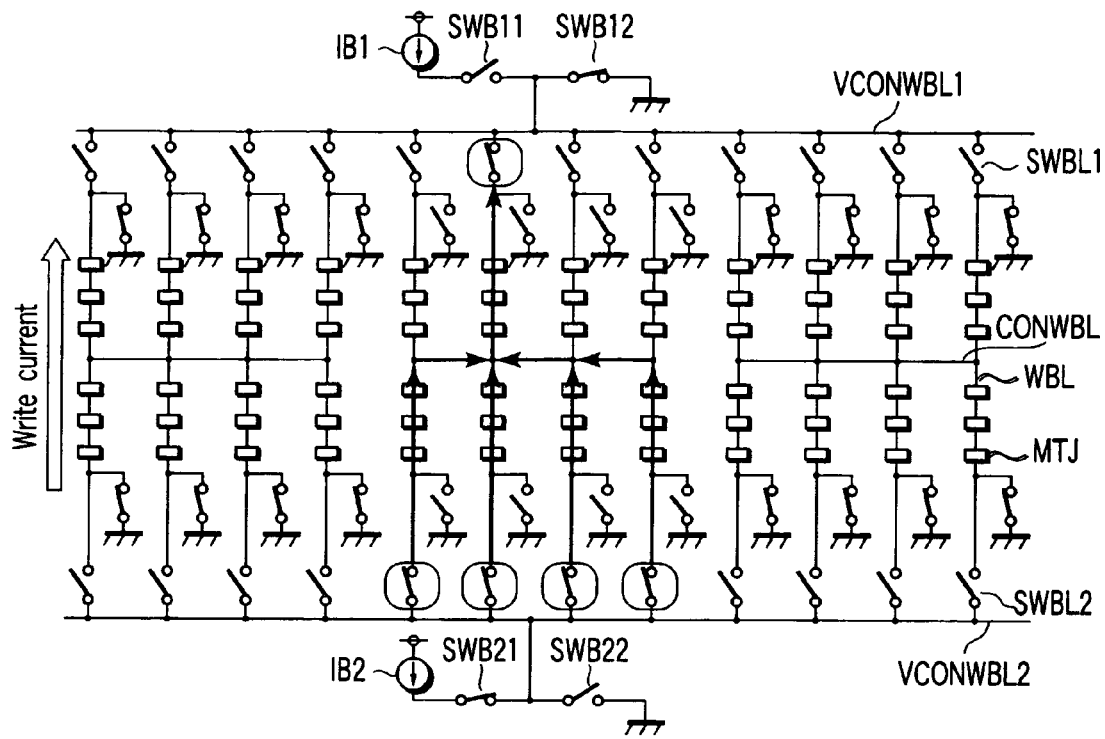

FIGS. 80 to 84 each shows a semiconductor memory device according to a third example of the thirteenth embodiment of the present invention. FIG. 80 shows a standby state. FIGS. 81 and 82 each shows a case when data is written into an MTJ element MTJ at the upper side of a connection line CONWBL. FIG. 81 shows a case in which a write current flows from the top to the bottom of the figure, and FIG. 82 shows a case in which a write current flows from the bottom to the top of the figure.

Figure 83:
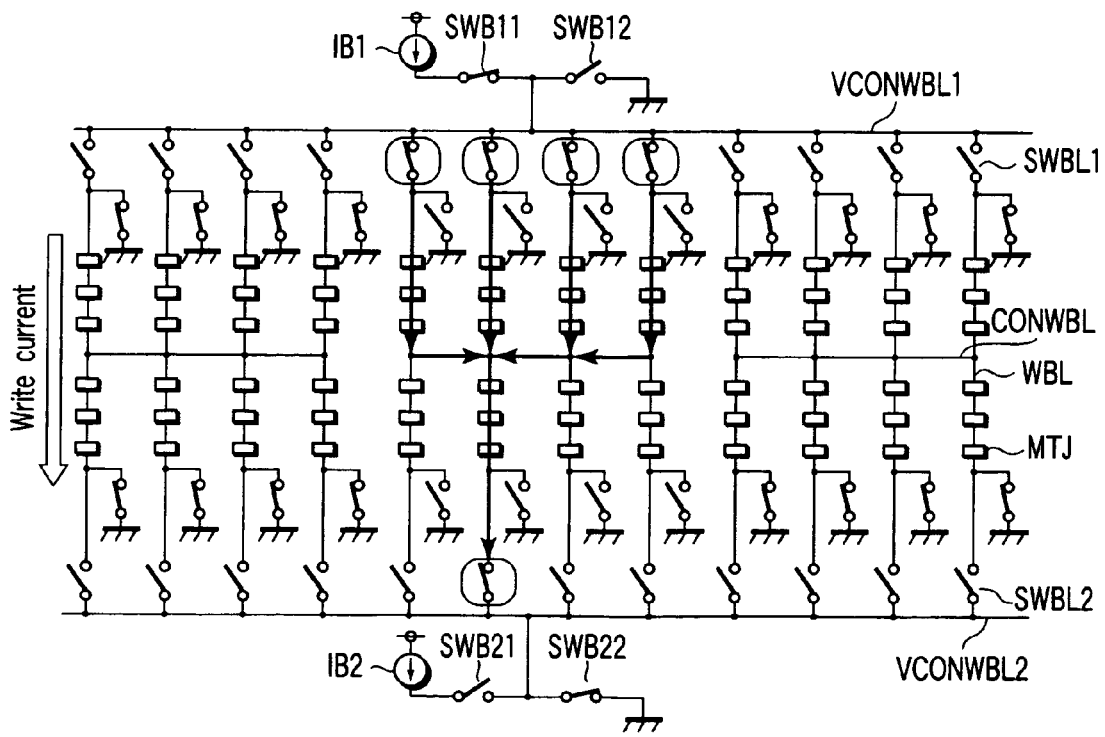
Figure 84:
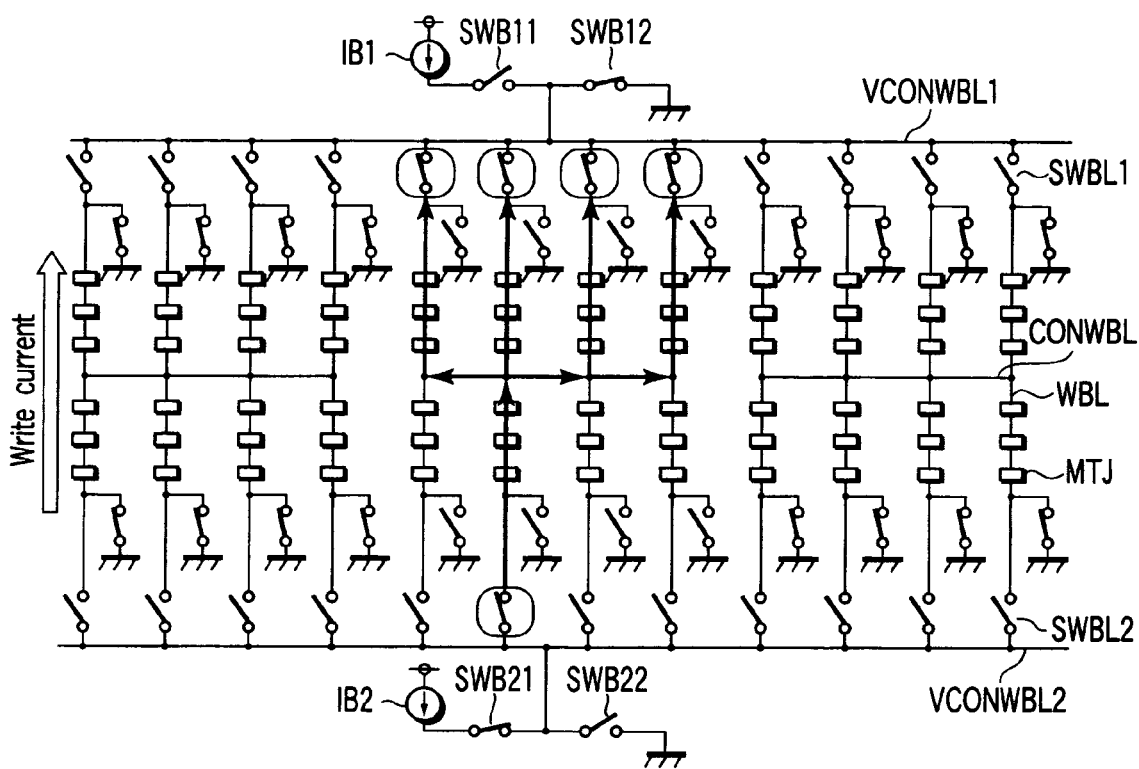

FIGS. 83 and 84 each shows a case when data is written into an MTJ element MTJ at the lower side of the connection line CONWBL. FIG. 83 shows a case in which a write current flows from the top to the bottom in the drawing, and FIG. 84 shows a case in which a write current flows from the bottom to the top in the drawing.

FIGS. 81 and 84 each shows an example of a write operation for an MTJ element MTJ in an interconnected unit at the center of the figure.

As shown in FIGS. 80 to 84, write bit lines WBL (for example, four lines) passing through MTJ elements MTJ are connected by a common line VCONWBL. One end of each write line WBL is connected to a common line VCONWBL1 via a switch circuit (transfer gate) SWBL1 composed of, for example, a transistor. The common line VCONWBL1 is also connected to a constant current source IB1 via a switch circuit SWB11 composed of, for example, a transistor, and is connected to a common potential end via a switch circuit SWB12 composed of, for example, a transistor.

The other end of each write line WBL is connected to a common line VCONWBL2 via a switch circuit (transfer gate) SWBL2 composed of, for example, a transistor. The common line VCONWBL2 is also connected to a constant current source IB2 via a switch circuit SWB21 composed of, for example, a transistor, and is connected to a common potential end via a switch circuit SWB22 composed of, for example, a transistor.

Each connection node between one end of each write bit line WBL and the switch circuit SWBL1 and each connection node between the other end of each write bit line WBL and the switch circuit SWBL2 are connected to a specific potential end (for example, common potential end) via a switch circuit SWPWBL composed of, for example, a transistor.

As shown in FIG. 80, in a standby state, all the switch circuits SWPWBL are on, and all the switch circuits SWBL1 and SWBL2 are off. As a result, all the write bit lines WBL are fixed to a common potential. In addition, the switch circuits SWB11 and SWB21 are off, and the switch circuits SWB12 and SWB22 are on.

When data is written in the MTJ element MTJ at the upper side of the connection line CONWBL by a write current flowing from the top to the bottom, the common line VCONWBL1 is disconnected from the common potential end, and is connected to a constant current source IB1, as shown in FIGS. 81 and 83. When data is written in the MTJ element MTJ at the upper side of the connection line CONWBL by a write current flowing from the bottom to the top, the common line VCONWBL2 is disconnected from the common potential end, and is connected to a constant current source IB2, as shown in FIGS. 82 and 84.

Further, when data is written into a selected MTJ element MTJ at the upper side of the connection line CONWBL, all the switch circuits SWPWBL are turned off in a selected interconnected unit, as shown in FIGS. 81 and 82. In the selected interconnected unit, the switch circuit SWBL1 connected to a selected write bit line WBL and all the switch circuits SWBL2 are turned on. As a result, a write current as indicated by the arrow flows. As for the number of switch circuits (enclosed in circle) operating at this time, a total of five switch circuits SWBL1 and SWBL2 and a total of eight switch circuits SWPWWL operate.

On the other hand, when data is written into a selected MTJ element MTJ at the lower side of the connection line CONWBL, all the switch circuits SWPWBL are turned off in a selected interconnected unit, as shown in FIGS. 83 and 84. In the selected interconnected unit, all the switch circuits SWBL1 and a switch circuit SWBL2 connected to a selected write bit line WBL are turned on. As a result, a write current as indicated by the arrow flows. As for the number of switch circuits (enclosed in circle) operating at this time, a total of five switch circuits SWBL1 and SWBL2 and a total of eight switch circuits SWPWWL operate.

[In the Case of Considering More than One I/Os]

As in the tenth embodiment (FIG. 63), when I/O<0> and I/O<1> are allocated to a respective one of sub-arrays SMCA with a connection line CONWBL as a border, an operation can be carried out as follows.

Figure 85:
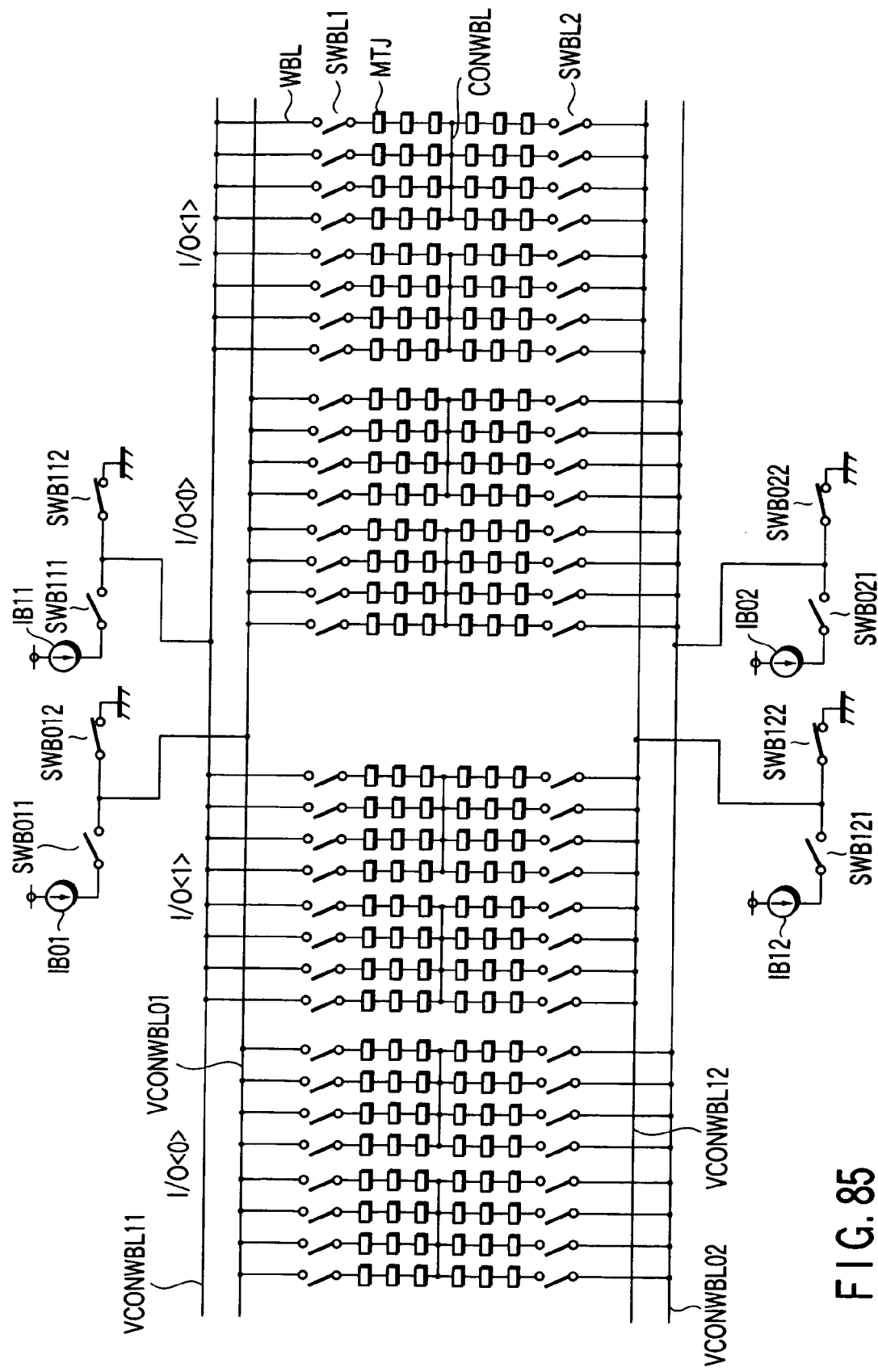
Figure 87:
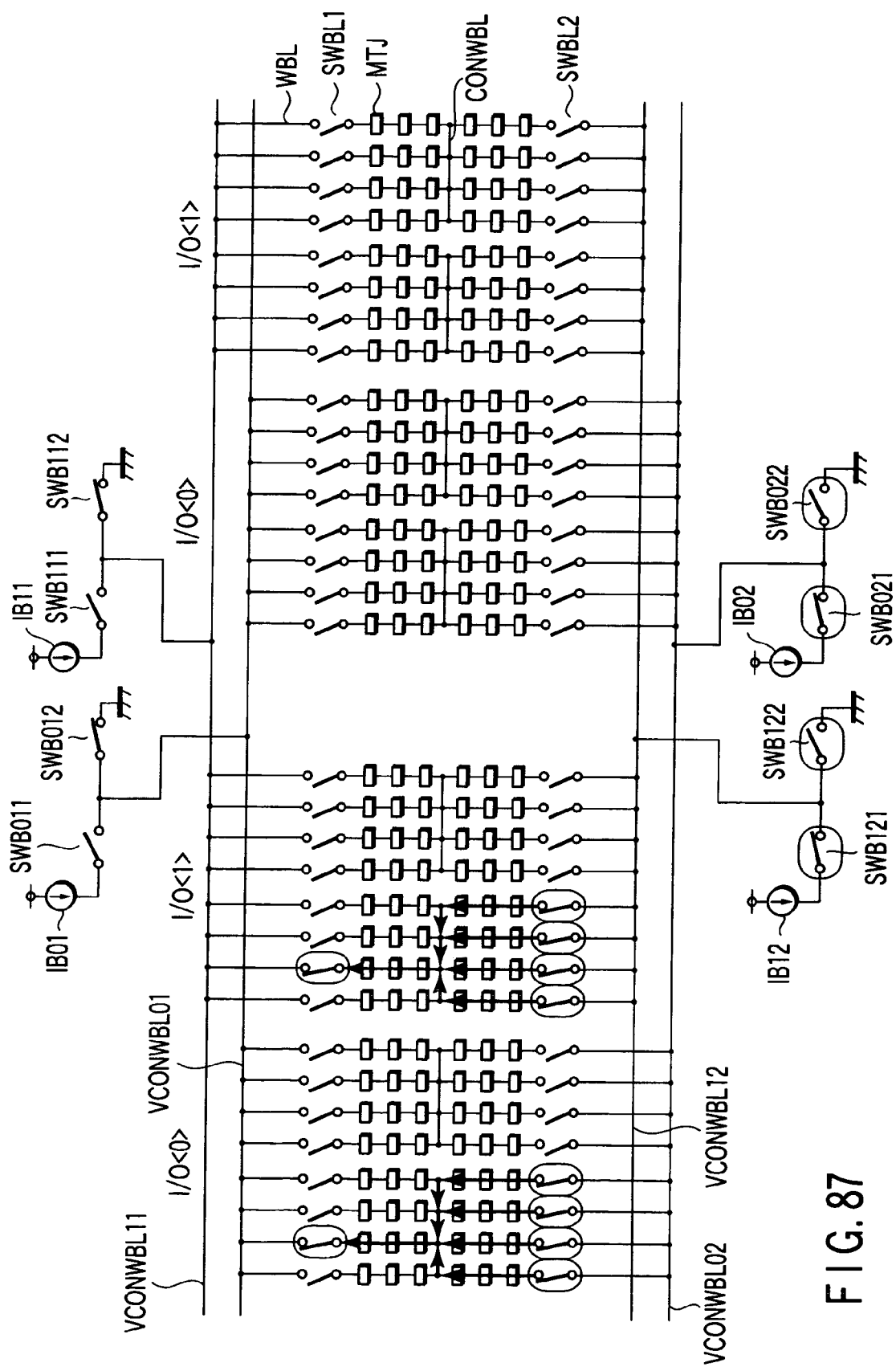
Figure 88:
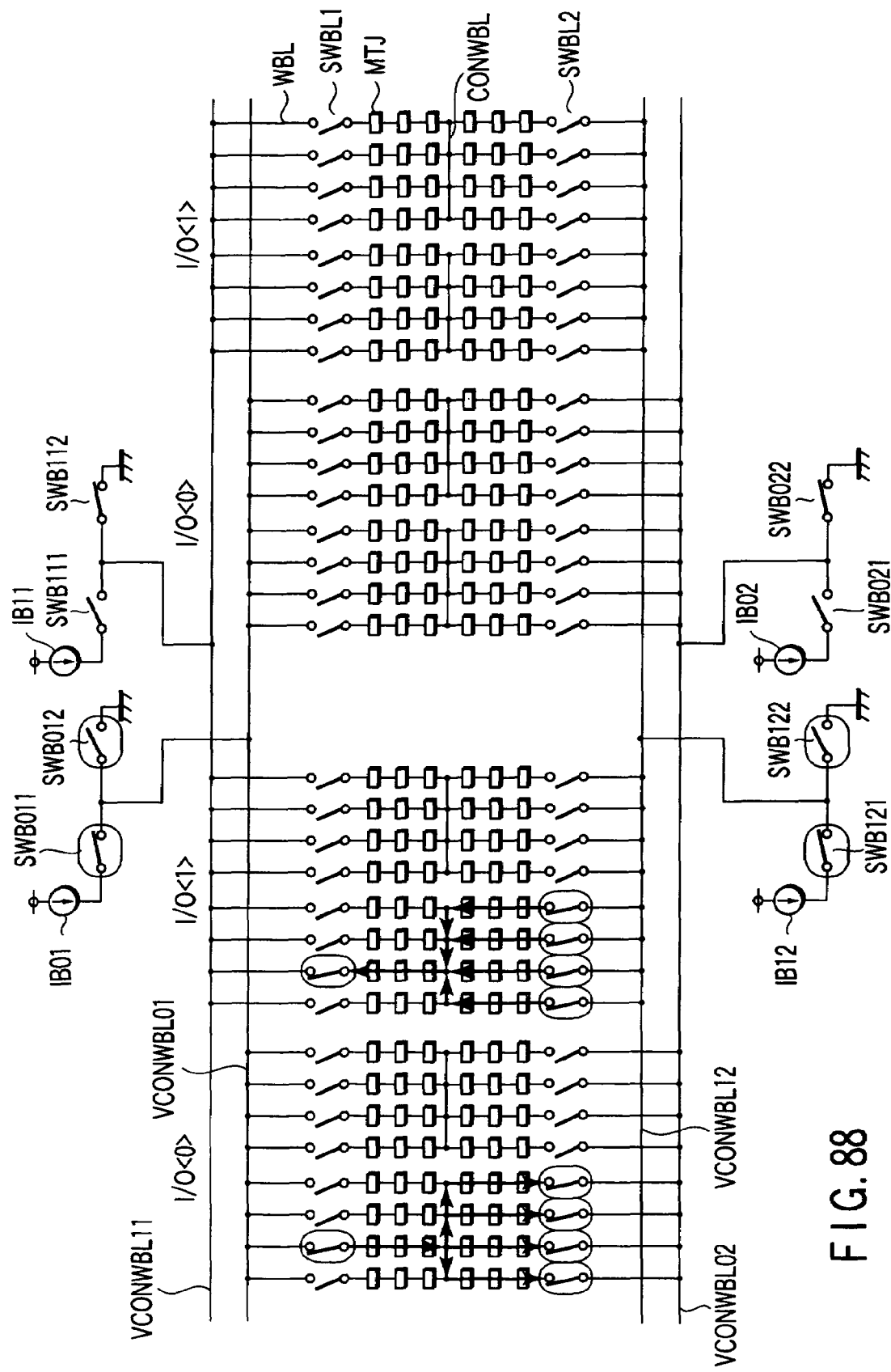
Figure 92:
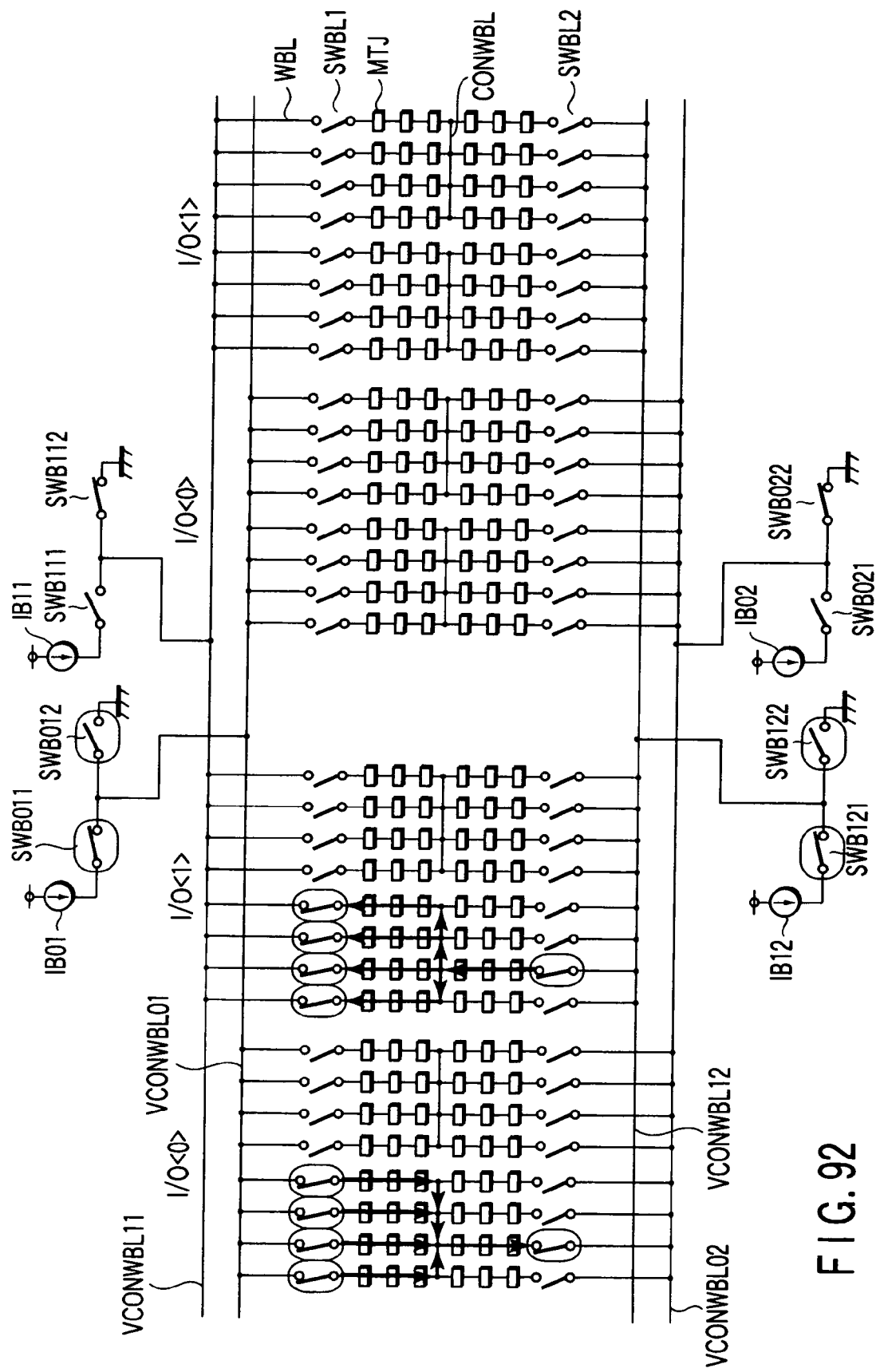

FIGS. 85 to 93 each shows a semiconductor memory device according to a fourth example of the thirteenth embodiment of the present invention. FIG. 85 shows a standby state. FIGS. 86 to 89 each shows a case in which data is written into a selected MTJ element MTJ at the upper side of a connecting line CONWBL. FIGS. 90 to 93 each shows a case in which data is written into a selected MTJ element MTJ at the lower side of the connection line CONWBL.

As shown in FIGS. 85 to 93, configurations obtained by combining FIGS. 80 and 63 are provided. One end of each write bit line WBL which belongs to an I/O block to which I/O<0> is allocated, and the other end thereof are connected to the common lines VCONWBL01 and VCONWBL02, respectively, via the switch circuits (transfer gates) SWBL1 and SWBL2 composed of, for example, transistors.

One end of each write bit line WBL which belongs to an I/O block to which I/O<1> is allocated, and the other end thereof are connected to the common lines VCONWBL11 and VCONWBL12, respectively, via the switch circuits (transfer gate) SWBL1 and SWBL2 composed of, for example, transistors.

The common line VCONWBL01 is connected to a constant current source IB01 via a switch circuit SWB011 composed of, for example, a transistor, and the other end thereof is connected to a common potential end via a switch circuit SWB012 composed of, for example, a transistor.

The common line VCONWBL02 is connected to a constant current source IB02 via a switch circuit SWB021 composed of, for example, a transistor, and the other end thereof is connected to the common potential end via a switch circuit SWB022 composed of, for example, a transistor.

The common line VCONWBL11 is connected to a constant current source IB11 via a switch circuit SWB111 composed of, for example, a transistor, and the other end thereof is connected to the common potential end via a switch circuit SWB112 composed of, for example, a transistor.

The common line VCONWBL12 is connected to a constant current source IB12 via a switch circuit SWB121 composed of, for example, a transistor, and the other end thereof is connected to the common potential end via a switch circuit SWB122 composed of, for example, a transistor.

Although not shown, a connection node between each write bit line WBL and each of the switch circuits SWB1 and SWBL2 is connected to the common potential end via the switch circuit SWPWBL in the same manner as FIG. 80.

As shown in FIG. 85, in a standby state, all the switch circuits SWBL1 and SWBL2 are off. As a result, all the write bit lines WBL are fixed to the common potential. In addition, the common lines VCONWBL01, VCONWBL02, VCONWBL11, and VCONWBL12 are connected to the common potential end via the switch circuits SWB012, SWB022, SWB112, and SWB122, respectively.

As shown in FIGS. 86 to 93, when a write current is made to flow from the top to the bottom in a selected interconnected unit of I/O<0>, the common line VCONWBL01 is electrically disconnected from the common potential end, and is connected to the constant current source IB01. On the contrary, when a write current is made to flow from the bottom to the top, the common line VCONWBL02 is electrically disconnected from the common potential end, and is connected to the constant current source IB02.

Also, when a write current is made to flow from the top to the bottom in a selected interconnected unit of I/O<1>, the common line VCONWBL11 is electrically disconnected from the common potential end, and is connected to the constant current source IB11. On the contrary, when a write current is made to flow from the bottom to the top, the common line VCONWBL12 is electrically disconnected from the common potential end, and is connected to the constant current source IB12.

When data is written into a selected MTJ element MTJ at the upper side of the connection line CONWBL, a switch circuit SWBL1 connected to a selected write bit line WBL and all the switch circuits SWBL2 are turned on in each of the selected interconnected units of I/O<0> and I/O<1>, as shown in FIGS. 86 to 89. In the same manner as FIGS. 81 and 82, all the circuits SWPWBL are turned off in a selected interconnected unit. As a result, a write current as indicated by the arrow flows. AS for the number of switch circuits (enclosed in circle) which operates at this time, a total of five switch circuits SWBL1 and SWBL2 operate, and a total of eight switch circuits SWPWBL operate.

On the contrary, when data is written into a selected MTJ element MTJ at the lower side of the connection line CONWBL, all the switch circuits SWBL1 and a switch circuit SWBL2 connected to a selected write bit line WBL are turned on in each of the selected interconnected units of I/O<0> and I/O<1>, as shown in FIGS. 90 to 93. In the same manner as FIGS. 83 and 84, all the switch circuits SWPWBL are turned off in a selected interconnected unit. As a result, a write current as indicated by the arrow flows. As for the number of switch circuits (enclosed in circle) which operates at this time, a total of five switch circuits SWBL1 and SWBL2 operate, and a total of eight switch circuits SWPWBL operate.

When a write current is possible to flow in one direction (FIGS. 77 to 79), the shown example illustrates the write lines WWL are fixed to the common potential via the switch circuits SWWL1 and SWWL2 and the common lines VCONWWL1 and VCONWWL2 which are connected to the common potential end without providing the switch circuits SWPWWL1 and SWPWWL2. However, when a current is possible to flow in a write line in both directions, fixing a potential of a write line with this technique requires a very large number of switch circuits to be turned on/off at the time of one write operation. This phenomenon is undesirable because it increases switching noise or current consumption.

Each of the examples of the present embodiment show a switch circuit SWPWBL remains on in a unselected interconnected unit. However, there is virtually no problem even if an on/off of the switch circuits SWPWBL are controlled for each memory cell array MCA. This is because a period of one write operation is generally not so long as compared with a potential of a write bit line WBL being changed due to a leak current of a transistor.

In order to reduce current consumption during a standby state, it is effective to reduce current consumption of a driver circuit which drives the switch circuits SWBL1, SWBL2, SWWL1, and SWWL2. As shown in the above example, the switch circuits SWBL1, SWBL2, SWWL1, and SWWL2 are provided at both sides of each of the write word lines WWL and each of the write bit lines WBL. For this reason, a very large number of driver circuits are included in a chip. For example, in the case of a 16 Mb MRAM in which one memory cell array is composed of 1024 write word lines WWL×1024 write bit lines WBL (=1 Mb), the number of switch circuits SWBL1, SWBL2, SWWL1, and SWWL2 is as large as 1024×2×2×16=65536. Thus, for example, even if current consumption during a standby mode per driver circuit is 1 nA, the total value is as large as 65 µA in the whole chip.

Figure 94:
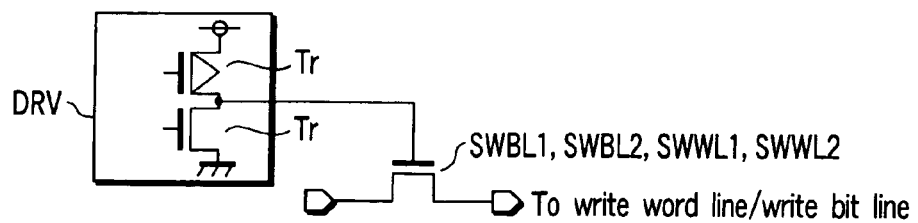

In order to solve this problem, the following technique can be used. For example, let us consider a driver circuit as shown in FIG. 94. As shown in FIG. 94, a driver circuit DRV is connected to each of the switch circuits SWBL1, SWBL2, SWWL1, and SWWL2. The driver circuits DRV controls he switch circuits SWBL1, SWBL2, SWWL1, and SWWL2. A channel of each transistor configuring such a driver circuit DRV or a transistor Tr configuring at least a final stage is set wider than a channel of the switch circuits SWBL1, SWBL2, SWWL1, and SWWL2. By doing this, current consumption during a standby state can be remarkably reduced.

Moreover, absolute value of a threshold voltage of each of the transistors configuring the driver circuit DRV or a transistor Tr configuring at least a final stage may be higher than that of each of the switch circuits SWBL1, SWBL2, SWWL1, and SWWL2 to reduce sub-threshold current of the transistor Tr. By doing this as well, current consumption during a standby state can be remarkably reduced.

With a semiconductor memory device according to the thirteenth embodiment of the present invention, as in the first embodiment, write bit lines WBL are interconnected and/or write word lines WWL are interconnected. Thus, advantageous effect identical to that of the first embodiment can be attained.

In addition, according to the thirteenth embodiment, switch circuits SWBL1, SWBL2, SWWL1, and SWWL2 are turned on/off for each interconnected unit. Thus, a very small number of switch circuits are turned on/off by one write operation. Therefore, a switching noise or current consumption can be reduced.

Fourteenth Embodiment

A fourteenth embodiment shows an example of memory cell array configuration of a so-called block redundancy in which a memory cell array exclusively used for redundancy is allocated other than a ordinal memory cell array.

Figure 95:
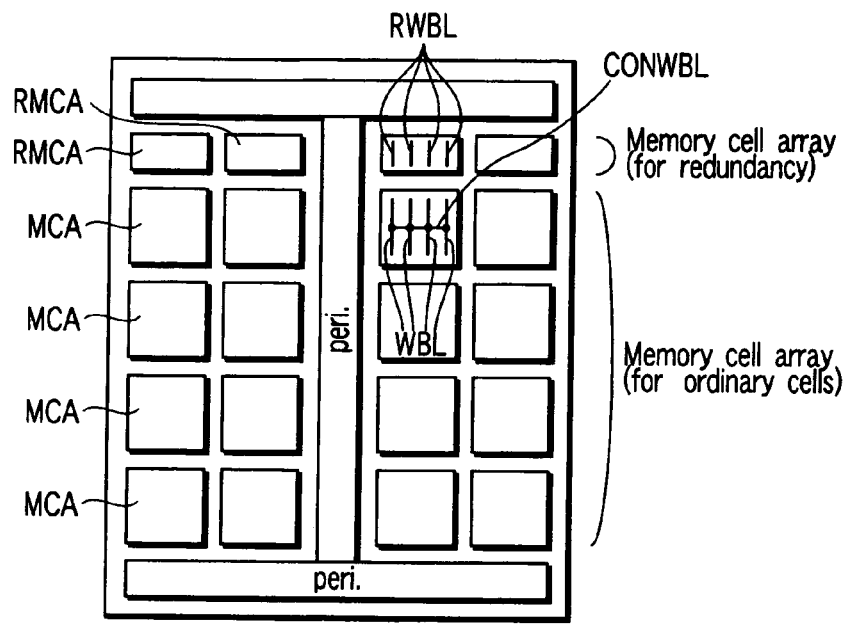
FIG. 95 is a diagram showing a semiconductor memory device according to a fourteenth embodiment of the present invention.

FIG. 95 is a diagram showing a semiconductor memory device according to the fourteenth embodiment of the present invention. FIG. 95 illustrates a case in which a block redundancy system is applied only to write word lines WWL.

As shown in FIG. 95, more than one memory cell arrays MCA are provided on a chip C with an interval. Here, the memory cell arrays MCA are composed of ordinary memory cells (MTJ elements MTJ). Redundancy memory cell arrays RMCA composed of redundancy memory cells are provided adjacent to the top memory cell array MCA. Write bit lines WBL extend in a vertical direction in the figure, and write word lines WWL extend in a horizontal direction in the figure.

In general, the redundancy memory cell array RMCA is smaller than an ordinary memory cell arrays MCA. For example, the number of write word lines WWL in the redundancy memory cell array RMCA is smaller than that of write word lines WWL in the ordinary memory cell array MCA. For example, a ratio in number between them is 1:8.

In that case, a so-called bit line length, which is defined as a number of memory cells connected one bit line, in the redundancy memory cell array RMCA is shorter than that in the ordinary memory cell array MCA. Therefore, the wiring resistance of the write bit line RWBL in the redundancy memory cell array MCA is smaller than that of the write bit line WBL in the ordinary memory cell array MCA (for example, 1/8 in the above example).

Thus, in the redundancy memory cell array RMCA, even if the write bit lines WBL are not interconnected in accordance with the first embodiment or the like, the wiring resistance is small and a sufficient write current can be made to flow. Thus, the write bit lines WBL of the ordinary memory cell array MCA are interconnected, and the write bit lines RWBL of the redundancy memory cell array RMCA are not interconnected, thereby making it possible to simplify a control circuit of a write system in the redundancy cell array RMCA to realize a small chip size.

In the foregoing description, a block redundancy system is applied to a row redundancy as an example. However, when the block redundancy system is applied to a column redundancy, write word lines WWL in the redundancy memory cell array RMCA are not interconnected to simplify a control circuit of a write system similarly.

Of course, even when the block redundancy system is employed, write bit lines (write word lines) in the redundancy memory cell array RMCA can also be interconnected.

With the semiconductor memory device according to the fourteenth embodiment of the present invention, as in the first embodiment, write bit lines WBL are interconnected and/or write word lines WWL are interconnected. Thus, advantageous effect identical to that of the first embodiment can be attained.

Moreover, according to the fourth embodiment, when the block redundancy is employed, write word lines WWL (and write bit lines WBL) are not interconnected in the small sized redundancy memory cell array. As a result, a sufficient write current can be made to flow in the write word lines WWL arranged in the redundancy memory cell array and a control circuit of a write system can be simplified.

Fifteenth Embodiment

A fifteenth embodiment relates to write lines arranged in a vertical direction.

Figure 96:
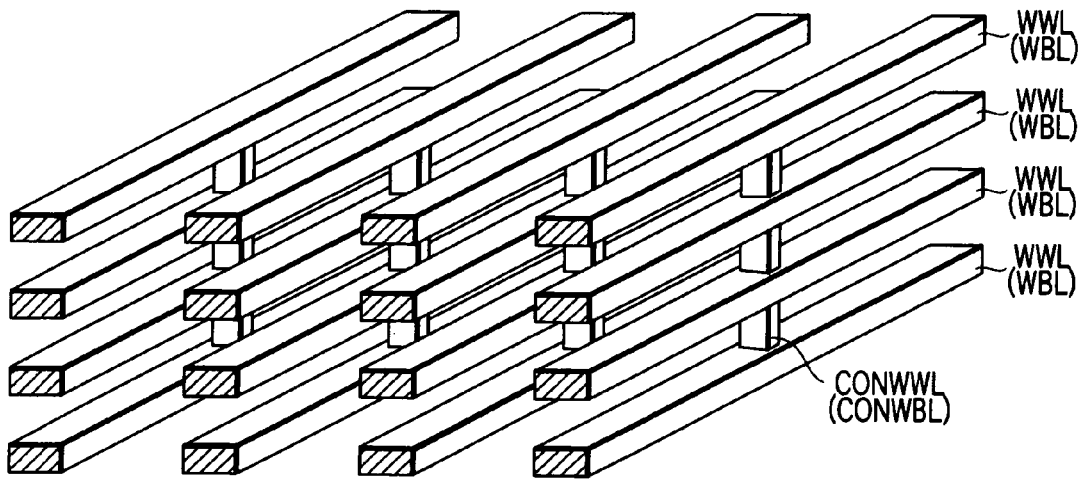
FIG. 96 is a diagram showing a semiconductor memory device according to a fifteenth embodiment of the present invention.

FIG. 96 is a perspective view showing a semiconductor memory device according to the fifteenth embodiment of the present invention. As shown in FIG. 96, write lines (for example, write word lines WWL) are arranged with intervals in a vertical direction (direction distant from a semiconductor substrate). In addition, the write word lines WWL are interconnected by a connection line CONWWL which extends in a vertical direction. The connection line CONWWL may be realized by, for example, a set of via plugs which contacts two adjacent write word lines WWL.

Although FIG. 96 shows an example in which only one kind of write lines (write word lines WWL) are interconnected for the sake of convenience, write bit lines WBL may be interconnected. In this case, for example, memory cells can be realized by, for example, so-called simple cross point type memory cells composed of only one MTJ element MTJ or 1D1R type memory cells composed of one MTJ element MTJ and one diode. Moreover, as shown in FIG. 61, for example, a read bit line RBL can be provided.

With the semiconductor memory device according to the fifteenth embodiment of the present invention, as in the first embodiment, write bit lines WBL are interconnected and/or write word lines WWL are interconnected. Thus, advantageous effect identical to that of the first embodiment can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a plurality of memory cells using a current flowing thorough a wiring;
   a plurality of first write lines electrically or magnetically or electrically and magnetically connected to the memory cells and provided along a first direction; and
   a first connection line which electrically connects at least two of the first write lines each other.

2. The device according to claim 1, wherein the first connection line is formed in a same wiring layer as that of the first write lines.

3. The device according to claim 1, wherein the first connection line is placed in a central portion of the first write lines.

4. The device according to claim 1, wherein the number of memory cells electrically or magnetically or electrically and magnetically connected to one of the first write lines is equal on opposite sides of the first connection line.

5. The device according to claim 1, wherein the first connection line electrically connects n-th power of 2 (n is a natural number) first write lines each other.

6. The device according to claim 1, wherein the number of the first write lines electrically connected by the first connection line is at least the number of the first write lines which are included within a redundancy replacement unit.

7. The device according to claim 1, further comprising:
   a plurality of redundant memory cells to replace defective memory cell;
   a plurality of redundant write lines electrically or magnetically or electrically and magnetically connected to the redundant memory cells and provided along the first direction; and
   a redundant connection line which electrically connects at least two of the redundant write lines each other, the number of the first write lines electrically connected each other is at least the number of the redundant write lines electrically connected each other.

8. The device according to claim 1, wherein the memory cells include magnetoresistance elements,
   the magnetoresistance elements are periodically arranged, and
   a distance between the magnetoresistance elements within the memory cell adjacent to the first connection line and the first connection line is larger than a spacing between the periodically arranged magnetoresistance elements.

9. The device according to claim 1, further comprising:
   a plurality of second write lines electrically or magnetically or electrically and magnetically connected to the memory cells and provided along a second direction different from the first direction; and
   a second connection line which electrically connects at least two of the second write lines each other.

10. The device according to claim 9, wherein one of the memory cells is placed at an intersection between one of the first write lines and one of the second write lines,
    the one of the first write lines is formed in a wiring layer above the one of the memory cells, and
    the one of the second write lines is formed in a wiring layer below the one of the memory cells.

11. The device according to claim 9, wherein the number of the first write lines electrically connected each other is at least the number of the second write lines electrically connected each other.

12. The device according to claim 9, wherein the number of the memory cells electrically or magnetically or electrically and magnetically connected each other is at most the number of the memory cells electrically or magnetically or electrically and magnetically connected each other.

13. The device according to claim 1, wherein adjacent two of the first write lines constitute a first write line pair,
    a plurality of the first write line pairs are arranged,
    the first connection line electrically connects a plurality of the first write lines constituting one of the first write lines of the first write line pair each other, and
    a second connection line electrically connects a plurality of the first write lines constituting another first write line of the first write line pair each other.

14. The device according to claim 1, wherein a first write circuit is connected to one end of the first write lines,
    a second write circuit is connected to another end of the first write lines,
    the first write circuit includes a current source circuit which supplies a write current to the first write lines and the second write circuit includes a current sink circuit which drains a write current out of the first write lines, or the first write circuits and the second write circuits include the current source circuit and the current sink circuit, and
    the number of the current source circuits activated during one write operation is different from the number of the current sink circuits activated during one write operation.

15. The device according to claim 14, wherein a plurality of the first write lines electrically connected each other constitute a first write line group, and
    during one write operation, of the first write circuits and the second write circuits which are connected to the first write line group, one of the current source circuits and a plurality of the current sink circuits are activated or one of the current sink circuits and a plurality of the current source circuits are activated.

16. The device according to claim 14, wherein a plurality of the first write lines electrically connected each other constitute a first write line group, and
    during one write operation, of the first write circuits and the second write circuits which are connected to the first write line group,
    when one of the current source circuits and a plurality of the current sink circuits are activated, the first write circuit or second write circuit adjacent to the current source circuit activated is inactivated, and
    when one of the current sink circuits and a plurality of the current source circuits are activated, the first write circuit or second write circuit adjacent to the current sink circuit activated is inactivated.

17. The device according to claim 14, wherein a plurality of the first write lines electrically connected each other constitute a first write line group, and
    during one write operation, of a plurality of the first write circuits and a plurality of the second write circuits which are located on a side of the device on which a write target memory cell is located with respect to the first connection line,
    all the first write circuits and the second write circuits other than those connected to the first write line electrically or magnetically or electrically and magnetically connected to the write target memory cell are inactivated.

18. The device according to claim 14, wherein a plurality of the first write lines electrically connected each other constitute a plurality of first write line groups, and
all the first write lines of at least one of the first write line groups not including the first write line electrically or magnetically or electrically and magnetically connected to a write target memory cell is precharged to a same potential.

19. The device according to claim 14, wherein a plurality of the first write lines electrically connected each other constitute a first write line group,
the memory cells constitute a memory cell array,
a plurality of the first write circuits are controlled by a first address signal for selecting the memory cell located on one side of the memory cell array with respect to the first connection line,
a plurality of the second write circuits are controlled by a second address signal for selecting the memory cell located on another side of the memory cell array with respect to the first connection line, and
the first address signal and the second address signal are complementary.

20. The device according to claim 14, wherein a plurality of the first write lines electrically connected each other constitute a first write line group,
a plurality of the first write circuits are controlled by a first write data polarity signal indicating that data with a first polarity is to be written to the memory cell,
a plurality of the second write circuits are controlled by a second write data polarity signal indicating that data with a second polarity is to be written to the memory cell, and
the first write data polarity signal and the second write data polarity signal are complementary.

21. The device according to claim 14, wherein a plurality of the first write lines electrically connected each other constitute a plurality of first write line groups,
the first write line groups are composed of a same number of the first write lines, and
one of a plurality of the first write circuits and one of a plurality of the second write circuits connected to one of the first write lines of the first write line groups are controlled by a same address signal.

22. The device according to claim 14, wherein a write operation control signal is supplied to the first write circuits and the second write circuits to control a timing for start or end or start and end of a write operation.

23. The device according to claim 1, wherein one end of the first write lines is electrically connected to a first common line via a first switch circuit,
another end of the first write lines is electrically connected to a second common line via a second switch circuit,
a first write circuit is connected to the first common line,
a second write circuit is connected to the second common line,
the first write circuit includes a current source circuit which supplies a write current to the first common line and the second write circuit includes a current sink circuit which drains a write current out of the second common line, or the first write circuit and the second write circuit include the current source circuit and the current sink circuit, and the number of the first switch circuit on is different from that of the second switch circuit on during one write operation.

24. The device according to claim 23, wherein a plurality of the first write lines electrically connected each other constitute a first write line group, and
during one write operation, of a plurality of the first switch circuits and a plurality of the second switch circuits which are connected to the first write line group, one of the first switch circuits and a plurality of the second switch circuits are on, or one of the second switch circuits and a plurality of the first switch circuits are on.

25. The device according to claim 23, wherein a plurality of the first write lines electrically connected each other constitute a first write line group,
a plurality of the first write line groups are arranged,
of the first switch circuits and second switch circuits connected to at least one of the first write line groups not including the first write line electrically or magnetically or electrically and magnetically connected to a write target memory cell,
all the first switch circuits are off and a plurality of the second switch circuits are on, and
all the second switch circuits are off and a plurality of the first switch circuits are on.

26. The device according to claim 23, wherein a plurality of the first write lines electrically connected each other constitute a first write line group, and
all the first write lines of at least one of the first write line groups not including the first write line electrically or magnetically or electrically and magnetically connected to a write target memory cell is precharged to a same potential.

27. The device according to claim 23, wherein a plurality of the first write lines electrically connected each other constitute a first write line group,
the memory cells constitute a memory cell array,
a plurality of the first switch circuits are controlled by a first address signal for selecting the memory cell located on one side of the memory cell array with respect to the first connection line,
a plurality of the second switch circuits are controlled by a second address signal for selecting the memory cell located on another side of the memory cell array with respect to the first connection line, and
the first address signal and the second address signal are complementary to each other.

28. The device according to claim 23, wherein a plurality of the first write lines electrically connected each other constitute a first write line group,
a plurality of the first switch circuits are controlled by a first write data polarity signal indicating that data with a first polarity is to be written to the memory cell,
a plurality of the second switch circuits are controlled by a second write data polarity signal indicating that data with a second polarity is to be written to the memory cell, and
the first write data polarity signal and the second write data polarity signal are complementary to each other.

29. The device according to claim 23, wherein a plurality of the first write lines electrically connected each other constitute a plurality of first write line groups,
the first write line groups are composed of a same number of the first write lines, and
one of a plurality of the first switch circuits and one of a plurality of the second switch circuits connected to one of the first write lines of the first write line groups are controlled by a same address signal.

30. The device according to claim 23, wherein a write operation control signal is supplied to the first switch circuits and the second switch circuits to control a timing for start or end or start and end of a write operation.

31. The device according to claim 23, further comprising:
a third switch circuit connected between one of the plurality of first write lines and a first potential line.

32. The device according to claim 1, wherein a plurality of the memory cells comprise:
an MTJ element whose first end is electrically connected to one of a plurality of the first write lines; and
a switch circuit whose first end is electrically connected to a second end of the MTJ element, and
the device further comprises a read line electrically connected to a second end of the switch circuit.

33. The device according to claim 1, further comprising:
a plurality of second write lines electrically or magnetically or electrically and magnetically connected to a plurality of the memory cells and provided along a second direction, wherein
a plurality of the memory cells constitute a memory cell array,
the memory cell array is divided into a first sub-array and a second sub-array with the first connection line used as a border,
the first sub-array and the second sub-array are divided into a same number of a plurality of blocks, and
while a write current flows in the first write line, a write current is supplied to at least one of a plurality of the second write lines which are included in each of the blocks in the first sub-array,
while a write current flows in a plurality of the first write line, a write current is supplied to at least one of a plurality of the second write lines in each one of a plurality of the blocks in the first sub-array.

34. The device according to claim 33, further comprising:
a plurality of first switch circuits, one end of which is connected to one of a plurality of the second write lines which are included in a first block of the first sub-array;
a plurality of second switch circuits, one end of which is connected to one of a plurality of the second write lines which are included in a first block of the second sub-array;
a common line connected to another end of a plurality of the first switch circuits and another end of a plurality of the second switch circuits; and
a write circuit connected to the common line, supplying a write current to the common line and draining a write current from the common line.

35. The device according to claim 33, further comprising:
a plurality of first switch circuits, one end of which is connected to one of a plurality of the second write lines which are included in the first block of the first sub-array;
a plurality of second switch circuits, one end of which is connected to one of a plurality of the second write lines which are included in the first block of the second sub-array;
a first common line connected to another end of a plurality of the first switch circuits;
a second common line connected to another end of a plurality of the second switch circuits, the second common line being electrically isolated from the first common line;
a first write circuit connected to the first common line, supplying a write current to the first common line and draining a write current from the first common line; and
a second write circuit connected to the second common line, supplying a write current to the second common line and draining a write current from the second common line.

36. The device according to claim 34, further comprising:
at least one dummy write line provided along the first direction between one of a plurality of the first write lines which are included in a first block of the first sub-array and one of a plurality of the first write lines which are included in a second block of the first sub-array, the dummy write line being fixed to a ground potential.

37. The device according to claim 33, wherein a plurality of the memory cells comprise:
an MTJ element whose first end is electrically connected to one of a plurality of the first write lines;
a switch circuit whose first end is electrically connected to a second end of the MTJ element, and
the device further comprises:
a first read line connected to a control terminal of the switch circuit of a plurality of the memory cells which are included in the first sub-array; and
a second read line connected to a control terminal of the switch circuit of a plurality of the memory cells which are included in the second sub-array, the second read line being electrically isolated from the first read line.

38. The device according to claim 23, wherein the first write circuit includes a driver circuit which supplies a write current to the first common line,
the second write circuit includes a sink circuit which drains a write current from the second common line,
a potential of the second common line is fixed to a common potential,
a plurality of the first write lines electrically interconnected by the first connection line constitute a plurality of first write line groups,
during a standby mode, at least one of the second switch circuits are turned on in a respective one of a plurality of the first write line groups, and
in one write operation, in a plurality of the first switch circuits and a plurality of the second switch circuits which are connected to selected one of a plurality of the first write line groups, one of the first switch circuits is turned on and all the second switch circuits are turned on, or one of the second switch circuits is turned on and all the first switch circuits are turned on.

39. The device according to claim 23, further comprising:
a plurality of first switch circuits provided between a plurality of the third write lines and a common potential end and staying on during a standby mode, wherein
a plurality of the first write lines electrically interconnected by the first connection line constitute a plurality of first write line groups,
in one write operation,
in a plurality of the first switch circuits and a plurality of the second switch circuits which are connected to selected one of a plurality of the first write line groups, one of the first switch circuits and a plurality of the second switch circuits are turned on, or one of the second switch circuits and a plurality of the first switch circuits are turned on, and
a plurality of the third switch circuits connected to the selected one of a plurality of the first write line groups are all turned off.

40. The device according to claim 1, further comprising:
a memory cell array composed of a plurality of the memory cells;
a redundancy memory cell array including a plurality of redundancy memory cells with which a faulty one of a plurality of the memory cells is to be replaced; and
a plurality of redundancy write lines electrically or magnetically or electrically and magnetically connected to a plurality of the redundancy memory cells and provided along the first direction, a plurality of the redundancy write lines being shorter than a plurality of the first write lines and electrically isolated from each other.

* * * * *